(12) United States Patent
Hirano et al.

(10) Patent No.: US 8,735,045 B2
(45) Date of Patent: *May 27, 2014

(54) POSITIVE RESIST COMPOSITION, METHOD OF FORMING RESIST PATTERN, AND POLYMERIC COMPOUND

(75) Inventors: Tomoyuki Hirano, Kawasaki (JP); Daiju Shiono, Kawasaki (JP); Daichi Takaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 166 days.

This patent is subject to a terminal disclaimer.

(21) Appl. No.: 12/911,411

(22) Filed: Oct. 25, 2010

(65) Prior Publication Data

US 2011/0097667 A1 Apr. 28, 2011

(30) Foreign Application Priority Data

Oct. 28, 2009 (JP) ................................. 2009-248210

(51) Int. Cl.
G03F 7/00 (2006.01)
C08F 228/02 (2006.01)
C08F 226/02 (2006.01)
C08F 220/10 (2006.01)

(52) U.S. Cl.
USPC ........ 430/270.1; 430/322; 526/287; 526/288; 526/309; 526/319

(58) Field of Classification Search
USPC ....................................... 526/318
See application file for complete search history.

(56) References Cited

U.S. PATENT DOCUMENTS

| | | | |
|---|---|---|---|
| 5,580,695 A | 12/1996 | Murata et al. | |
| 5,945,517 A | 8/1999 | Nitta et al. | |
| 5,968,712 A | 10/1999 | Thackeray et al. | |
| 6,153,733 A | 11/2000 | Yukawa et al. | |
| 7,074,543 B2 | 7/2006 | Iwai et al. | |
| 7,456,311 B2 | 11/2008 | Hatakeyama et al. | |
| 7,528,279 B2 | 5/2009 | Hatakeyama et al. | |
| 8,034,536 B2 * | 10/2011 | Iwashita et al. | 430/270.1 |
| 2005/0003303 A1 | 1/2005 | Watanabe et al. | |
| 2007/0129532 A1 | 6/2007 | Hatakeyama et al. | |
| 2008/0145784 A1* | 6/2008 | Shiono et al. | 430/281.1 |
| 2009/0162788 A1 | 6/2009 | Hada et al. | |
| 2009/0214982 A1 | 8/2009 | Shimizu et al. | |
| 2009/0226842 A1* | 9/2009 | Shimizu et al. | 430/281.1 |
| 2009/0297980 A1* | 12/2009 | Iwashita et al. | 430/270.1 |
| 2010/0081080 A1 | 4/2010 | Iwashita et al. | |
| 2011/0111343 A1* | 5/2011 | Hirano et al. | 430/270.1 |
| 2011/0262865 A1 | 10/2011 | Nishimura et al. | |

FOREIGN PATENT DOCUMENTS

| JP | A-H05-232706 | 9/1993 |
|---|---|---|
| JP | A-H05-249662 | 9/1993 |
| JP | H09-208554 | 8/1997 |
| JP | H11-035551 | 2/1999 |
| JP | H11-035552 | 2/1999 |
| JP | H11-035573 | 2/1999 |
| JP | A-H11-084660 | 3/1999 |
| JP | H11-322707 | 11/1999 |
| JP | 2003-241385 | 8/2003 |
| JP | A-2005-023304 | 1/2005 |
| JP | A-2007-047642 | 2/2007 |
| JP | A-2008-223000 | 9/2008 |
| JP | A-2009-091350 | 4/2009 |
| JP | A-2009-167156 | 7/2009 |
| JP | 2009237170 A * | 10/2009 |
| JP | 2009237378 A * | 10/2009 |
| JP | A-2009-223300 | 10/2009 |
| JP | A-2009-237170 | 10/2009 |
| JP | A-2009-237379 | 10/2009 |
| JP | 2009286720 A * | 12/2009 |
| JP | A-2009-286721 | 12/2009 |
| JP | A-2009-286870 | 12/2009 |
| JP | A-2010-126696 | 6/2010 |
| WO | WO 2004/074242 | 9/2004 |

OTHER PUBLICATIONS

Machine Translation of JP2009286720, Dec. 10, 2009.*

(Continued)

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A positive resist composition including a base component (A) which exhibits increased solubility in an alkali developing solution under action of acid and an acid-generator component (B) which generates acid upon exposure, the base component (A) including a polymeric compound (A1) containing a structural unit (a0) represented by general formula (a0-1) shown below and a structural unit (a1) derived from an acrylate ester containing an acid dissociable, dissolution inhibiting group.

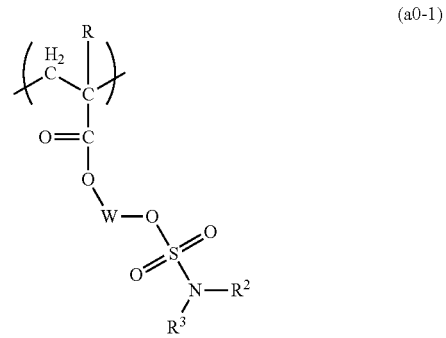

(a0-1)

10 Claims, No Drawings

(56) References Cited

OTHER PUBLICATIONS machine translation JP 2009-237170. Oct. 15, 2009.*
machine translation JP 2009-237378. Oct. 15, 2009.*
Iwasa et al., "Novel Negative Photoresist Based on Polar Alicyclic Polymers for ArF Excimer Laser Lithography," SPIE Advances in Resist Technology and Processing XIV, vol. 3333, pp. 417-424, 1998.
Conley et al., "Negative Photoresist for 157 nm Microlithography; A Progress Report," SPIE Advances in Resist Technology and Processing XIX, vol. 4690, pp. 94-100, 2002.

Notice of Allowance issued in U.S. Appl. No. 12/453,857 on Jun. 24, 2011.
Office Action issued in Japanese Patent Application No. 2008-139709 on Jul. 17, 2012 (corresponds to U.S. Appl. No. 12/453,857).
Office Action issued on Sep. 3, 2013 in Japanese Patent Application No. 2009-248210.

* cited by examiner

POSITIVE RESIST COMPOSITION, METHOD OF FORMING RESIST PATTERN, AND POLYMERIC COMPOUND

TECHNICAL FIELD

The present invention relates to a positive resist composition, a method of forming a resist pattern using the positive resist composition, and a polymeric compound useful for a positive resist composition.

Priority is claimed on Japanese Patent Application No. 2009-248210, filed Oct. 28, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing patterns of minute dimensions. As resist materials which satisfy such requirements, chemically amplified resists are known. As a chemically amplified composition, a composition including a base material component that exhibits a changed solubility in an alkali developing solution under the action of acid and an acid-generator component that generates acid upon exposure is generally used. For example, in a chemically amplified positive resist composition, a base component which exhibits increased solubility in an alkali developing solution under action of acid is used.

Conventionally, a resin (base resin) is typically used as the base component of a chemically amplified resist composition. In the case of a positive type, a resin that exhibits increased solubility in an alkali developing solution under action of acid is used as a base resin.

Resins that contain structural units derived from (meth) acrylate esters within the main chain (acrylic resins) are used as base resins for chemically amplified resist compositions that use ArF excimer laser lithography, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth) acrylate" is a generic term that includes either or both of the acrylate having a hydrogen atom bonded to the α-position and the methacrylate having a methyl group bonded to the α-position.

Furthermore, currently, in addition to the base resin and the acid generator, a nitrogen-containing organic compound such as an alkylamine, an alkylalcoholamine or the like is added to chemically amplified resists (see, for example, Patent Documents 2 and 3). The nitrogen-containing organic compound functions as a quencher which traps the acid generated from the acid generator, and contributes to improving various lithography properties such as the shape of the resist pattern.

DOCUMENTS OF RELATED ART

Patent Document

[Patent Document 1] Japanese Unexamined Patent Application, First Publication No. 2003-241385

[Patent Document 2] Japanese Unexamined Patent Application, First Publication No. Hei 5-249662

[Patent Document 3] Japanese Unexamined Patent Application, First Publication No. Hei 5-232706

[Patent Document 4] Japanese Unexamined Patent Application, First Publication No. Hei 11-084660

SUMMARY OF THE INVENTION

As further progress is expected to be made in lithography techniques and the application field for lithography techniques is expected to expand, development of a novel material for use in lithography will be desired. For example, as miniaturization of resist patterns progress, improvement will be demanded for resist materials with respect to various lithography properties such as exposure latitude (EL), mask error factor (MEEF), critical dimension uniformity (CDU) of a pattern and the like, as well as resolution. Furthermore, for improving the yield, it is important to reduce generation of defects in the formation of a resist pattern.

The present invention takes the above circumstances into consideration, with an object of providing a positive resist composition and a method of forming a resist pattern which can achieve excellent lithography properties and the effect of reducing defects, and a polymeric compound useful for the positive resist composition.

A first aspect of the present invention for solving the aforementioned problems is a positive resist composition including a base component (A) which exhibits increased solubility in an alkali developing solution under action of acid and an acid-generator component (B) which generates acid upon exposure, the base component (A) including a polymeric compound (A1) containing a structural unit (a0) represented by general formula (a0-1) shown below and a structural unit (a1) derived from an acrylate ester containing an acid dissociable, dissolution inhibiting group.

[Chemical Formula 1]

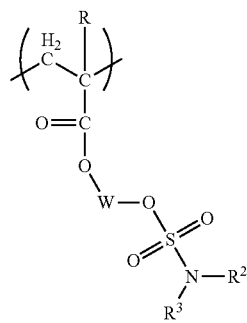

(a0-1)

In the formula, R represents a hydrogen atom, an alkyl group of 1 to 5 carbon atoms or a halogenated alkyl group of 1 to 5 carbon atoms; each of $R^2$ and $R^3$ independently represents a hydrogen atom or an alkyl group that may contain an oxygen atom at an arbitrary position, or $R^2$ and $R^3$ are bonded together to form an alkylene group; and W represents a cyclic alkylene group that may include an oxygen atom at an arbitrary position.

A second aspect of the present invention is a method of forming a resist pattern, including using a positive resist composition according to the first aspect to form a resist film on a substrate, subjecting the resist film to exposure, and subjecting the resist film to alkali developing to form a resist pattern.

A third aspect of the present invention is a polymeric compound including a structural unit (a0) represented by general formula (a0-1) shown below and a structural unit (a1) derived from an acrylate ester containing an acid dissociable, dissolution inhibiting group.

[Chemical Formula 2]

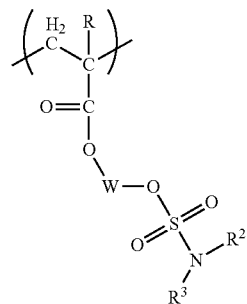

(a0-1)

In the formula, R represents a hydrogen atom, an alkyl group of 1 to 5 carbon atoms or a halogenated alkyl group of 1 to 5 carbon atoms; each of $R^2$ and $R^3$ independently represents a hydrogen atom or an alkyl group that may contain an oxygen atom at an arbitrary position, or $R^2$ and $R^3$ are bonded together to form an alkylene group; and W represents a cyclic alkylene group that may include an oxygen atom at an arbitrary position.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic divalent saturated hydrocarbon, unless otherwise specified.

A "halogenated alkyl group" is a group in which part or all of the hydrogen atoms of an alkyl group is substituted with a halogen atom, and a "halogenated alkylene group" is a group in which part or all of the hydrogen atoms of an alkylene group is substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxyl group.

The term "structural unit" refers to a monomer unit that contributes to the formation of a polymeric compound (resin, polymer, copolymer).

The term "exposure" is used as a general concept that includes irradiation with any form of radiation.

According to the present invention, there are provided a positive resist composition an a method of forming a resist pattern which can achieve excellent lithography properties and the effect of reducing defects, and a polymeric compound useful for the positive resist composition.

DETAILED DESCRIPTION OF THE INVENTION

<<Positive Resist Composition>>

The positive resist composition of the present invention includes a base component (A) (hereafter, referred to as "component (A)") which exhibits increased solubility in an alkali developing solution under action of acid and an acid-generator component (B) (hereafter, referred to as "component (B)") which generates acid upon exposure.

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

Here, the term "base component" refers to an organic compound capable of forming a film.

As the base component, an organic compound having a molecular weight of 500 or more is used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "polymeric compound" refers to a polymer having a molecular weight of 1,000 or more.

With respect to a polymeric compound, the "molecular weight" is the weight average molecular weight in terms of the polystyrene equivalent value determined by gel permeation chromatography (GPC).

<Component (A)>[Polymeric Compound (A1)]

The polymeric compound (A1) (hereafter, referred to as "component (A1)") includes a structural unit (a0) represented by general formula (a0-1) and a structural unit (a1) derived from an acrylate ester containing an acid dissociable, dissolution inhibiting group.

The component (A1) preferably includes at least one structural unit (a2) selected from the group consisting of a structural unit derived from an acrylate ester containing a —SO$_2$— containing cyclic group and a structural unit derived from an acrylate ester containing a lactone-containing cyclic group, as well as the structural units (a0) and (a1).

The component (A1) may include a structural unit (a3) derived from an acrylate ester containing a polar group-containing aliphatic hydrocarbon group, as well as the structural units (a0) and (a2), or the structural units (a0), (a1) and (a2).

The component (A1) may include a structural unit (a4) derived from an acrylate ester containing an acid non-dissociable, aliphatic cyclic group, as well as the structural units (a0) and (a1), the structural units (a0), (a1) and (a2), the structural units (a0), (a1) and (a3), or the structural units (a0), (a1), (a2) and (a3).

(Structural Unit (a0))

The structural unit (a0) is represented by general formula (a0-1) above.

In general formula (a0-1), R represents a hydrogen atom, an alkyl group of 1 to 5 carbon atoms or a halogenated alkyl group of 1 to 5 carbon atoms.

The alkyl group of 1 to 5 carbon atoms for R is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

The fluorinated alkyl group of 1 to 5 carbon atoms for R is preferably a linear or branched fluorinated alkyl group, and specific examples thereof include a monofluoromethyl group, a difluoromethyl group, a trifluoromethyl group, a perfluoroethyl group, a perfluoropropyl group, a perfluoroisopropyl group, a perfluorobutyl group, a perfluoroisobutyl group, a perfluoro-tert-butyl group, a perfluoropentyl group, a perfluoroisopentyl group and a perfluoroneopentyl group.

From the viewpoint of industrial availability, R is preferably a hydrogen atom, a methyl group or a trifluoromethyl group, and a hydrogen atom or a methyl group is particularly desirable.

In general formula (a0-1), each of $R^2$ and $R^3$ independently represents a hydrogen atom or an alkyl group that may contain an oxygen atom at an arbitrary position. Alternatively, $R^2$ and $R^3$ are bonded together to form an alkylene group.

The alkyl groups for $R^2$ and $R^3$ may be linear, branched or cyclic groups.

As the linear or branched alkyl group, alkyl groups of 1 to 5 carbon atoms are preferable, and specific examples include a methyl group, an ethyl group, an n-propyl group, an i-propyl group, an n-butyl group, an i-butyl group, a t-butyl group, a 2-methyl-2-butyl group, a 3-methyl-2-butyl group, a 1-pentyl group, a 2-pentyl group and a 3-pentyl group.

Examples of the cyclic alkyl group include a cyclopropyl group, a cyclobutyl group, a cyclopentyl group, a 1-methyl-1-cyclopentyl group, a 1-ethyl-1-cyclopentyl group, a cyclohexyl group, a 1-methyl-1-cyclohexyl group, a 1-ethyl-1-cyclohexyl group, a 1-methyl-1-cycloheptyl group, a 1-ethyl-1-cycloheptyl group, a 1-methyl-1-cyclooctyl group, a 1-ethyl-1-cyclooctyl group, a bicyclo[2.2.1]heptan-2-yl group, a 1-adamantyl group, a 2-adamantyl group, a 2-methyl-2-adamantyl group, and a 2-ethyl-2-adamantyl group.

When the alkyl group for $R^2$ and $R^3$ is linear or branched, the alkyl group may have a cyclic alkyl group as a substituent.

When the alkyl group for $R^2$ and $R^3$ is cyclic, the alkyl group may have a linear or branched alkyl group, a fluorine atom, a fluorinated lower alkyl group of 1 to 5 carbon atoms, an oxygen, atom (=O) or the like as a substituent.

Each of the alkyl groups for $R^2$ and $R^3$ may include an oxygen atom at an arbitrary position. The expression "include an oxygen atom" means that an oxygen atom (—O—) is introduced into the carbon chain of the alkyl group. Examples of alkyl groups that include an oxygen atom include acetal-type acid-dissociable, dissolution-inhibiting groups such as the alkoxyalkyl groups described later.

When at least one of $R^2$ and $R^3$ represents an alkyl group including an oxygen atom at an arbitrary position, the alkyl group may be an acid dissociable group. That is, the structural unit (a0) may be represented by general formula (a0-1-4) shown below.

[Chemical Formula 3]

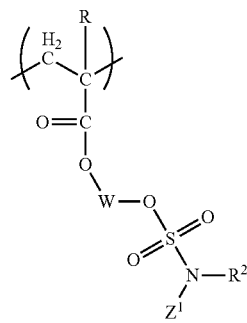

(a0-1-4)

In general formula (a0-1-4), R, $R^2$ and W are respectively the same as defined for R, $R^2$ and W in general formula (a0-1); and $Z^1$ represents an acid dissociable group.

The term "acid dissociable group" refers to a group which, during formation of a resist pattern using the resist composition, has a property of being dissociable by the action of the acid generated from the component (B) upon exposure (acid dissociability).

In this structural unit, the action of the acid generated from the component (B) upon exposure during formation of a resist pattern causes a cleavage of the bond between the nitrogen atom at the terminal of the sulfamoyloxy group (OSO$_2$N group) and the acid dissociable group.

There are no particular limitations on the acid dissociable group in the structural unit (a0), provided the group corresponds with an alkyl group that may include an oxygen atom at an arbitrary position, and for example, any of the groups that have been proposed for use within the base components of conventional positive chemically amplified resist compositions may be appropriately selected. Examples of widely used acid dissociable groups include tertiary alkyl groups and acetal-type acid dissociable groups such as alkoxyalkyl groups.

Examples of tertiary alkyl acid dissociable groups include the same groups as those described later as the tertiary alkyl ester-type acid dissociable, dissolution inhibiting groups for the structural unit (a1).

Examples of the acetal-type acid dissociable group include the same groups as those described later as the acetal-type acid-dissociable, dissolution-inhibiting groups for the structural unit (a1).

The alkylene group formed in those cases where $R^2$ and $R^3$ are bonded together is preferably a linear or branched alkylene group, and is more preferably a linear alkylene group. The alkylene group preferably contains 1 to 5 carbon atoms, and specific examples thereof include an ethanediyl group, a propane-1,3-diyl group and a butane-1,4-diyl group.

In the present invention, in terms of the effects of the present invention, it is preferable that at least one of $R^2$ and $R^3$ represent a hydrogen atom, and it is more preferable that both $R^2$ and $R^3$ represent a hydrogen atom, or one of $R^2$ and $R^3$ represent a hydrogen atom and the other represent an alkyl group which may contain an oxygen atom in an arbitrary position thereof. It is particularly desirable that both $R^2$ and $R^3$ represent a hydrogen atom.

In general formula (a0-1), W represents a cyclic alkylene group that may include an oxygen atom at an arbitrary position.

The number of carbon atoms within the alkylene group is preferably within a range from 3 to 20, and is more preferably from 5 to 12.

In terms of improvement in various lithography properties, both monocyclic groups and polycyclic groups are preferable as the alkylene group. In terms of raising the Tg to improve lithography properties and improving the etching resistance, a polycyclic group is preferable, and a bi-, tri- or tetra-cyclic group is more preferable.

Specific examples of the alkylene group include a cyclopropanediyl group, a cyclobutane-1,2-diyl group, a cyclobutane-1,3-diyl group, a cyclopentane-1,2-diyl group, a cyclopentane-1,3-diyl group, a cyclohexane-1,2-diyl group, a cyclohexane-1,3-diyl group, a cyclohexane-1,4-diyl group, a bicyclo[2.2.1]heptane-2,3-diyl group, a bicyclo[2.2.1]heptane-2,5-diyl group, a 7-oxabicyclo[2.2.1]heptane-2,5-diyl group, a bicyclo[2.2.1]heptane-2,6-diyl group, a 7-oxabicyclo[2.2.1]heptane-2,6-diyl group, an adamantane-1,3-diyl group, and an adamantane-1,2-diyl group.

More specific examples of the structural unit (a0) include structural units represented by formulas (a0-1-10) to (a0-1-72) shown below.

In the following formulas, Me represents a methyl group.

[Chemical Formula 4]

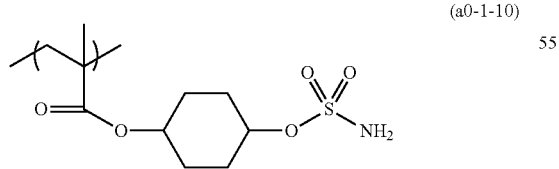

(a0-1-10)

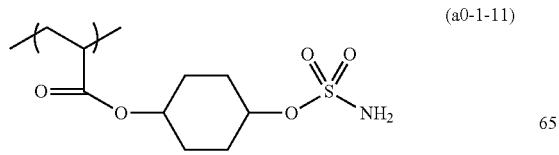

(a0-1-11)

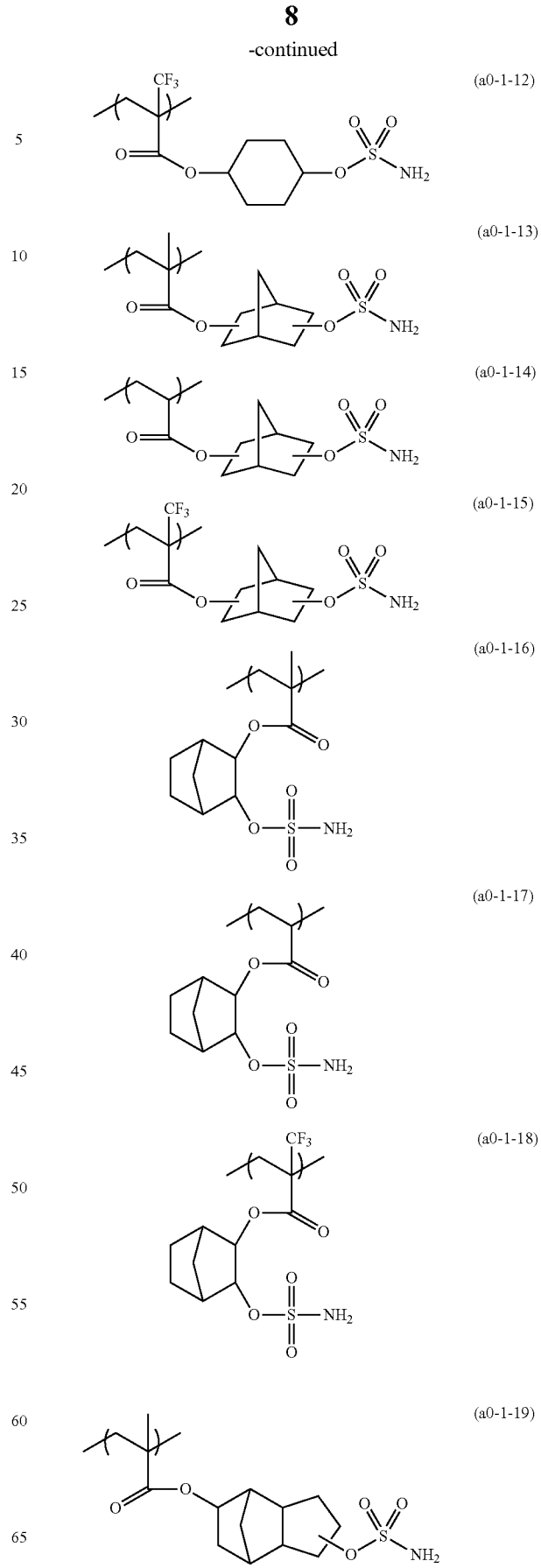

(a0-1-20)
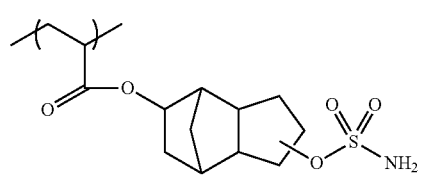
(a0-1-21)
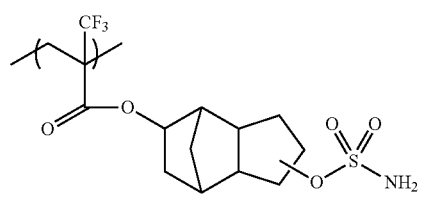
(a0-1-22)
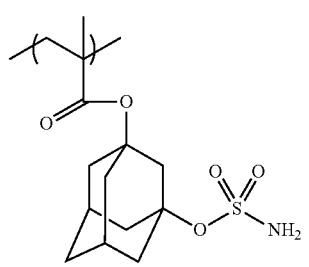
(a0-1-23)
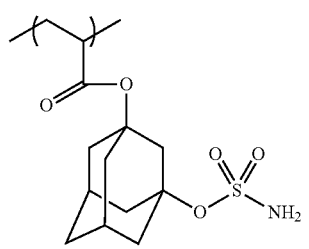
(a0-1-24)
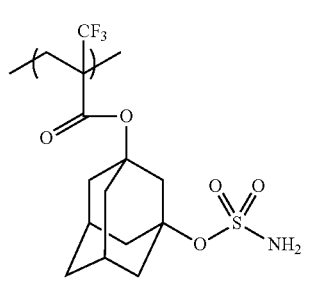
[Chemical Formula 5]
(a0-1-25)
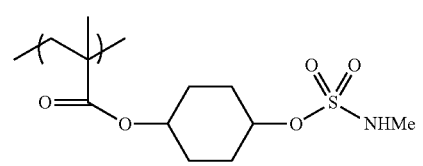
(a0-1-26)
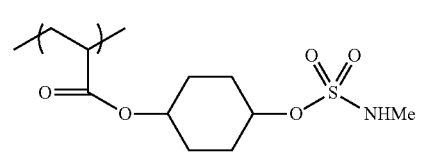
(a0-1-27)
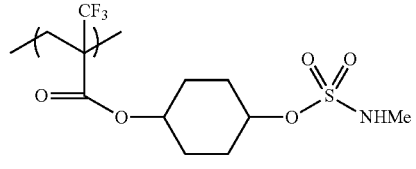
(a0-1-28)
(a0-1-29)
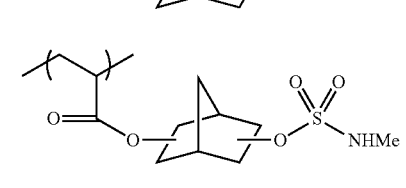
(a0-1-29)
(a0-1-31)
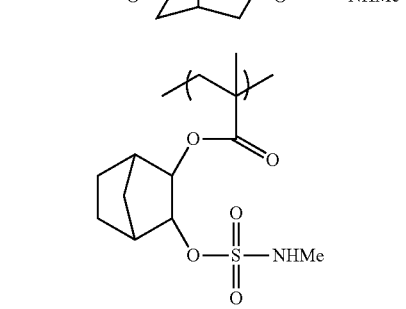
(a0-1-32)
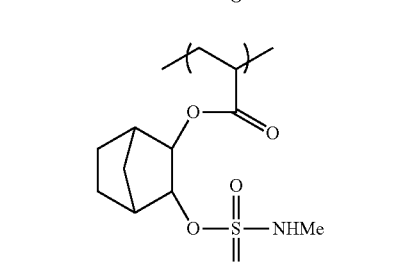
(a0-1-33)
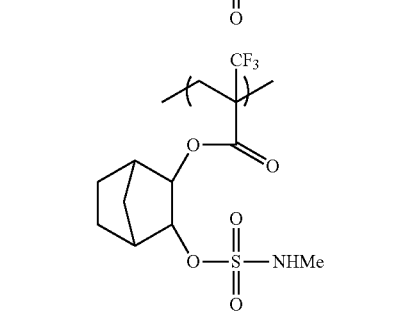
(a0-1-34)
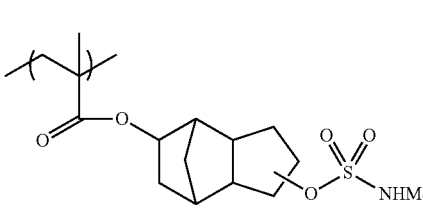

(a0-1-35)
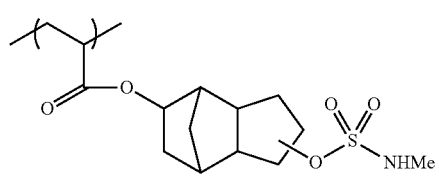
(a0-1-36)
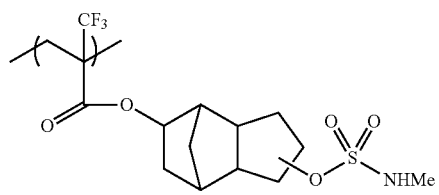
(a0-1-37)
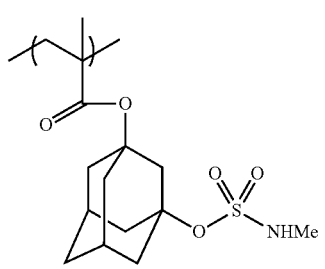
(a0-1-38)
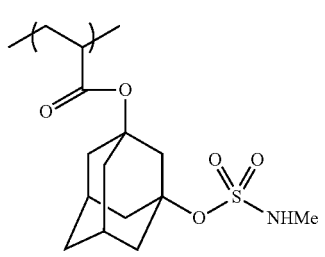
(a0-1-39)
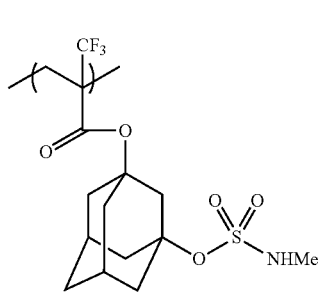
[Chemical Formula 6]
(a0-1-40)
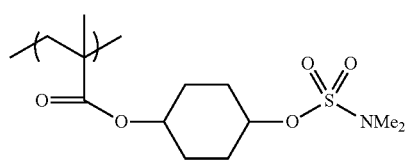
(a0-1-41)
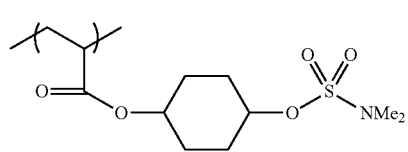
(a0-1-42)
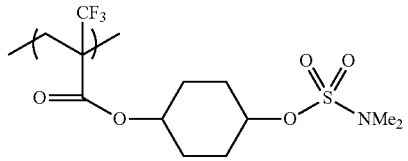
(a0-1-43)
(a0-1-44)
(a0-1-45)
(a0-1-46)
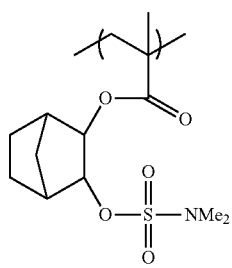
(a0-1-47)
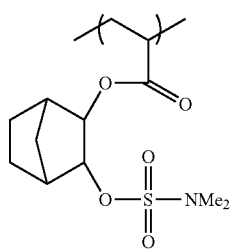
(a0-1-48)
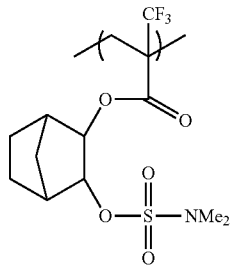
(a0-1-49)
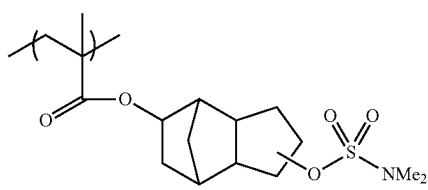

(a0-1-50)
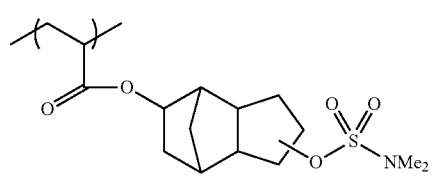
(a0-1-51)
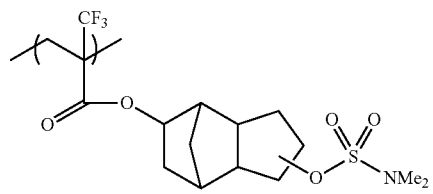
(a0-1-52)
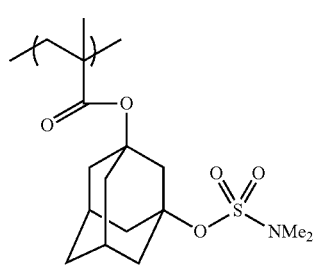
(a0-1-53)
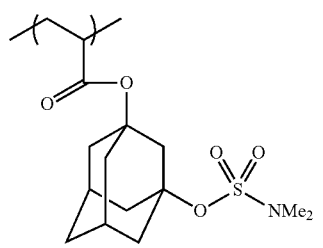
(a0-1-54)
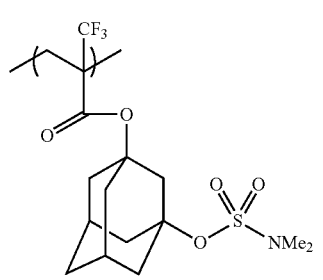
[Chemical Formula 7]
(a0-1-55)
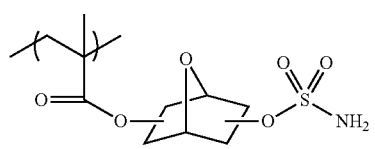
(a0-1-56)
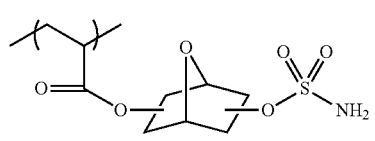
(a0-1-57)
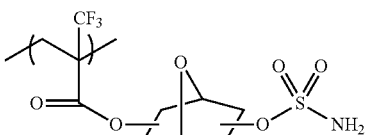
(a0-1-58)
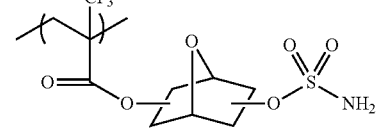
(a0-1-59)
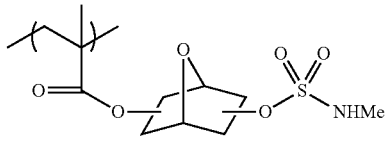
(a0-1-60)
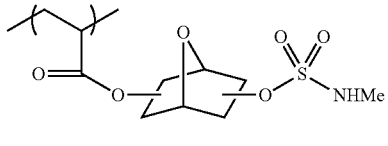
(a0-1-61)
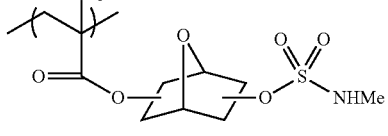
(a0-1-62)
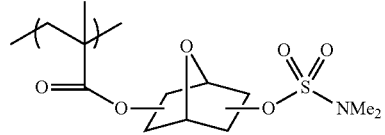
(a0-1-63)
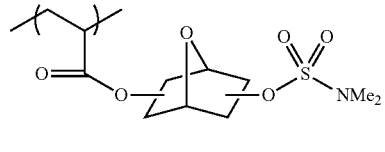
(a0-1-64)
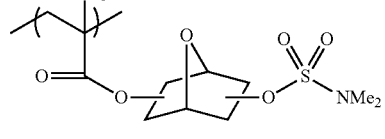
(a0-1-65)
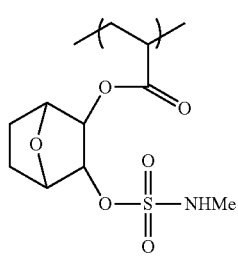

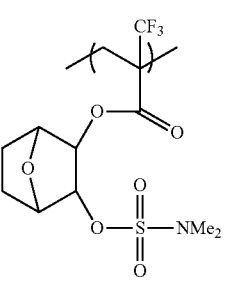
(a0-1-66)

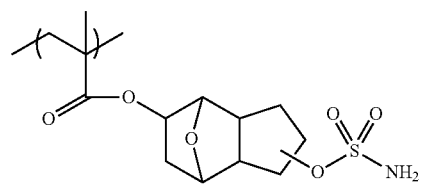
(a0-1-67)

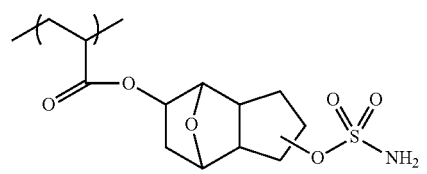
(a0-1-68)

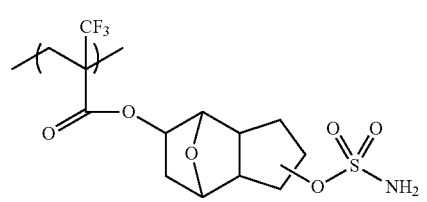
(a0-1-69)

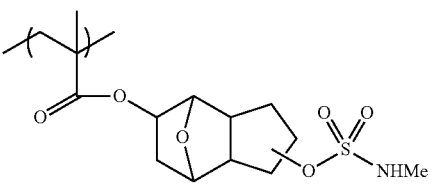
(a0-1-70)

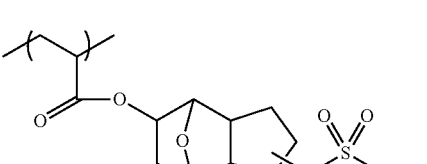
(a0-1-71)

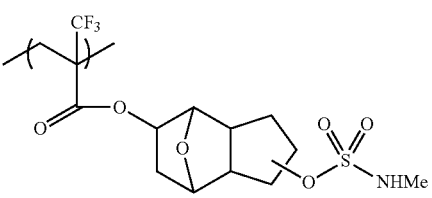
(a0-1-72)

In the component (A1), as the structural unit (a0), one type of structural unit may be used, or two or more types may be used in combination.

In the component (A1), the amount of the structural unit (a0) based on the combined total of all structural units constituting the component (A1) is preferably 1 to 40 mol %, more preferably 1 to 35 mol %, still more preferably 5 to 30 mol %, and most preferably 5 to 25 mol %. When the amount of the structural unit (a0) is at least as large as the lower limit of the above-mentioned range, various lithography properties such as EL, MEEF and CDU are improved. On the other hand, when the amount of the structural unit (a0) is no more than the upper limit of the above-mentioned range, a good balance can be achieved with the other structural units.

(Structural Unit (a1))

The structural unit (a1) is a structural unit derived from an acrylate ester containing an acid dissociable, dissolution inhibiting group. "A structural unit derived from an acrylate ester containing an acid dissociable, dissolution inhibiting group" which is represented by general formula (a0-1) is classified as structural unit (a0), and does not fall under the category of structural unit (a1).

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

With respect to the acrylate ester, specific examples of the alkyl group of 1 to 5 carbon atoms for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms as a substituent on the α-position include groups in which part or all of the hydrogen atoms of the aforementioned "alkyl group of 1 to 5 carbon atoms for the substituent at the α-position" are substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The "acid dissociable, dissolution inhibiting group" is a group having an alkali dissolution-inhibiting effect that renders the entire component (A1) insoluble in an alkali developing solution prior to dissociation, and is dissociated from the component (A1) by the action of acid generated from the component (B) upon exposure. When the acid dissociable, dissolution inhibiting group is dissociated from the structural unit (a1), the solubility of the entire component (A1) in an alkali developing solution is increased.

As the acid dissociable, dissolution inhibiting group for the structural unit (a1), any of those which have been proposed as acid dissociable, dissolution inhibiting groups for a base resin of a chemically amplified resist may be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable, dissolution inhibiting group, for example, a group represented by the formula —C(R$^{71}$)(R$^{72}$)(R$^{73}$) can be given (in the formula, each of R$^{71}$ to R$^{73}$ independently represents a linear alkyl group of 1 to 5 carbon atoms). The group represented by the formula —C(R$^{71}$)(R$^{72}$)(R$^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

In the "aliphatic cyclic group-containing acid dissociable, dissolution inhibiting group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable, dissolution inhibiting groups include (i) a monovalent aliphatic cyclic group in which a substituent (a group or an atom other than hydrogen) is bonded to the carbon atom on the ring skeleton to which an atom adjacent to the acid dissociable, dissolution inhibiting group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable, dissolution inhibiting group on the ring skeleton of the aliphatic cyclic group, an alkyl group can be mentioned. Examples of the alkyl group include the same groups as those represented by R$^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 8]

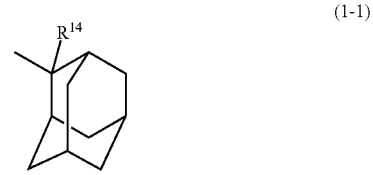
(1-1)

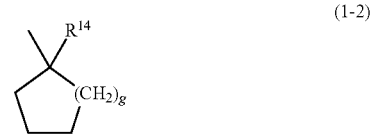
(1-2)

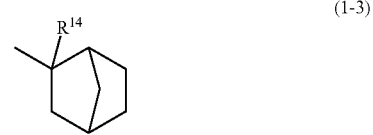
(1-3)

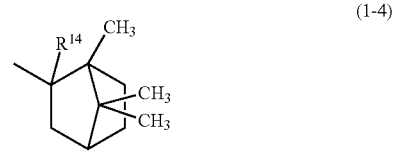
(1-4)

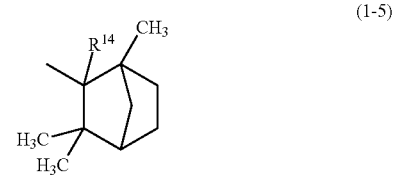
(1-5)

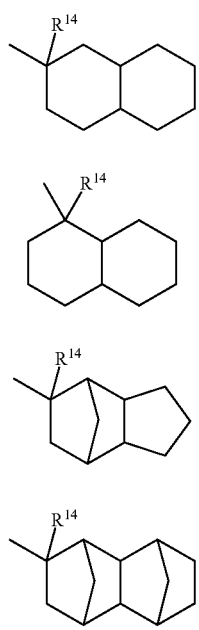

In the formulas above, R$^{14}$ represents an alkyl group; and g represents an integer of 0 to 8.

[Chemical Formula 9]

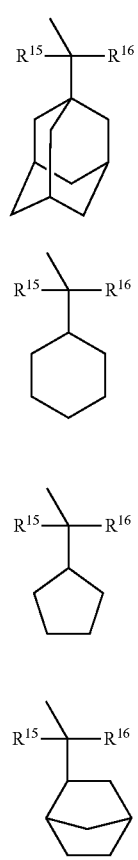

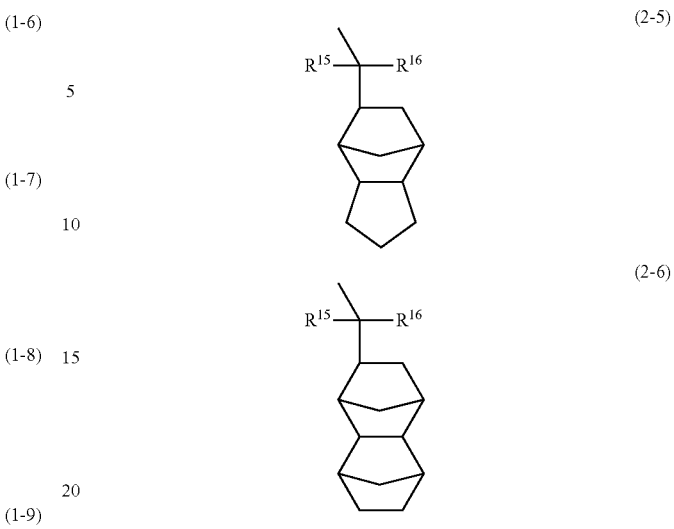

In the formulas above, each of R$^{15}$ and R$^{16}$ independently represents an alkyl group.

As the alkyl group for R$^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

As the alkyl group for R$^{15}$ and R$^{16}$, the same alkyl groups as those for R$^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 10]

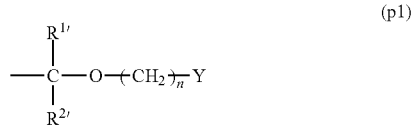

(p1)

In the formula, $R^{1\prime}$ and $R^{2\prime}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the lower alkyl group for $R^{1\prime}$ and $R^{2\prime}$, the same lower alkyl groups as those described above the alkyl groups as the substituent on the α-position of the aforementioned alkylester can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 11]

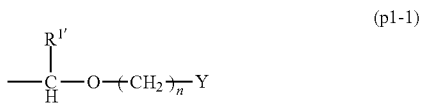

(p1-1)

In the formula, $R^{1\prime}$, n and Y are the same as defined above.

As the alkyl group for Y, the same alkyl groups as those described above the for the substituent on the α-position of the aforementioned alkylester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable, dissolution inhibiting group containing an aliphatic cyclic group" can be used.

Further, as the acetal-type, acid dissociable, dissolution inhibiting group, groups represented by general formula (p2) shown below can also be used.

[Chemical Formula 12]

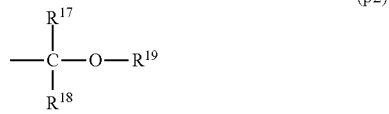

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of the structural unit (a1) include a structural unit represented by general formula (a1-0-1) shown below and a structural unit represented by general formula (a1-0-2) shown below.

[Chemical Formula 13]

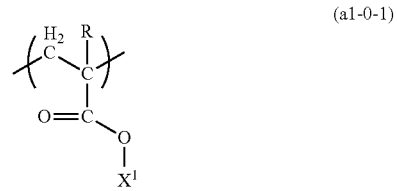

(a1-0-1)

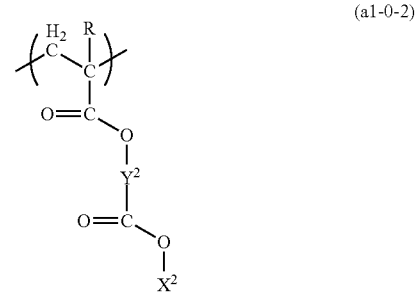

(a1-0-2)

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.

In general formula (a1-0-1), the alkyl group and the halogenated alkyl group for R are respectively the same as defined for the alkyl group and the halogenated alkyl group for the substituent on the α-position of the aforementioned alkylester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with groups or atoms other than hydrogen atom.

The hydrocarbon group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As a branched hydrocarbon group, a branched alkylene group is preferable, and specific examples include alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (═O).

As examples of the hydrocarbon group containing a ring in the structure thereof, an alicyclic hydrocarbon group (a group in which two hydrogen atoms have been removed from an aliphatic hydrocarbon ring), and a group in which the alicyclic hydrocarbon group is bonded to the terminal of the aforementioned chain-like aliphatic hydrocarbon group or interposed within the aforementioned chain-like aliphatic hydrocarbon group, can be given.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (═O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include non-hydrocarbon groups such as —O—, —C(=O)—, —C(=O)—O—, a carbonate bond (—O—C(=O)—O—, —S—, —S(=O)$_2$—, —S(=O)$_2$—O—, —NH—, —NR$^{04}$— (R$^{04}$ represents a substituent such as an alkyl group or an acyl group), —NH—C(=O)— and =N—; and a combination of any one of these non-hydrocarbon groups with a divalent hydrocarbon group. As examples of the divalent hydrocarbon group, the same groups as those described above for the divalent hydrocarbon group which may have a substituent can be given, and a linear or branched aliphatic hydrocarbon group is preferable.

As the divalent linking group for Y$^2$, an alkylene group, a divalent alicyclic hydrocarbon group or a divalent linking group containing a hetero atom is preferable. Among these, an alkylene group or a divalent linking group containing a hetero atom is more preferable.

When Y$^2$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When Y$^2$ represents a divalent alicyclic hydrocarbon group, as the alicyclic hydrocarbon group, the same alicyclic hydrocarbon groups as those described above for the "aliphatic hydrocarbon group containing a ring in the structure thereof" can be used.

As the alicyclic hydrocarbon group, a group in which two or more hydrogen atoms have been removed from cyclopentane, cyclohexane, norbornane, isobornane, adamantane, tricyclodecane or tetracyclododecane is particularly desirable.

When Y$^2$ represents a divalent linking group containing a hetero atom, preferable examples of the linking group include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O— and a group represented by general formula -A-O—B—, -[A-C(=O)—O]$_m$—B— or -A-O—C(=O)—B— [in the formulas, each of A and B independently represents a divalent hydrocarbon group which may have a substituent, O represents an oxygen atom, and m represents an integer of 0 to 3].

When Y$^2$ represents —NH—, H may be substituted with a substituent such as an alkyl group, an aryl group (an aromatic group) or the like. The substituent (an alkyl group, an aryl group or the like) preferably has 1 to 10 carbon atoms, more preferably 1 to 8, and most preferably 1 to 5.

In the group represented by the formula -A-O—B—, -[A-C(=O)—O]$_m$—B— or -A-O—C(=O)—B—, each of A and B independently represents a divalent hydrocarbon group which may have a substituent. As the divalent hydrocarbon group, the same groups as those described above for the "divalent hydrocarbon group which may have a substituent" for Y$^2$ can be mentioned.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_m$—B—, m represents an integer of 0 to 3, preferably an integer of 0 to 2, more preferably 0 or 1, and most preferably 1.

As the divalent linking group containing a hetero atom, a linear group containing an oxygen atom as the hetero atom e.g., a group containing an ether bond or an ester bond is preferable, and a group represented by the aforementioned formula -A-O—B—, -[A-C(=O)—O]$_m$—B— or -A-O—C(=O)—B— is more preferable.

Among these, a group represented by general formula -A-O—B— or -[A-C(=O)—O]$_m$—B— is preferable, a group represented by general formula -[A-C(=O)—O]$_m$—B— is more preferable, a group in which m represents 1 is still more preferable, and a group represented by the formula —(CH$_2$)$_a$—C(=O)—O—(CH$_2$)$_b$— is particularly desirable.

a is an integer of 1 to 10, preferably an integer of 1 to 8, more preferably an integer of 1 to 5, still more preferably 1 or 2, and most preferably 1.

b is an integer of 1 to 10, preferably an integer of 1 to 8, more preferably an integer of 1 to 5, still more preferably 1 or 2, and most preferably 1.

Specific examples of the structural unit (a1) include structural units represented by general formulas (a1-1) to (a1-4) shown below.

[Chemical Formula 14]

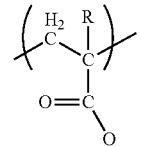

(a1-1)

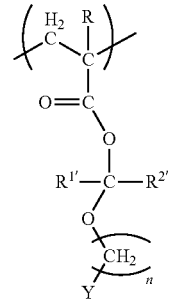

(a1-2)

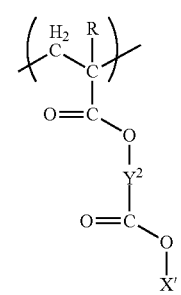
(a1-3)

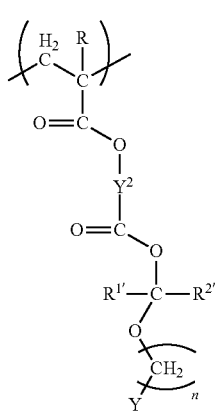
(a1-4)

In the formulas, R, $R^{1\prime}$, $R^{2\prime}$, n, Y and $Y^2$ are the same as defined above; and X' represents a tertiary alkyl ester-type acid dissociable, dissolution inhibiting group.

In the formulas, the tertiary alkyl ester-type acid dissociable, dissolution inhibiting group for X' include the same tertiary alkyl ester-type acid dissociable, dissolution inhibiting groups as those described above.

As $R^{1\prime}$, $R^{2\prime}$, n and Y are respectively the same as defined for $R^{1\prime}$, $R^{2\prime}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 15]

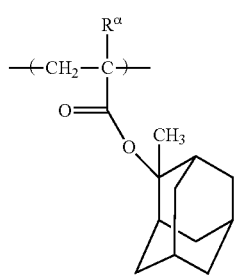
(a1-1-1)

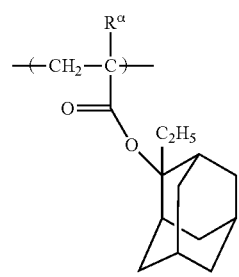
(a1-1-2)

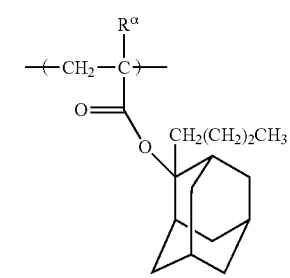
(a1-1-3)

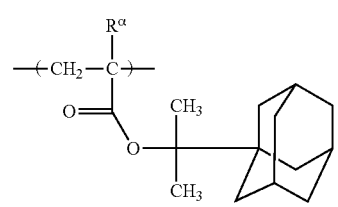
(a1-1-4)

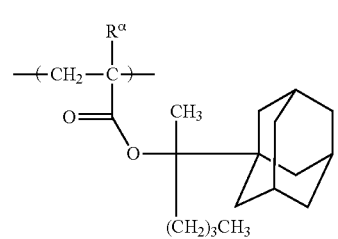
(a1-1-5)

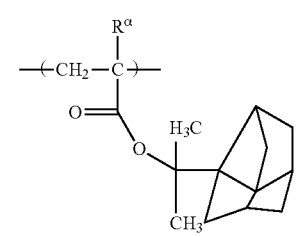
(a1-1-6)

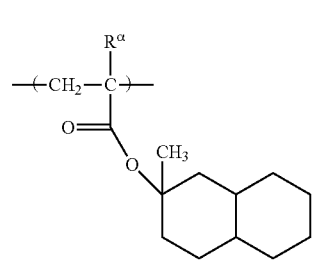
(a1-1-7)

(a1-1-8) 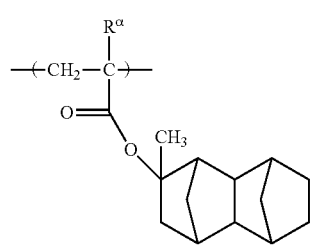
(a1-1-9) 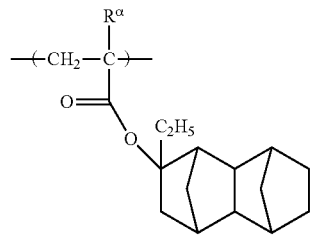
(a1-1-10) 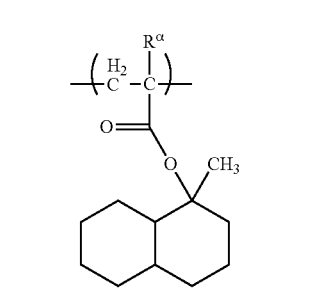
(a1-1-11) 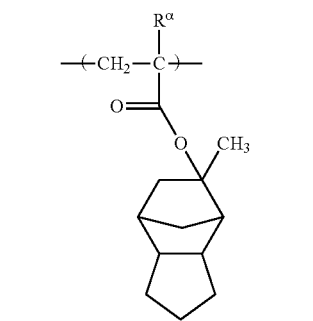
(a1-1-12) 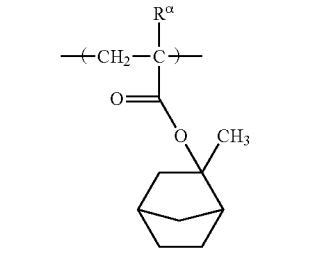
(a1-1-13) 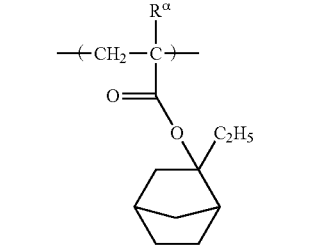
(a1-1-14) 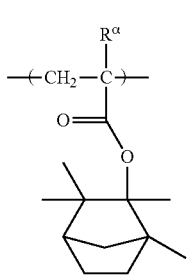
(a1-1-15) 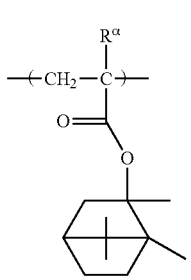
(a1-1-16) 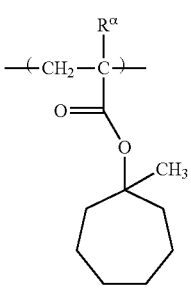
(a1-1-17) 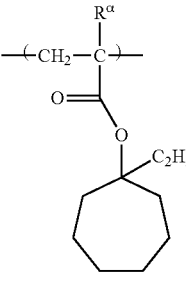
(a1-1-18) 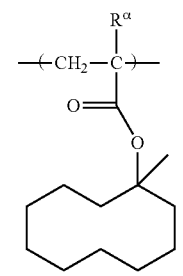

(a1-1-19)
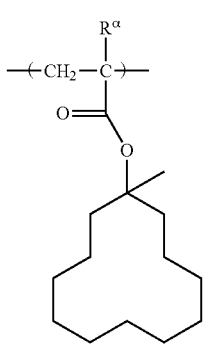
(a1-1-20)
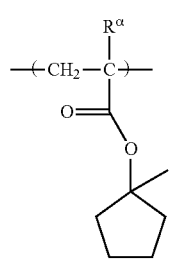
(a1-1-21)
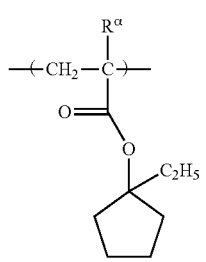
[Chemical Formula 16]
(a1-1-22)
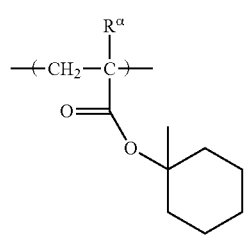
(a1-1-23)
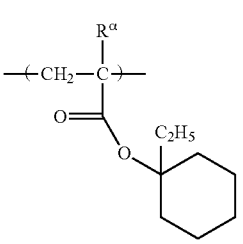
(a1-1-24)
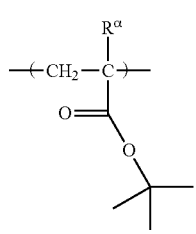
(a1-1-25)
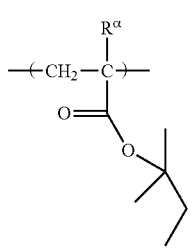
(a1-1-26)
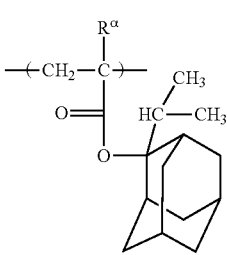
(a1-1-27)
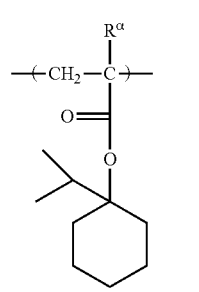
(a1-1-28)
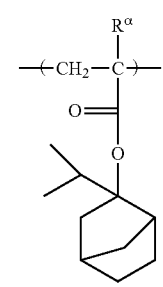
(a1-1-29)
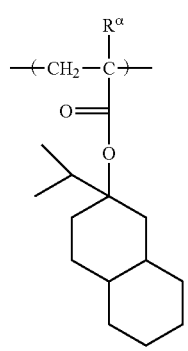

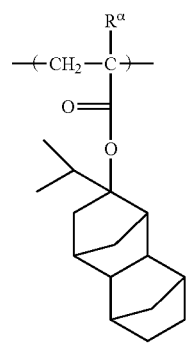
(a1-1-30)
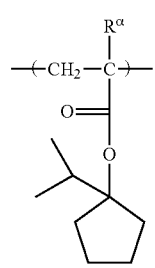
(a1-1-31)
[Chemical Formula 17]
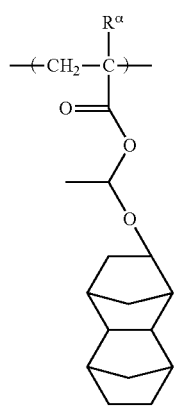
(a1-2-1)
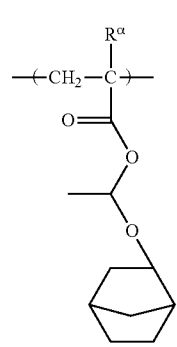
(a1-2-2)
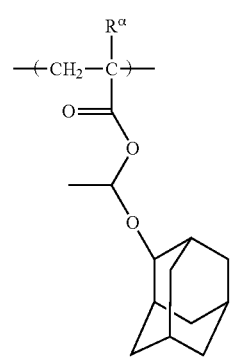
(a1-2-3)
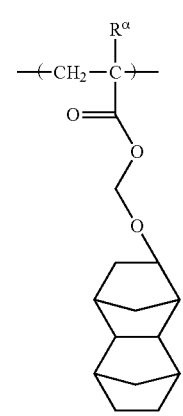
(a1-2-4)
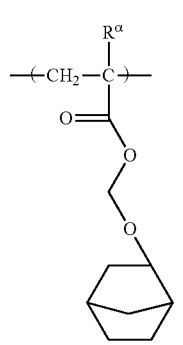
(a1-2-5)
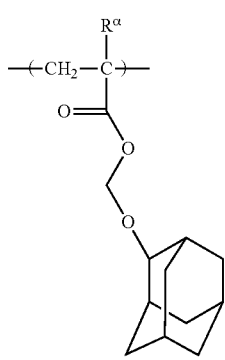
(a1-2-6)

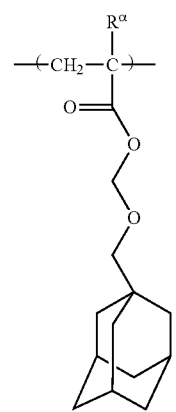 (a1-2-7)
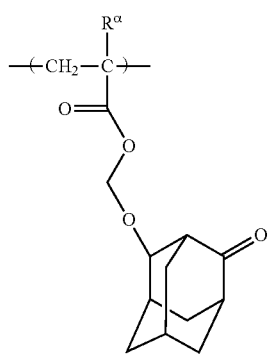 (a1-2-8)
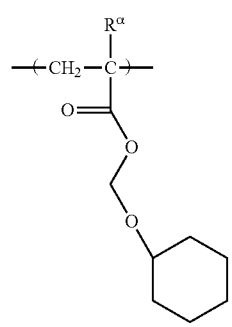 (a1-2-9)
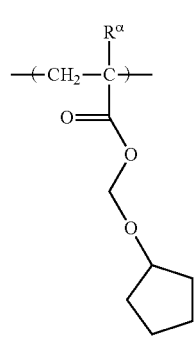 (a1-2-10)
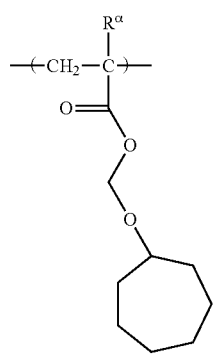 (a1-2-11)
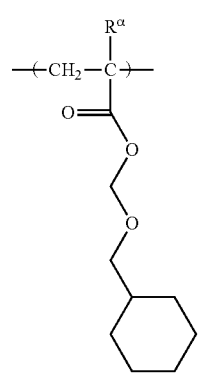 (a1-2-12)
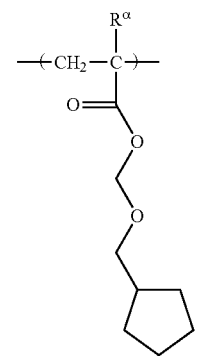 (a1-2-13)
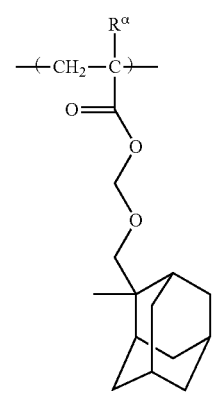 (a1-2-14)

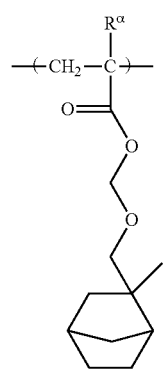
(a1-2-15)
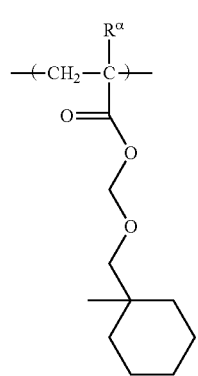
(a1-2-16)
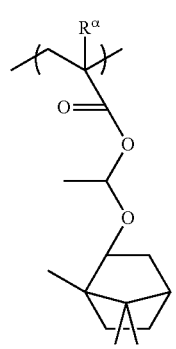
(a1-2-17)
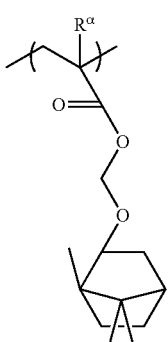
(a1-2-18)
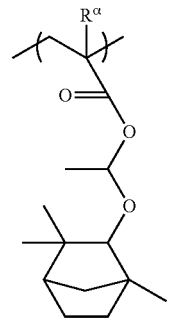
(a1-2-19)
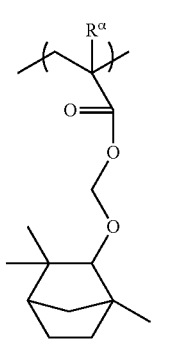
(a1-2-20)
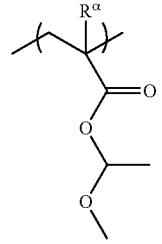
(a1-2-21)
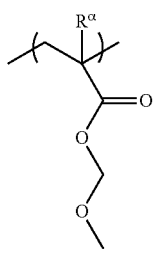
(a1-2-22)
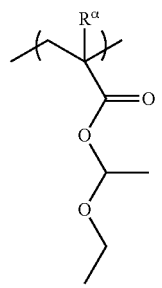
(a1-2-23)

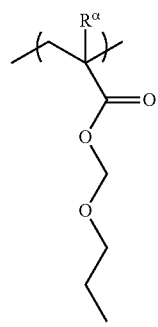 (a1-2-24)
[Chemical Formula 18]
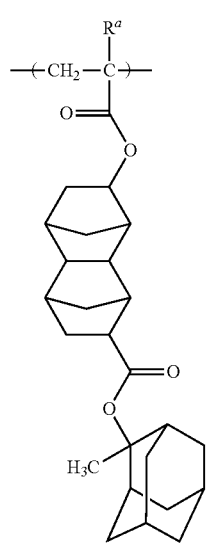 (a1-3-1)
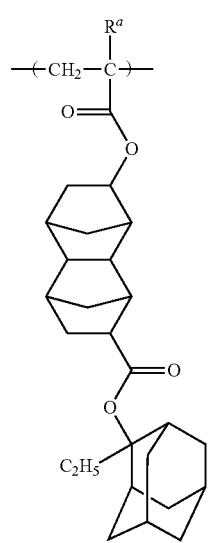 (a1-3-2)
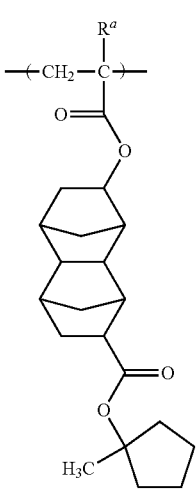 (a1-3-3)
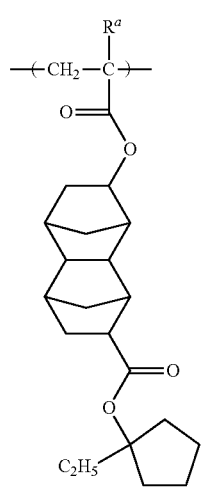 (a1-3-4)
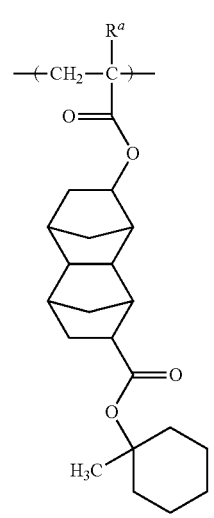 (a1-3-5)

-continued
(a1-3-6)
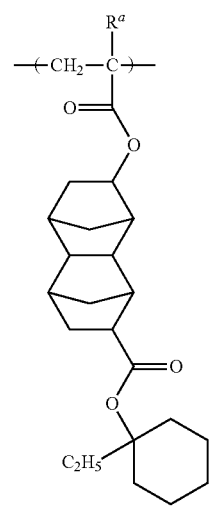
(a1-3-7)
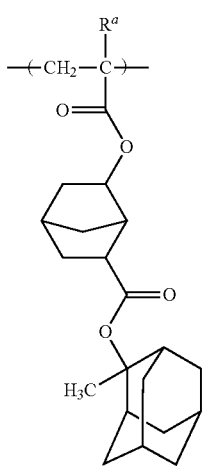
(a1-3-8)
-continued
(a1-3-9)
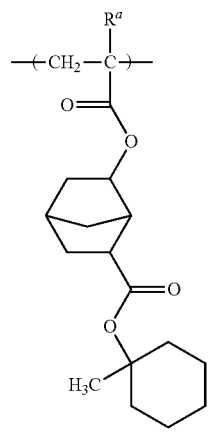
(a1-3-10)
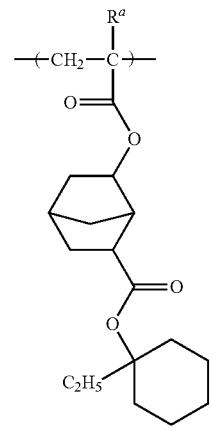
(a1-3-11)
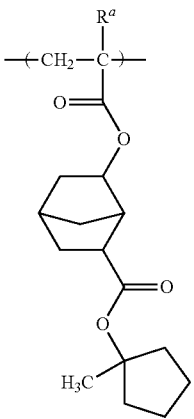
(a1-3-12)
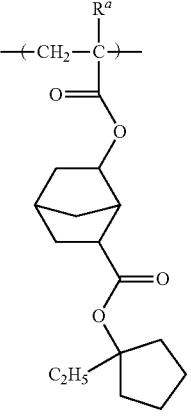

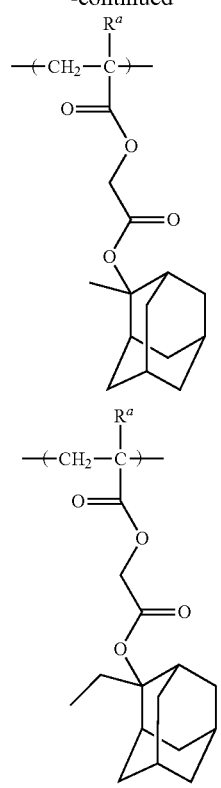 (a1-3-13)
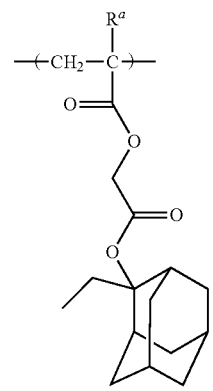 (a1-3-14)
(a1-3-15)
(a1-3-16)
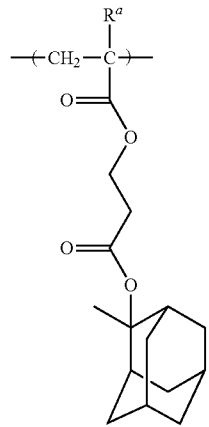
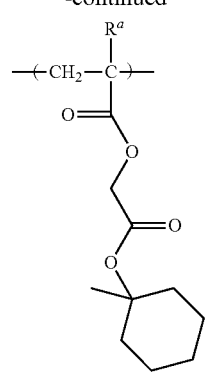 (a1-3-17)
(a1-3-18)
[Chemical Formula 19]
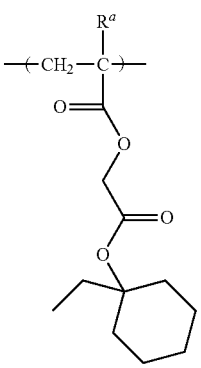
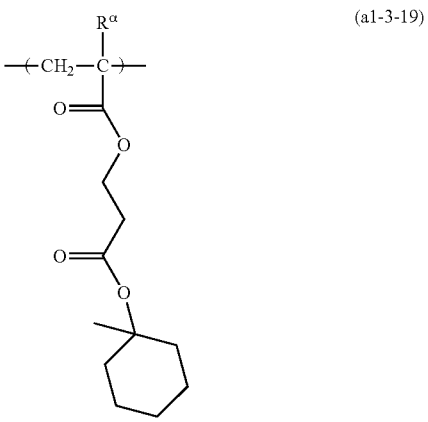 (a1-3-19)
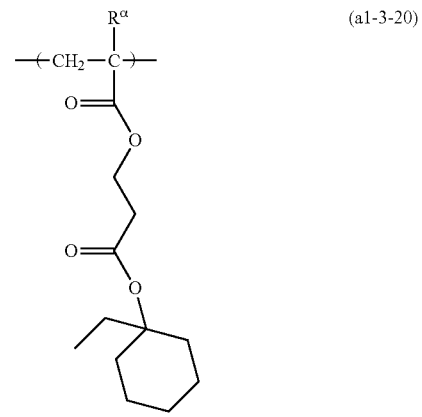 (a1-3-20)

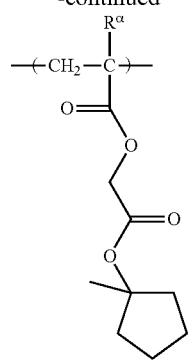 (a1-3-21)
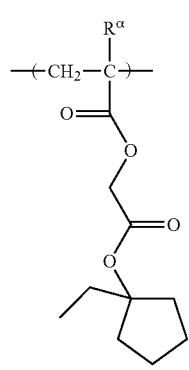 (a1-3-22)
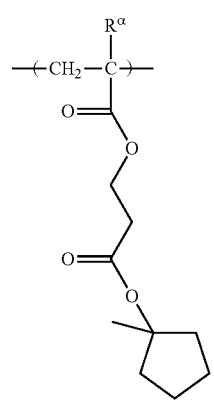 (a1-3-23)
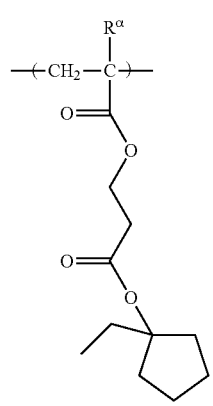 (a1-3-24)
[Chemical Formula 20]
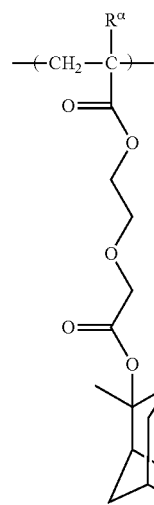 (a1-3-25)
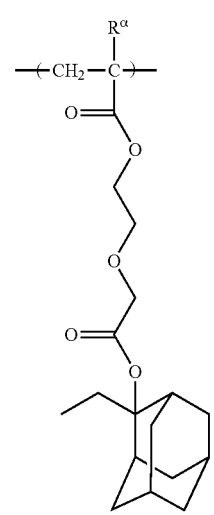 (a1-3-26)
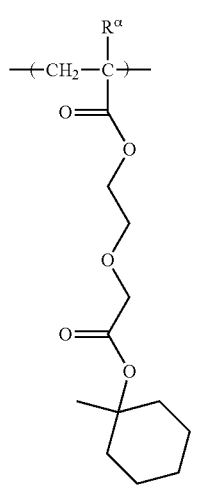 (a1-3-27)

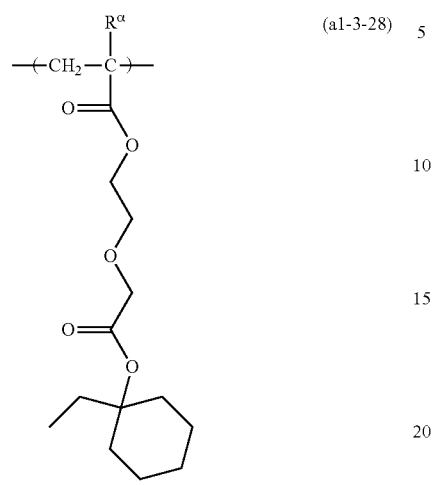
(a1-3-28)
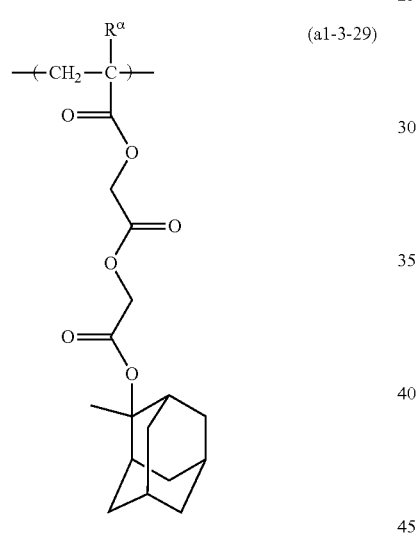
(a1-3-29)
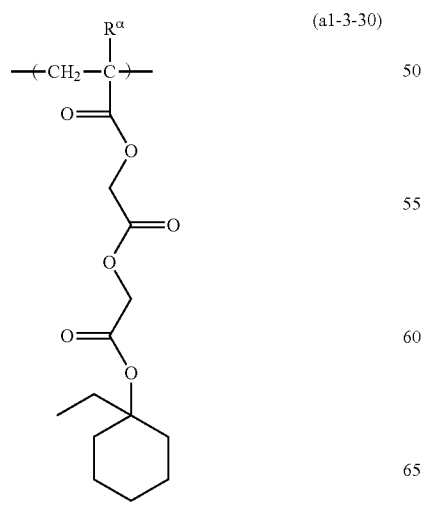
(a1-3-30)
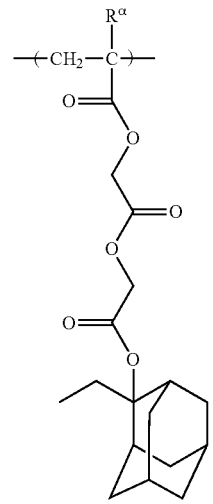
(a1-3-31)
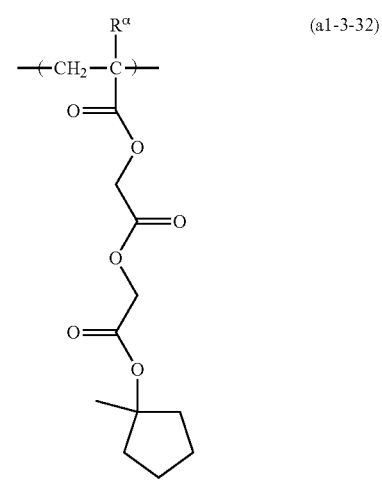
(a1-3-32)
[Chemical Formula 21]
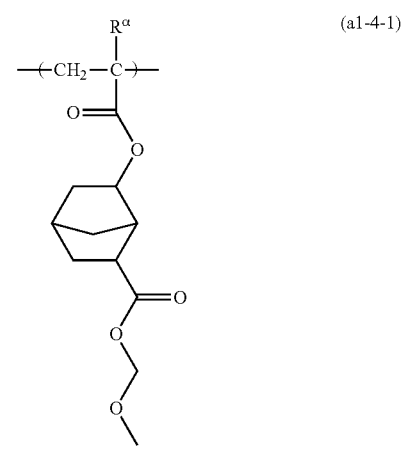
(a1-4-1)

(a1-4-2)
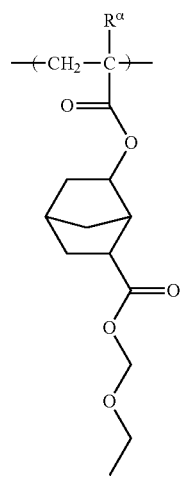
(a1-4-3)
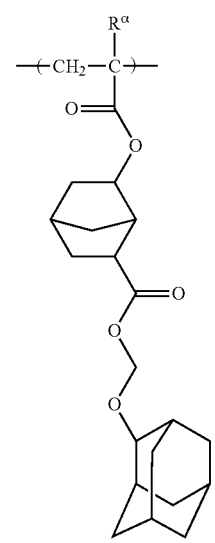
(a1-4-4)
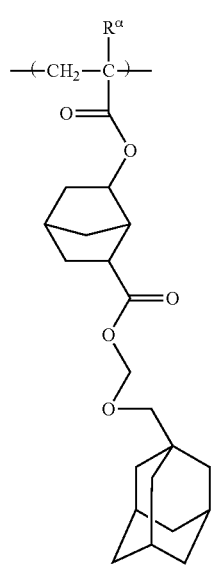
(a1-4-5)
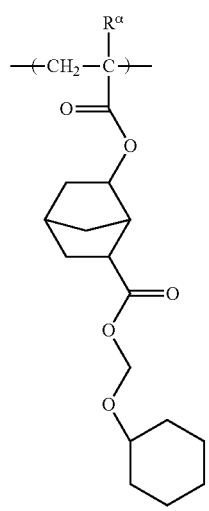
(a1-4-6)
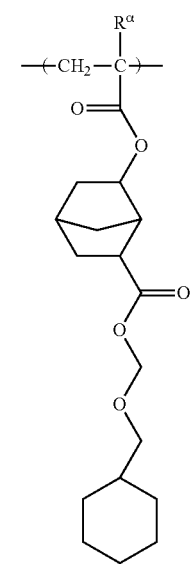
(a1-4-7)
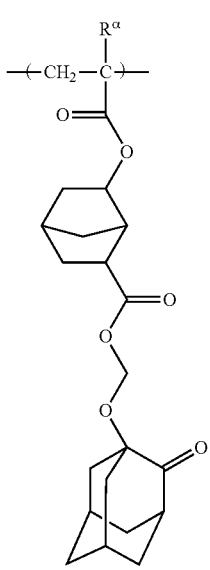

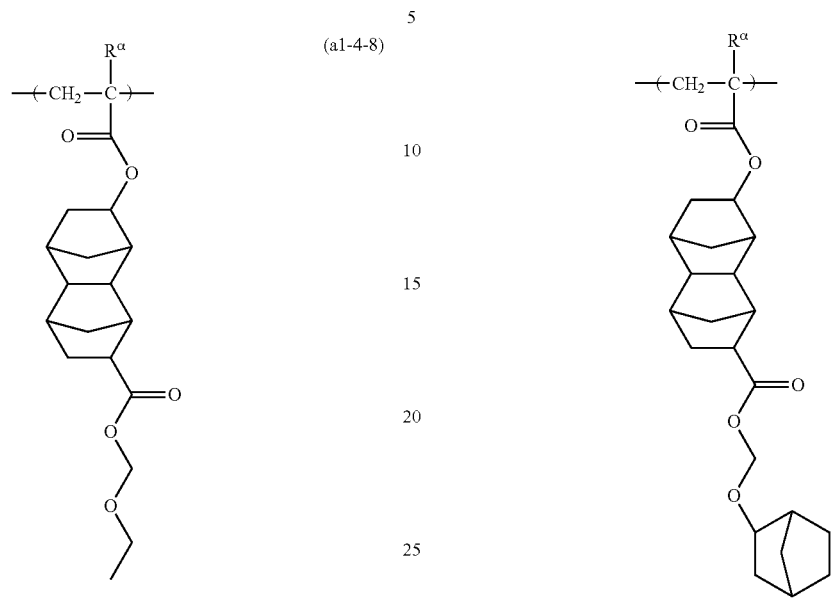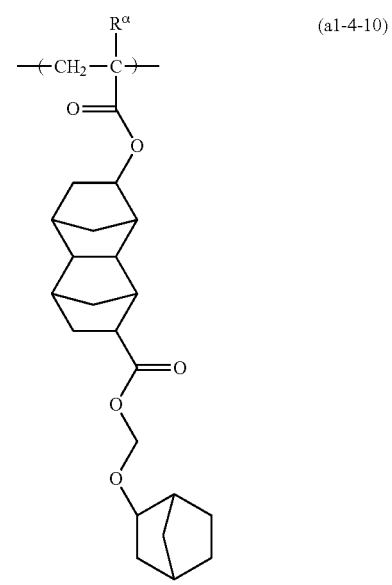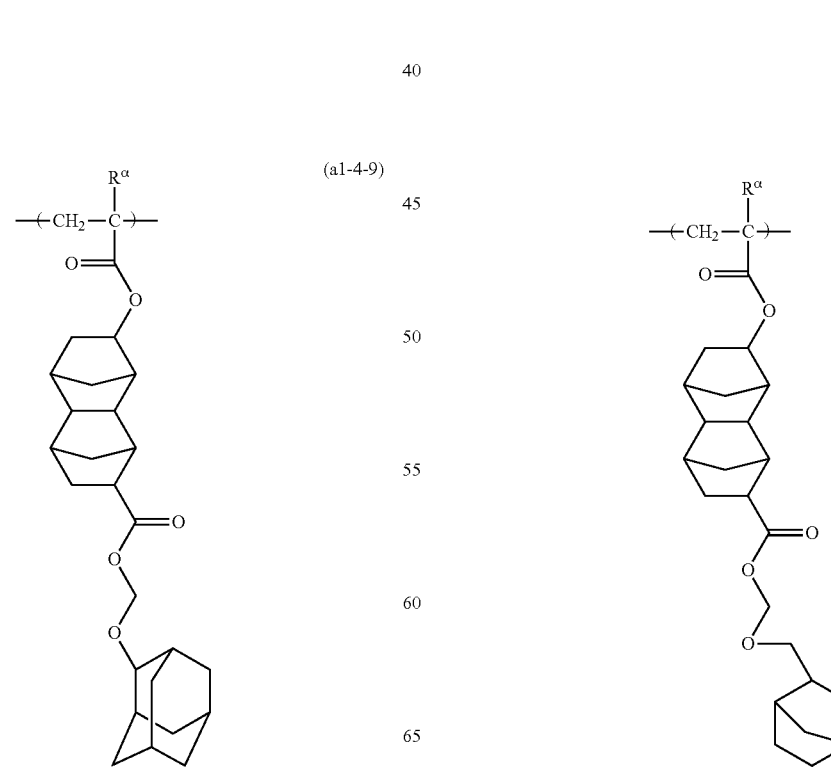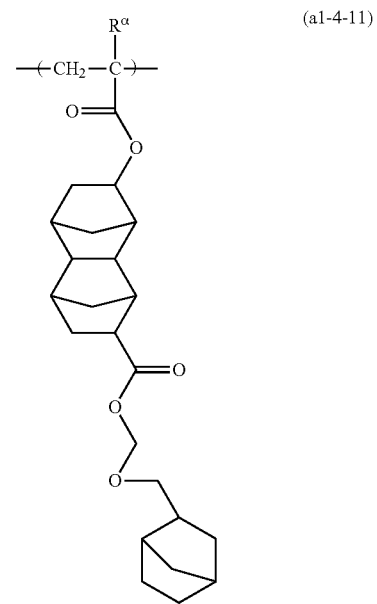

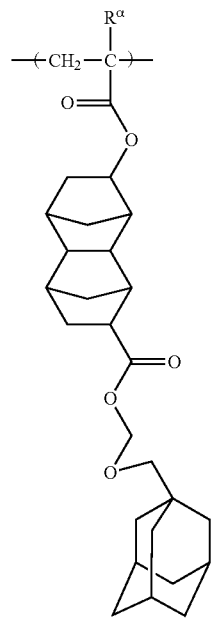

(a1-4-12)

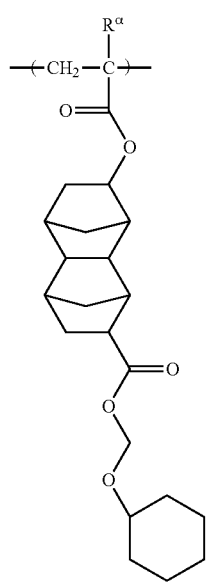

(a1-4-13)

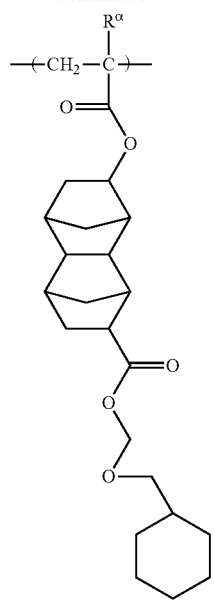

(a1-4-14)

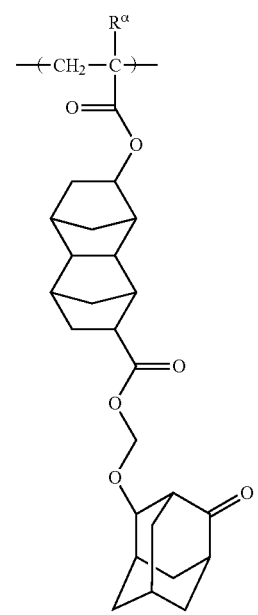

(a1-4-15)

In the present invention, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below and a structural unit represented by general formula (a1-0-2) shown below. It is particularly desirable that the structural unit (a1) include at least one member selected from the group consisting of a structural unit represented by general formula (a1-0-11) shown below, a structural unit represented by general formula (a1-0-12) shown below and a structural unit represented by general formula (a1-0-2) shown below.

[Chemical Formula 22]

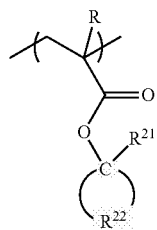
(a1-0-11)

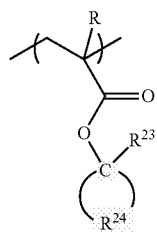
(a1-0-12)

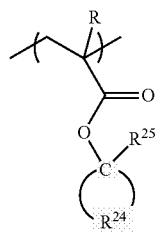
(a1-0-13)

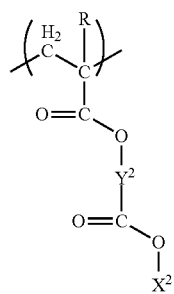
(a1-0-2)

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocycle group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $R^{25}$ represents a linear alkyl group of 1 to 5 carbon atoms; $Y^2$ represents a divalent linking group; and $X^2$ represents an acid dissociable, dissolution inhibiting group.

In the formulas, R, $Y^2$ and $X^2$ are the same as defined above.

In general formula (a1-0-11), as the alkyl group for $R^{21}$, the same alkyl groups as those described above for $R^{14}$ in formulas (1-1) to (1-9) can be used, preferably a methyl group, an ethyl group or an isopropyl group.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable, dissolution inhibiting group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic cyclic group, an alkylene group which may have an ether bond (—O—) interposed between the carbon atoms can be given.

Specific examples of structural units represented by general formula (a1-0-11) include structural units represented by the aforementioned formulas (a1-1-16) to (a1-1-23), (a1-1-27) and (a1-1-31). Among these, a structural unit represented by general formula (a1-1-02) shown below which includes the structural units represented by the aforementioned formulas (a1-1-16), (a1-1-17), (a1-1-20) to (a1-1-23), (a1-1-27) and (a1-1-31) is preferable. Further, a structural unit represented by general formula (a1-1-02') shown below is also preferable.

In the formulas, h is preferably 1 or 2.

[Chemical Formula 23]

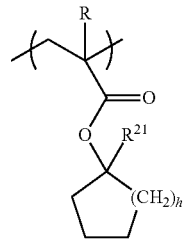
(a1-1-02)

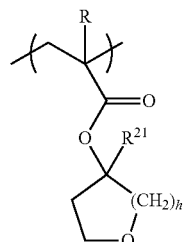
(a!-1-02')

In the formulas, R and $R^{21}$ are the same as defined above; and h represents an integer of 1 to 3.

In general formula (a1-0-12), as the branched alkyl group for $R^{23}$, the same alkyl groups as those described above for $R^{14}$ which are branched can be used, and an isopropyl group is particularly desirable.

As the aliphatic polycyclic group formed by $R^{24}$ and the carbon atoms to which $R^{24}$ is bonded, the same aliphatic cyclic groups as those described above for the aforementioned tertiary alkyl ester-type acid dissociable, dissolution inhibiting group and which are polycyclic can be used.

Specific examples of structural units represented by general formula (a1-0-12) include structural units represented by the aforementioned formulas (a1-1-26) and (a1-1-28) to (a1-1-30).

As the structural unit (a1-0-12), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-26) is particularly desirable.

In general formula (a1-0-13), R and $R^{24}$ are the same as defined above.

As the linear alkyl group for $R^{25}$, the same linear alkyl groups as those described above for $R^{14}$ in the aforementioned formulas (1-1) to (1-9) can be mentioned, and a methyl group or an ethyl group is particularly desirable.

Specific examples of structural units represented by general formula (a1-0-13) include structural units represented by the aforementioned formulas (a1-1-1), (a1-1-2) and (a1-1-7) to (a1-1-15) which were described above as specific examples of the structural unit represented by general formula (a1-1).

As the structural unit (a1-0-13), a structural unit in which the aliphatic polycyclic group formed by $R^{24}$ and the carbon atom to which et is bonded is a 2-adamantyl group is preferable, and a structural unit represented by the aforementioned formula (a1-1-1) or (a1-1-2) is particularly desirable.

Examples of structural units represented by general formula (a1-0-2) include structural units represented by the aforementioned formulas (a1-3) and (a1-4).

As a structural unit represented by general formula (a1-0-2), those in which $Y^2$ is a group represented by the aforementioned formula -A-O—B— or -A-C(=O)—O—B— is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 24]

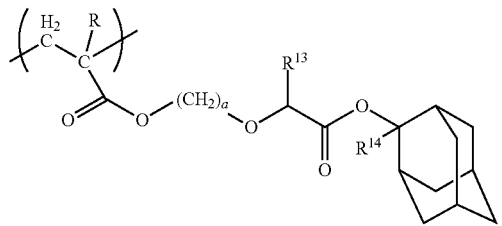

(a!-3-01)

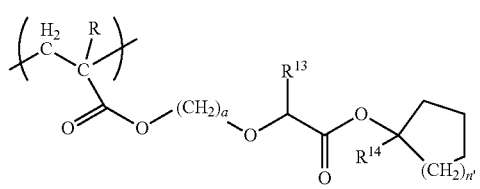

(a!-3-02)

In the formulas, R is the same as defined above; $R^{13}$ represents a hydrogen atom or a methyl group; $R^{14}$ represents an alkyl group; a represents an integer of 1 to 10; and n' represents an integer of 0 to 3.

[Chemical Formula 25]

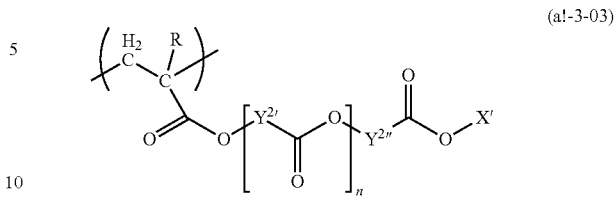

(a!-3-03)

In the formula, R is as defined above; each of $Y^{2\prime}$ and $Y^{2\prime\prime}$ independently represents a divalent linking group; X' represents an acid dissociable, dissolution inhibiting group; and n represents an integer of 0 to 3.

In general formulas (a1-3-01) and (a1-3-02), $R^{13}$ is preferably a hydrogen atom.

$R^{14}$ is the same as defined for $R^{14}$ in the aforementioned formulas (1-1) to (1-9).

a is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2\prime}$ and $Y^{2\prime\prime}$, the same groups as those described above for $Y^2$ in general formula (a1-3) can be used.

As $Y^{2\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2\prime\prime}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) in which a substituent is bonded to the carbon atom to which an atom adjacent to the acid dissociable, dissolution inhibiting group is bonded to on the ring skeleton to form a tertiary carbon atom. Among these, a group represented by the aforementioned general formula (1-1) is particularly desirable.

n represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 26]

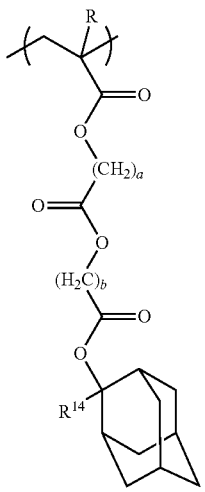

(a!-3-03-1)

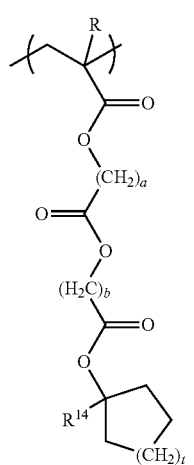

(a!-3-03-2)

In the formulas, R and $R^{14}$ are the same as defined above; a represents an integer of 1 to 10; b represents an integer of 1 to 10; and t represents an integer of 0 to 3.

In general formulas (a1-3-03-1) and (a1-3-03-2), a is preferably an integer of 1 to 8, more preferably 1 to 5, and most preferably 1 or 2.

b is preferably an integer of 1 to 8, more preferably 1 to 5, and most preferably 1 or 2.

t is preferably an integer of 1 to 3, and most preferably 1 or 2.

Specific examples of structural units represented by general formula (a1-3-03-1) or (a1-3-03-2) include structural units represented by the aforementioned formulas (a1-3-29) to (a1-3-32).

As the structural unit (a1), one type of structural unit may be used, or two or more types may be used in combination.

In terms of achieving excellent lithography properties, it is particularly desirable to include at least two types of structural units as the structural unit (a1). When the component (A1) includes at least two types of structural units (a1), the number of structural units (a1) is preferably 2 to 4, and more preferably 2 or 3.

In such a case, it is preferable that at least one of the at least two structural units is a structural unit selected from the group consisting of a structural unit represented by general formula (a1-0-11), a structural unit represented by general formula (a1-0-12), a structural unit represented by general formula (a1-0-13) and a structural unit represented by general formula (a1-0-2).

The structural unit (a1) including at least two types of structural units may consist of structural units selected from the group consisting of a structural unit represented by general formula (a1-0-11), a structural unit represented by general formula (a1-0-12), a structural unit represented by general formula (a1-0-13) and a structural unit represented by general formula (a1-0-2). Alternatively, the structural unit (a1) may be a combination of at least one structural unit selected from the aforementioned group and a structural unit which does not fall under the category of the aforementioned group.

Examples of the structural unit which does not fall under the category of the aforementioned group include a structural unit represented by the aforementioned general formula (a1-2) and a structural unit represented by the aforementioned formula (a1-4).

In the component (A1), the amount of the structural unit (a1) based on the combined total of all structural units constituting the component (A1) is preferably 10 to 80 mol %, more preferably 20 to 70 mol %, and still more preferably 25 to 50 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a2))

The structural unit (a2) is at least one structural unit selected from the group consisting of a structural unit derived from an acrylate ester containing a —$SO_2$—containing cyclic group (hereafter, referred to as "structural unit ($a2^S$)") and a structural unit derived from an acrylate ester containing a lactone-containing cyclic group (hereafter, referred to as "structural unit ($a2^L$)").

By virtue of the structural unit (a2) containing a —$SO_2$— containing cyclic group or a lactone-containing cyclic group, a positive resist composition containing the component (A1) including the structural unit (a2) is capable of improving the adhesion of a resist film to a substrate, and increasing the compatibility with the developing solution containing water, thereby contributing to improvement of lithography properties.

—Structural Unit ($a2^S$):

The structural unit ($a2^S$) is a structural unit derived from an acrylate ester containing a —$SO_2$— containing cyclic group.

The —$SO_2$— containing cyclic group refers to a cyclic group including a ring that contains —$SO_2$— within the ring skeleton thereof (a ring in which the sulfur atom (S) of —$SO_2$— forms a part of the ring skeleton), and this ring is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given.

As the halogenated alkyl group, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —$SO_2$— containing cyclic group include groups represented by general formulas (3-1) to (3-4) shown below.

[Chemical Formula 27]

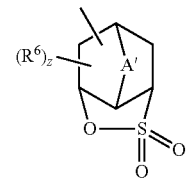

(3-1)

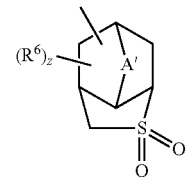

(3-2)

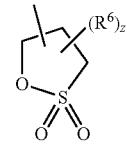

(3-3)

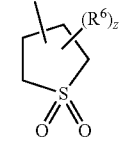

(3-4)

In the formulas, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of $R^6$ may be the same or different from each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 28]

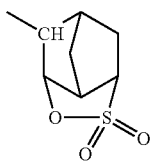
(3-1-1)

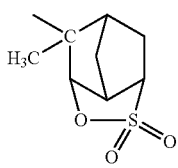
(3-1-2)

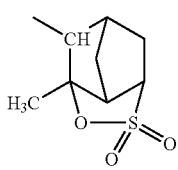
(3-1-3)

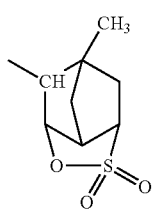
(3-1-4)

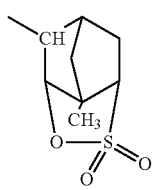
(3-1-5)

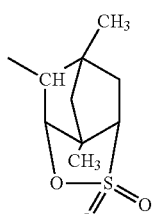
(3-1-6)

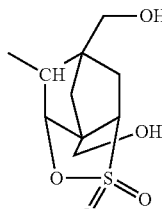
(3-1-7)

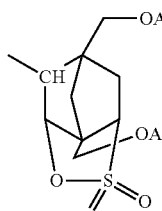
(3-1-8)

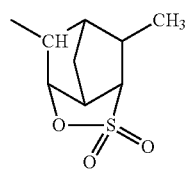
(3-1-9)

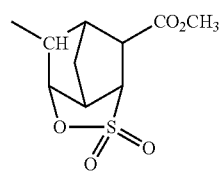
(3-1-10)

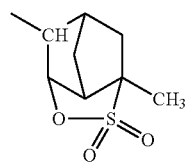
(3-1-11)

-continued
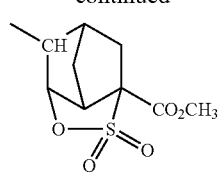 (3-1-12)
[Chemical Formula 29]
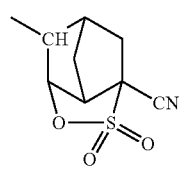 (3-1-13)
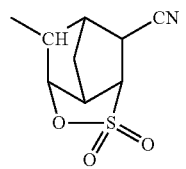 (3-1-14)
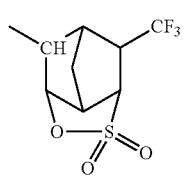 (3-1-15)
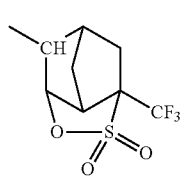 (3-1-16)
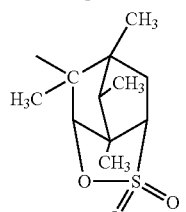 (3-1-17)
[Chemical Formula 30]
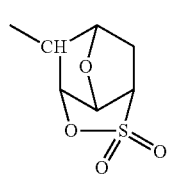 (3-1-18)
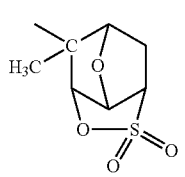 (3-1-19)
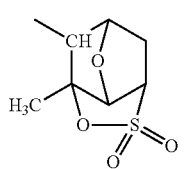 (3-1-20)
-continued
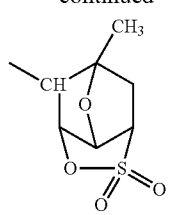 (3-1-21)
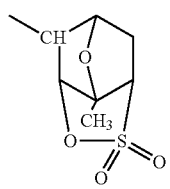 (3-1-22)
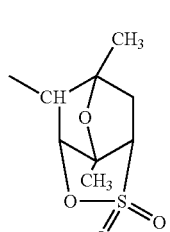 (3-1-23)
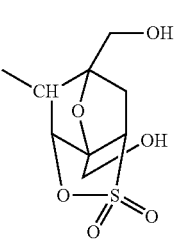 (3-1-24)
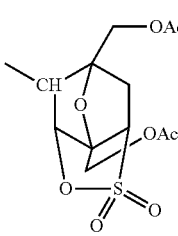 (3-1-25)
[Chemical Formula 31]
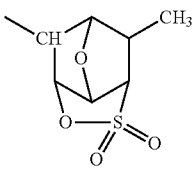 (3-1-26)
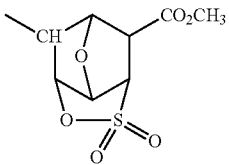 (3-1-27)
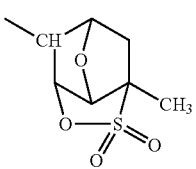 (3-1-28)

-continued

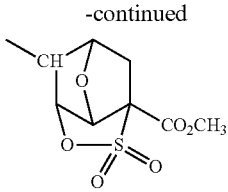 (3-1-29)

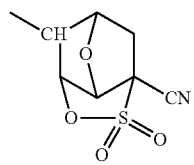 (3-1-30)

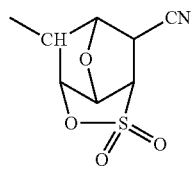 (3-1-31)

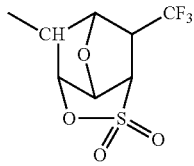 (3-1-32)

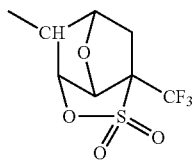 (3-1-33)

[Chemical Formula 32]

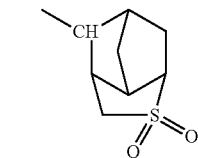 (3-2-1)

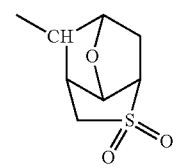 (3-2-2)

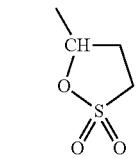 (3-3-1)

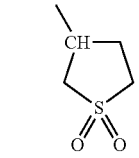 (3-4-1)

As the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specific examples of the structural unit ($a2^S$) include structural units represented by general formula (a2-0) shown below.

[Chemical Formula 33]

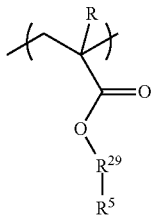 (a2-0)

In the formula, R represents a hydrogen atom, an alkyl group of 1 to 5 carbon atoms or a halogenated alkyl group of 1 to 5 carbon atoms; $R^5$ represents a —$SO_2$— containing cyclic group; and $R^{29}$ represents a single bond or a divalent linking group.

In general formula (a2-0), R is the same as defined above, $R^5$ is the same as defined for the aforementioned —$SO_2$— containing group.

$R^{29}$ may be either a single bond or a divalent linking group. In terms of the effects of the present invention, a divalent linking group is preferable.

The divalent linking group for $R^{29}$ is not particularly limited. For example, the same divalent linking groups as those described for $Y^2$ in general formula (a1-0-2) explained above in relation to the structural unit (a1) can be mentioned. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general, formula: —$R^4$—C(=O)—O— (in the formula, $R^4$ represents a divalent linking group) is particularly desirable. That is, the structural unit ($a2^S$) is preferably a structural unit represented by general formula (a2-0-1) shown below.

[Chemical Formula 34]

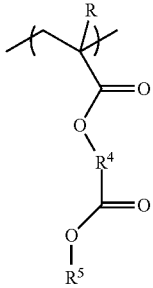 (a2-0-1)

In the formula, R and $R^5$ are the same as defined above; and $R^4$ represents a divalent linking group.

$R^4$ is not particularly limited. For example, the same divalent linking groups as those described for $Y^2$ in general formula (a1-0-2) explained above in relation to the structural unit (a1) can be mentioned.

As the divalent linking group for $R^4$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $Y^2$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing a hetero atom, a divalent linking group containing an ether bond or an ester bond is preferable, and a group represented by the aforementioned formula -A-O—B—, -[A-C(=O)—O]$_m$—B— or -A-O—C(=O)—B— is more preferable.

Among these, a group represented by the formula -A-O—C(=O)—B— is preferable, and a group represented by the formula: —(CH$_2$)$_c$—C(=O)—O—(CH$_2$)$_d$— is particularly desirable. c represents an integer of 1 to 5, and preferably 1 or 2. d represents an integer of 1 to 5, and preferably 1 or 2.

In particular, as the structural unit (a2$^S$), a structural unit represented by general formula (a0-1-11) or (a0-1-12) shown below is preferable, and a structural unit represented by general formula (a0-1-12) shown below is more preferable.

[Chemical Formula 35]

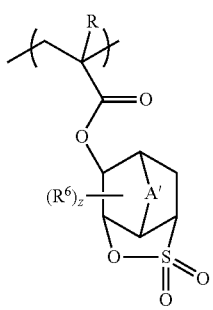

(a0-1-11)

[Chemical Formula 36]

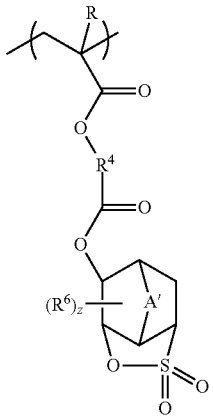

(a0-1-12)

In the formulas, R, A', $R^6$, z and $R^4$ are the same as defined above.

In general formula (a0-1-11), A' is preferably a methylene group, an oxygen atom (—O—) or a sulfur atom (—S—).

As $R^4$, a linear or branched alkylene group or a divalent linking group containing an oxygen atom is preferable. As the linear or branched alkylene group and the divalent linking group containing an oxygen atom represented by $R^4$, the same linear or branched alkylene groups and the divalent linking groups containing an oxygen atom as those described above can be mentioned.

As the structural unit represented by general formula (a0-1-12), a structural unit represented by general formula (a0-1-12a) or (a0-1-12b) shown below is particularly desirable.

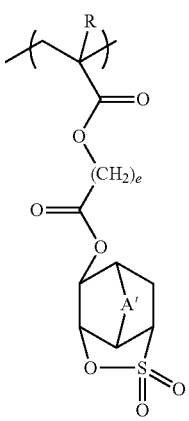

(a0-1-12a)

-continued (a0-1-12b)

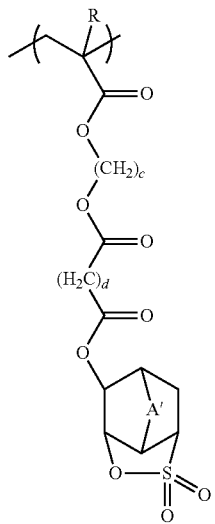

[Chemical Formula 37]

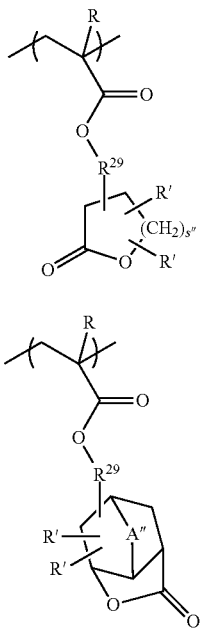

In the formulas, R and A' are the same as defined above; and each of c to e independently represents an integer of 1 to 3.

—Structural Unit (a2$^L$);

The structural unit (a2$^L$) is a structural unit derived from an acrylate ester containing a lactone-containing cyclic group.

The term "lactone-containing cyclic group" refers to a cyclic group including a ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2$^L$) is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit (a2$^L$) include structural units represented by the aforementioned general formula (a2-0) in which the R$^5$ group has been substituted with a lactone-containing cyclic group. Specific examples include structural units represented by general formulas (a2-1) to (a2-5) shown below.

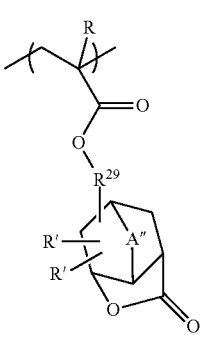

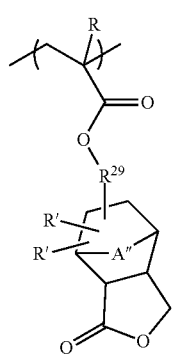

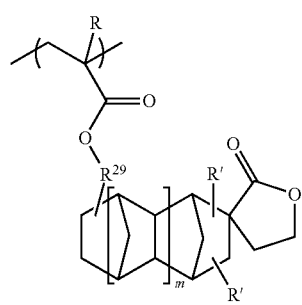

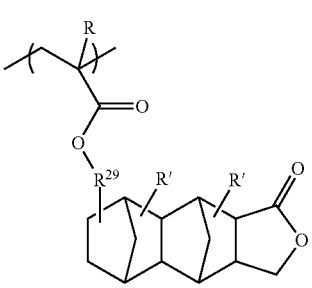

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms fox R' include a methoxy group, an ethoxy group, an n-propoxy group, an iso-propoxy group, an n-butoxy group and a tert-butoxy group In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ is the same as defined for $R^{29}$ in the aforementioned general formula (a2-0).

In formula (a2-1), s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 38]

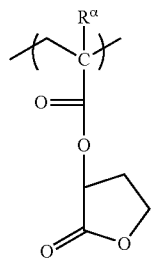 (a2-1-1)

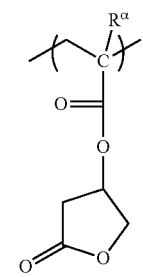 (a2-1-2)

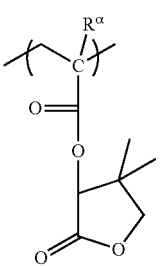 (a2-1-3)

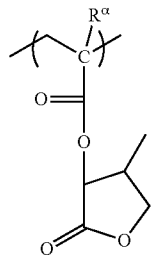 (a2-1-4)

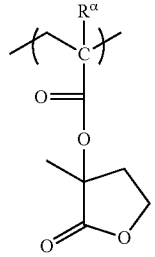 (a2-1-5)

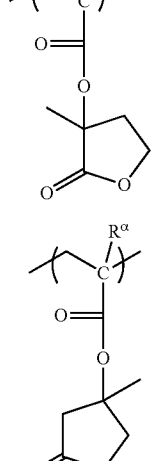 (a2-1-6)

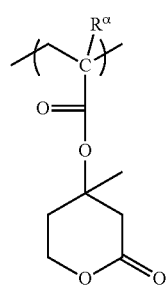 (a2-1-7)
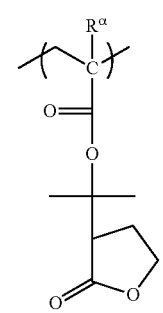 (a2-1-8)
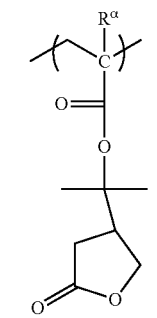 (a2-1-9)
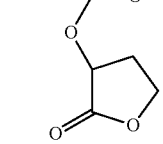 (a2-1-10)
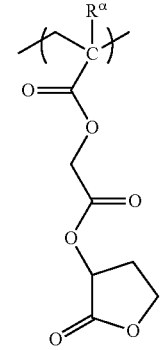 (a2-1-11)
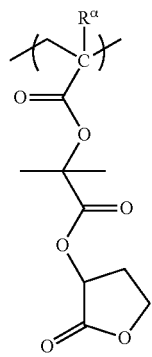 (a2-1-12)
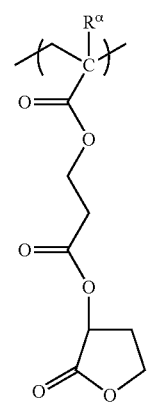 (a2-1-13)
[Chemical Formula 39]
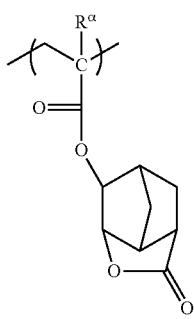 (a2-2-1)
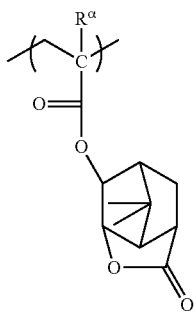 (a2-2-2)

(a2-2-3)
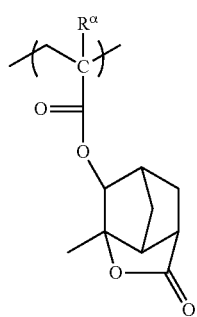
(a2-2-4)
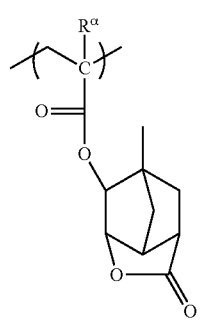
(a2-2-5)
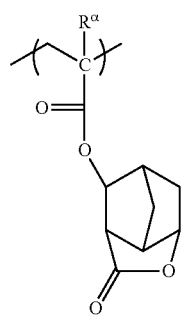
(a2-2-6)
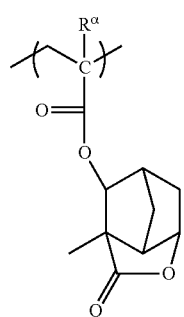
(a2-2-7)
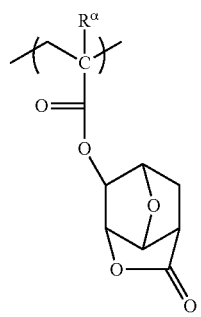
(a2-2-8)
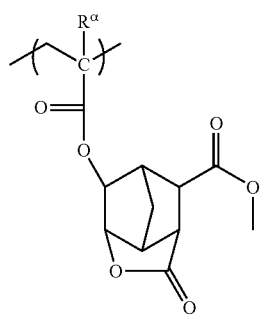
(a2-2-9)
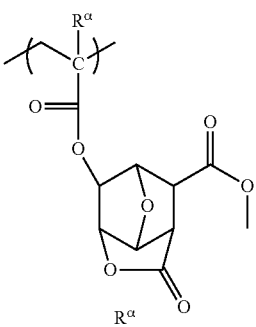
(a2-2-10)
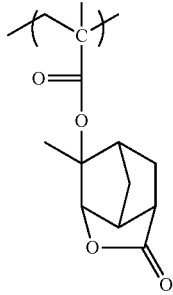
(a2-2-11)
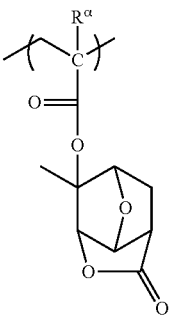
(a2-2-12)
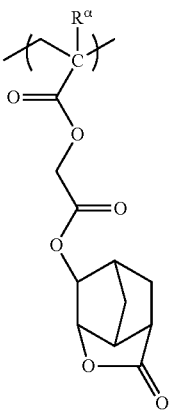

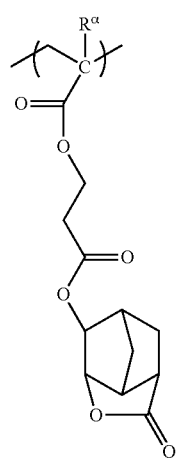
(a2-2-13)
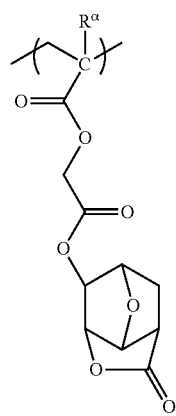
(a2-2-14)
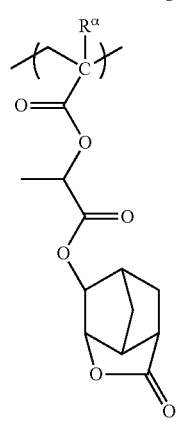
(a2-2-15)
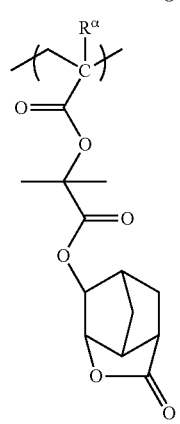
(a2-2-16)
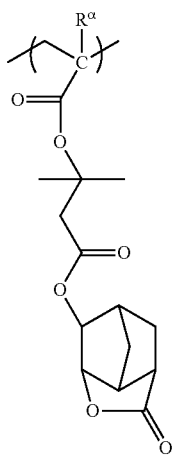
(a2-2-17)
[Chemical Formula 40]
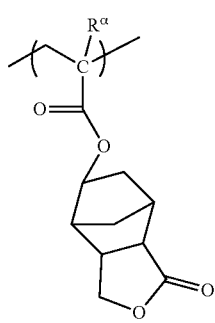
(a2-3-1)
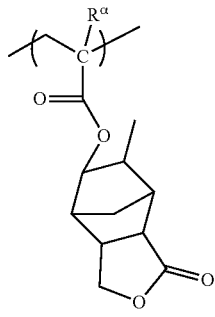
(a2-3-2)
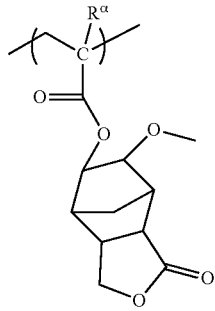
(a2-3-3)

(a2-3-4)
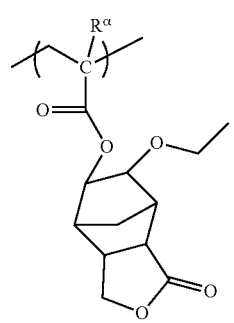
(a2-3-5)
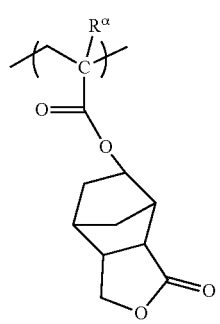
[Chemical Formula 41]
(a2-4-1)
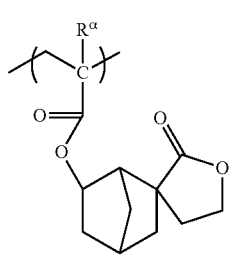
(a2-4-2)
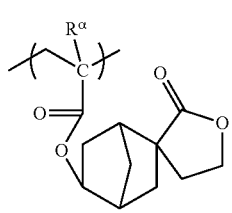
(a2-4-3)
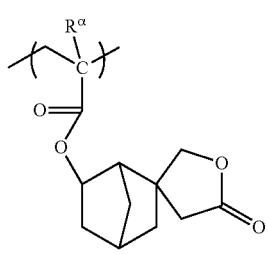
(a2-4-4)
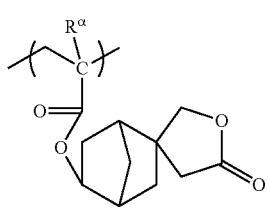
(a2-4-5)
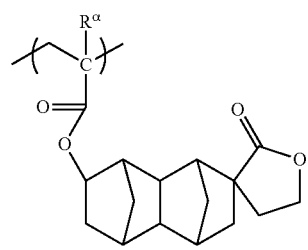
(a2-4-6)
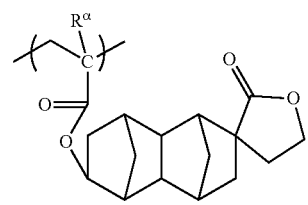
(a2-4-7)
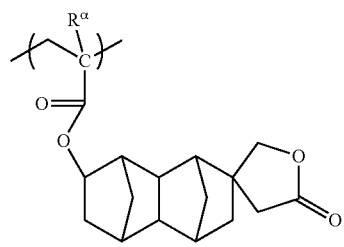
(a2-4-8)
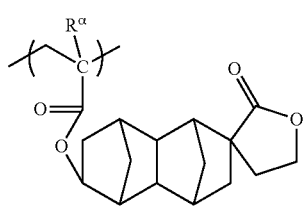
(a2-4-9)
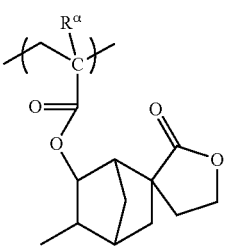
(a2-4-10)
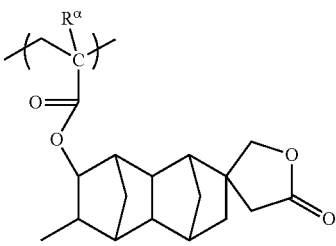

(a2-4-11)
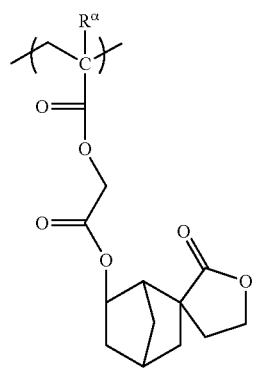
(a2-4-12)
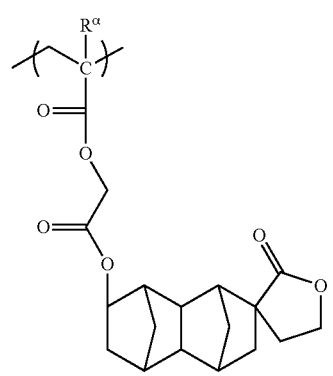
[Chemical Formula 42]
(a2-5-1)
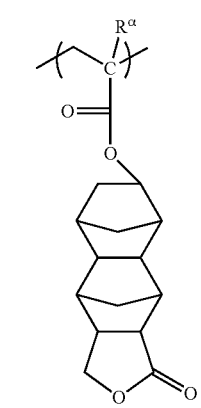
(a2-5-2)
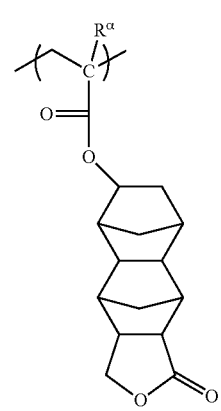
(a2-5-3)
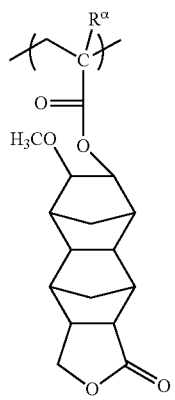
(a2-5-4)
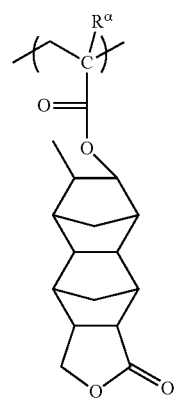
(a2-5-5)
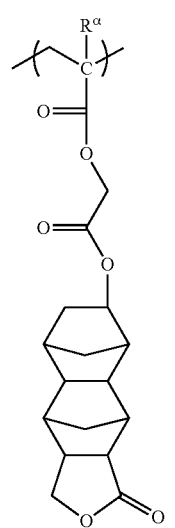

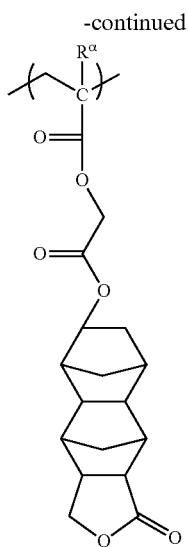

(a2-5-6)

As the structural unit (a2$^L$), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-2).

Specifically, it is preferable to use at least one structural unit selected from the group consisting of formulas (a2-1-1), (a2-1-2), (a2-2-1), (a2-2-7), (a2-2-12), (a2-2-14), (a2-3-1) and (a2-3-5).

In the component (A1), as the structural unit (a2), one type of structural unit may be used, or two or more types may be used in combination. For example, as the structural unit (a2), a structural unit (a2$^S$) may be used alone, or a structural unit (a2$^L$), or a combination of these structural units may be used. Further, as the structural unit (a2$^S$) or the structural unit (a2$^L$), either a single type of structural unit may be used, or two or more types may be used in combination.

In the present invention, it is particularly desirable that the structural unit (a2) includes at least the structural unit (a2$^S$), as the effects of the present invention are improved.

In the component (A1), the amount of the structural unit (a2) based on the combined total of all structural units constituting the component (A1) is preferably 1 to 80 mol %, more preferably 10 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as MEEF, CDU and pattern shape can be improved.

(Structural Unit (a3))

The structural unit (a3) is a structural unit derived from an acrylate ester containing a polar group-containing aliphatic hydrocarbon group. When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxy group, a cyano group, a carboxy group and a fluorinated alcohol group (a hydroxyalkyl group in which part of the hydrogen atoms bonded to carbon atoms have been substituted with fluorine atoms). Among these, a hydroxy group or a carboxy group is preferable, and a hydroxy group is particularly desirable.

In the structural unit (a3), the number of polar groups bonded to the aliphatic hydrocarbon group is not particularly limited, although 1 to 3 groups is preferable, and 1 group is particularly desirable.

The aliphatic hydrocarbon group to which the polar group is bonded may be either saturated or unsaturated, preferably saturated.

As specific examples of the aliphatic hydrocarbon group, a linear or branched aliphatic hydrocarbon group, and an aliphatic hydrocarbon group containing a ring in the structure thereof can be given.

The "linear or branched aliphatic hydrocarbon group" preferably has 1 to 12 carbon atoms, more preferably 1 to 10, still more preferably 1 to 8, and still more preferably 1 to 6.

The linear or branched aliphatic hydrocarbon group may have part or all of the hydrogen atoms substituted with a substituent other than a polar group. Examples of the substituent include a fluorine atom, a fluorinated alkyl group of 1 to 5 carbon atoms, and an oxygen atom (=O). Further, the linear or branched aliphatic hydrocarbon group may have a divalent group containing a hetero atom present between the carbon atoms. Examples of the "divalent group containing a hetero atom" include the same groups as those described for the "divalent linking group containing a hetero atom" as the divalent linking group represented by Y$^2$ explained above in relation to the structural unit (a1).

When the aliphatic hydrocarbon group is linear or branched, as the structural unit (a3), a structural unit represented by general formula (a3-1) or (a3-2) shown below is preferable.

[Chemical Formula 43]

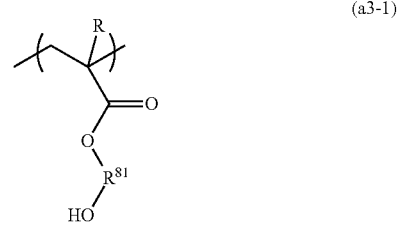

(a3-1)

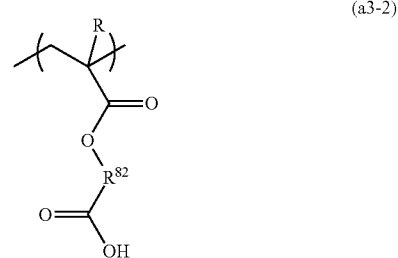

(a3-2)

In the formulas, R is the same as defined above; R$^{81}$ represents a linear or branched alkylene group; and R$^{82}$ represents an alkylene group which may have a divalent group containing a hetero atom present therein.

In general formula (a3-1), the alkylene group for $R^{81}$ preferably has 1 to 12 carbon atoms, and more preferably 1 to 10.

In general formula (a3-2), the alkylene group for $R^{82}$ preferably has 1 to 12 carbon atoms, more preferably 1 to 10, and most preferably 1 to 6.

When the alkylene group has 2 or more carbon atoms, the alkylene group may have a divalent group containing a hetero atom present between the carbon atoms. Examples of the "divalent group containing a hetero atom" include the same groups as those described for the "divalent linking group containing a hetero atom" as the divalent linking group represented by $Y^2$ explained above in relation to the structural unit (a1).

As $R^{82}$, an alkylene group having no divalent group containing a hetero atom, or an alkylene group having a divalent linking group containing an oxygen atom as a hetero atom present therein is particularly desirable.

As the alkylene group having a divalent group containing an oxygen atom present therein, a group represented by the formula -A-O—B— or -A-O—C(=O)—B— is preferable. In the formulas, each of A and B independently represents a divalent hydrocarbon group which may have a substituent, and the same groups as those described for A and B in the formulas -A-O—B— and -A-O—C(=O)—B— explained above in relation to the structural unit (a1) can be mentioned.

Among these, a group represented by the formula -A-O—C(=O)—B— is preferable, and a group represented by the formula —$(CH_2)_f$—O—C(=O)—$(CH_2)_g$— (in the formula, each of f and g independently represents an integer of 1 to 3) is more preferable.

As examples of the "hydrocarbon group containing a ring in the structure thereof", a cyclic aliphatic hydrocarbon group, and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 30 carbon atoms. Further, the cyclic aliphatic hydrocarbon group may be either a polycyclic group or a monocyclic group, and is preferably a polycyclic group.

Specifically, the cyclic aliphatic hydrocarbon group can be selected appropriately from the multitude of groups that have been proposed for the resins of resist compositions designed for use with ArF excimer lasers. As the monocyclic aliphatic hydrocarbon group, a group in which two hydrogen atoms have been removed from a monocycloalkane of 3 to 20 carbon atoms is preferable. Examples of the monocycloalkane include cyclopentane and cyclohexane. As the polycyclic aliphatic hydrocarbon group, a group in which two hydrogen atoms have been removed from a polycycloalkane of 7 to 30 carbon atoms is preferable. Examples of the polycycloalkane include adamantane, norbornane, isobornane, tricyclodecane and tetracyclododecane.

The cyclic aliphatic hydrocarbon group may have part or all of the hydrogen atoms substituted with a substituent other than a polar group. Examples of the substituent include an alkyl group of 1 to 5 carbon atoms, a fluorine atom, a fluorinated alkyl group of 1 to 5 carbon atoms, and an oxygen atom (=O).

When the aliphatic hydrocarbon group contains a ring in the structure thereof, as the structural unit (a3), a structural unit represented by general formula (a3-3), (a3-4) or (a3-5) shown below is preferable.

[Chemical Formula 44]

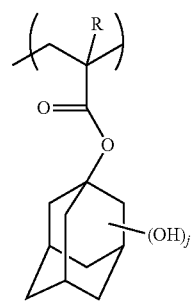
(a3-3)

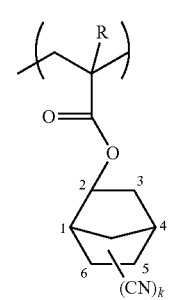
(a3-4)

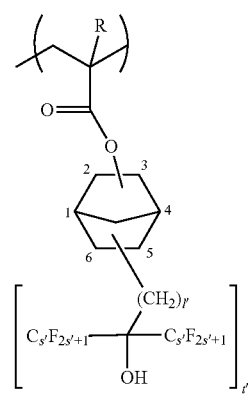
(a3-5)

In the formulas, R is the same as defined above; j represents an integer of 1 to 3; k' represents an integer of 1 to 3; t' represents an integer of 1 to 3; l' represents an integer of 1 to 5; and s' represents an integer of 1 to 3.

In general formula (a3-3), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

In general formula (a3-4), k' is preferably 1. The cyano group is preferably bonded to the 5th or 6th position of the norbornyl group.

In general formula (a3-5), f is preferably 1. l' is preferably 1. s' is preferably 1.

In general formula (a3-5), the oxygen atom (—O—) within the carbonyloxy group is preferably bonded to the 2nd or 3rd position of the norbornane ring. The fluorinated alkylalcohol group is preferably bonded to the 5th or 6th position of the norbornyl group.

As the structural unit (a3), one type of structural unit may be used, or two or more types may be used in combination.

As the structural unit (a3), a structural unit represented by any one of the aforementioned general formulas (a3-1) to (a3-5) is preferable, and a structural unit represented by the aforementioned formula (a3-2) is particularly desirable.

In the component (A1), the amount of the structural unit (a3) based on the combined total of all structural units constituting the component (A1) is preferably 1 to 50 mol %, more preferably 5 to 40 mol %, and still more preferably 5 to 25 mol %.

(Structural Unit (a4))

The structural unit (a4) is a structural unit derived from an acrylate ester containing an acid non-dissociable, aliphatic cyclic group. When the component (A1) includes the structural unit (a4), the shape of the resist pattern is excellent.

An "acid non-dissociable, aliphatic cyclic group" refers to an aliphatic cyclic group which is not dissociated by the action of the acid generated from the component (B) upon exposure, and remains in the structural unit.

The aliphatic cyclic group is not particularly limited as long as it is acid non-dissociable, and any of the multitude of conventional polycyclic groups used within the resin component of resist compositions for ArF excimer lasers or KrF excimer lasers (and particularly for ArF excimer lasers) can be used. The aliphatic cyclic group may be either saturated or unsaturated, preferably saturated. Specific examples include groups in which one hydrogen atom has been removed from the cycloalkanes (such as monocycloalkanes and polycycloalkanes) described above in the explanation of the aliphatic cyclic group for the structural unit (a1).

The aliphatic cyclic group may be either a monocyclic group or a polycyclic group. In terms of the aforementioned effects, a polycyclic group is preferable. In particular, a bi-, tri- or tetracyclic group is preferable. In consideration of industrial availability and the like, at least one polycyclic group selected from amongst a tricyclodecyl group, an adamantyl group, a tetracyclododecyl group, an isobornyl group and a norbornyl group is particularly desirable.

Specific examples of the acid non-dissociable aliphatic cyclic group include monovalent aliphatic cyclic groups in which the carbon atom having an atom adjacent to the aliphatic cyclic group (e.g., —O— within —C(=O)—O—) bonded thereto has no substituent (a group or an atom other than hydrogen). More specific examples include groups represented by general formulas (1-1) to (1-9) explained above in relation to the structural unit (a1) in which the $R^{14}$ group has been substituted with a hydrogen atom; and a cycloalkane having a tertiary carbon atom constituting the ring skeleton and having one hydrogen atom removed from.

The aliphatic cyclic group may have a substituent. Examples of the substituent include an alkyl group of 1 to 5 carbon atoms, a fluorine atom and a fluorinated alkyl group.

As the structural unit (a4), a structural unit represented by general formula (a4-0) shown below is preferable, and a structural unit represented by any one of general formulas (a4-1) to (a4-5) shown below is particularly desirable.

[Chemical Formula 45]

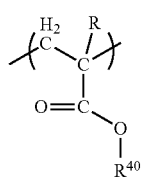
(a4-0)

In the formula, R is the same as defined above; and $R^{40}$ represents an acid non-dissociable, aliphatic polycyclic group.

[Chemical Formula 46]

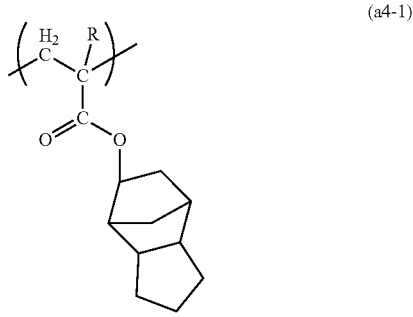
(a4-1)

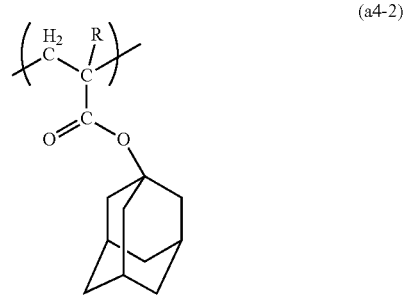
(a4-2)

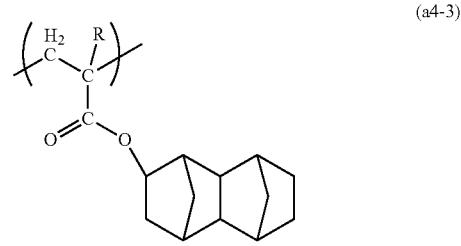
(a4-3)

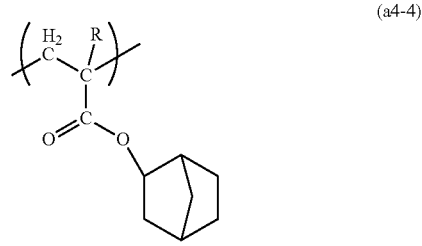
(a4-4)

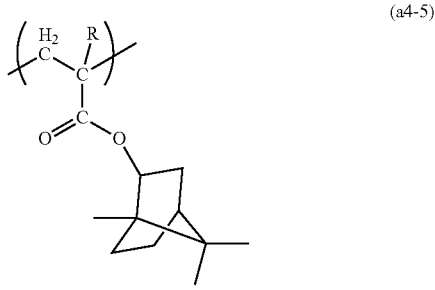
(a4-5)

In the formulas, R is the same as defined above.

As the structural unit (a4), one type of structural unit may be used, or two or more types may be used in combination.

When the structural unit (a4) is included in the component (A1), the amount of the structural unit (a4) based on the combined total of all the structural units that constitute the component (A1) is preferably within the range from 1 to 30 mol %, and more preferably from 5 to 20 mol %.

The component (A1) may also have a structural unit other than the above-mentioned structural units (a1) to (a4), as long as the effects of the present invention are not impaired.

As such a structural unit, any other structural unit which cannot be classified as one of the above structural units (a1) to (a4) can be used without any particular limitation, and any of the multitude of conventional structural units used within resist resins for ArF excimer lasers or KrF excimer lasers (and particularly for ArF excimer lasers) can be used.

The component (A1) is preferably a copolymer containing the structural units (a0) and (a1), and more preferably a copolymer containing the structural units (a0), (a1) and (a2).

Specific examples of the component (A1) include a copolymer consisting of the structural units (a0) and (a1); a copolymer consisting of the structural units (a0), (a1) and (a2); a copolymer consisting of the structural units (a0), (a1), (a2) and (a3); a copolymer consisting of the structural units (a0), (a1), (a2) and (a4); and a copolymer consisting of the structural units (a0), (a1), (a2), (a3) and (a4).

Preferable examples of the component (A1) include a copolymer including the 2 types of structural units shown in formula (A1-21) below; a copolymer including 3 types of structural units shown in any one of formulas (A1-31) to (A1-38) below; a copolymer including 4 types of structural units shown in any one of formulas (A1-41) to (A1-48) below; and a copolymer including 5 types of structural units shown in any one of formulas (A1-51) to (A1-54) below.

[Chemical Formula 47]

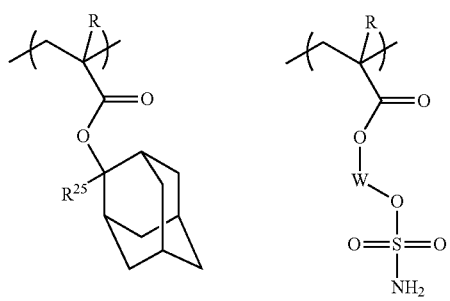

(A1-21)

In the formula, R, $R^{25}$ and W are the same as defined above, wherein the plurality of R may be the same or different from each other.

[Chemical Formula 48]

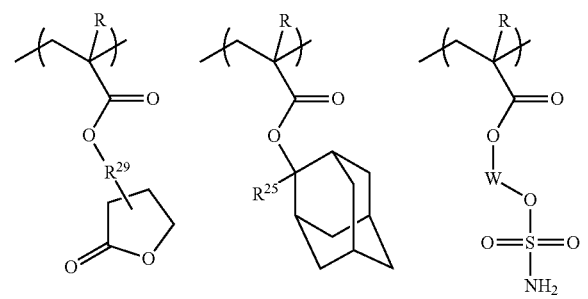

(A1-31)

In the formula, R, $R^{29}$, $R^{25}$ and W are the same as defined above, wherein the plurality of R may be the same or different from each other.

[Chemical Formula 49]

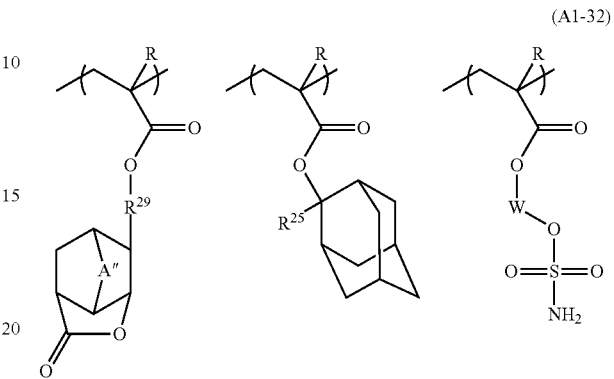

(A1-32)

In the formula, R, $R^{29}$, A", $R^{25}$ and W are the same as defined above, wherein the plurality of R may be the same or different from each other.

[Chemical Formula 50]

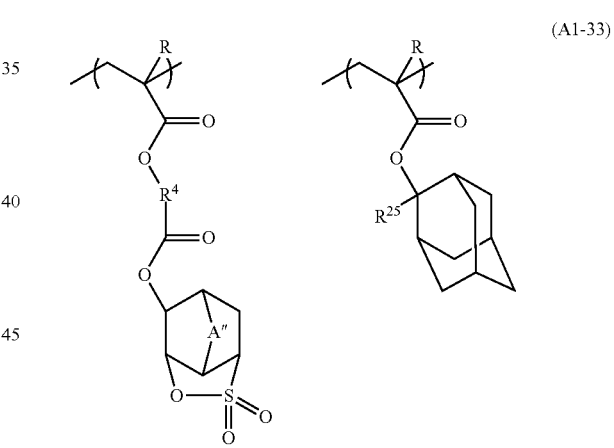

(A1-33)

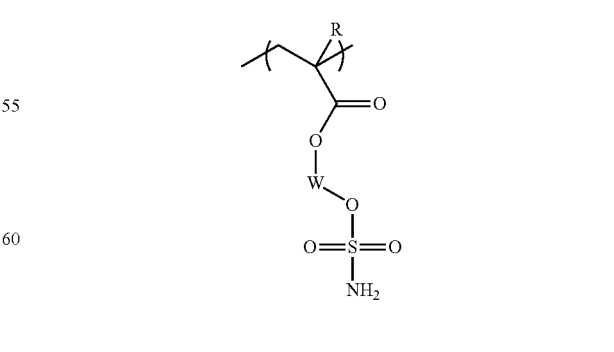

In the formula, R, $R^{4}$, A', $R^{25}$ and W are the same as defined above, wherein the plurality of R may be the same or different from each other.

[Chemical Formula 51]

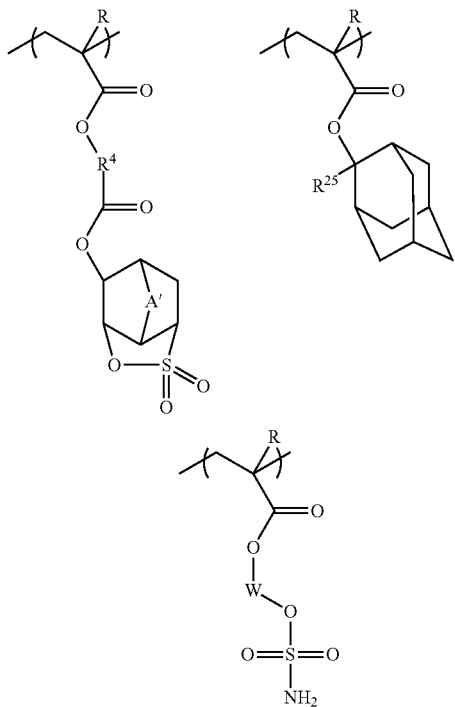

(A1-34)

In the formula, R, R⁴, A', R²⁵ and W are the same as defined above, wherein the plurality of R may be the same or different from each other.

[Chemical Formula 52]

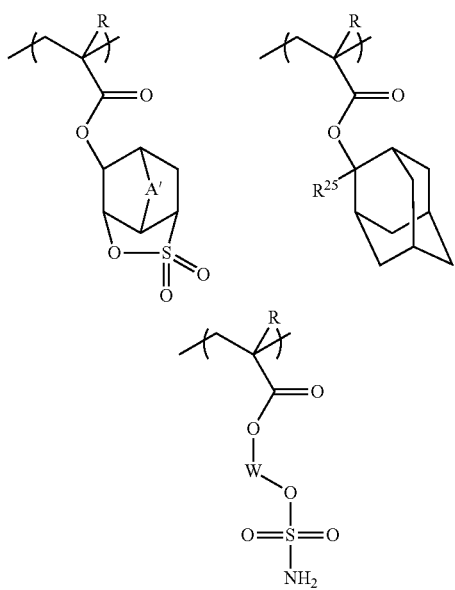

(A1-35)

In the formula, R, A', R²⁵ and W are the same as defined above, wherein the plurality of R may be the same or different from each other.

[Chemical Formula 53]

(A1-36)

In the formula, R, R⁴, A', R²³ and W are the same as defined above, wherein the plurality of R may be the same or different from each other.

[Chemical Formula 54]

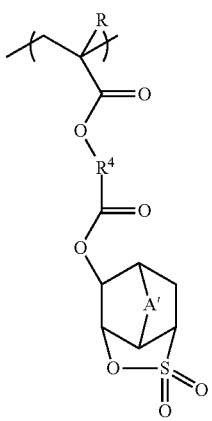

(A1-37)

-continued

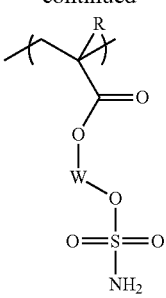

In the formula, R, $R^4$, A', $R^{21}$, h and W are the same as defined above, wherein the plurality of R may be the same or different from each other.

[Chemical Formula 55]

(A1-38)

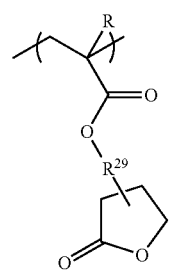 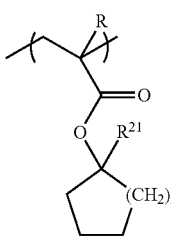 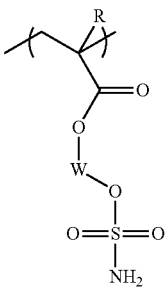

In the formula, R, $R^{29}$, $R^{21}$, h and W are the same as defined above, wherein the plurality of R may be the same or different from each other.

[Chemical Formula 56]

(A1-41)

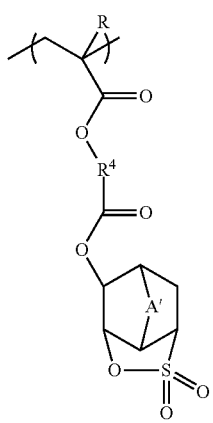

-continued

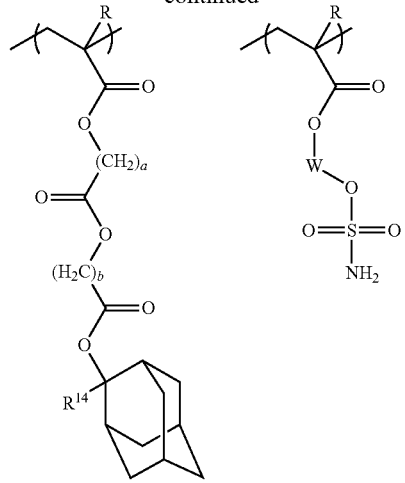

In the formula, R, $R^4$, A', $R^{23}$, a, b, $R^{14}$ and W are the same as defined above, wherein the plurality of R may be the same or different from each other.

[Chemical Formula 57]

(A1-42)

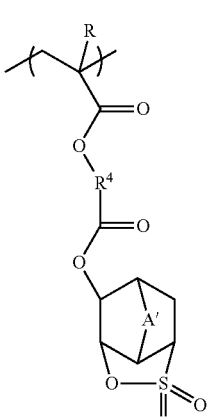 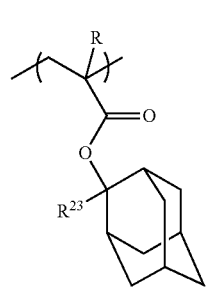

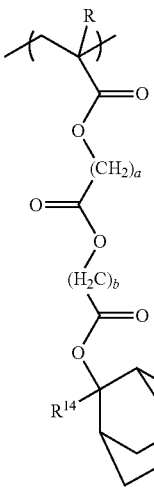

In the formula, R, $R^4$, A', $R^{25}$, a, b, $R^{14}$ and W are the same as defined above, wherein the plurality of R may be the same or different from each other.

[Chemical Formula 58]

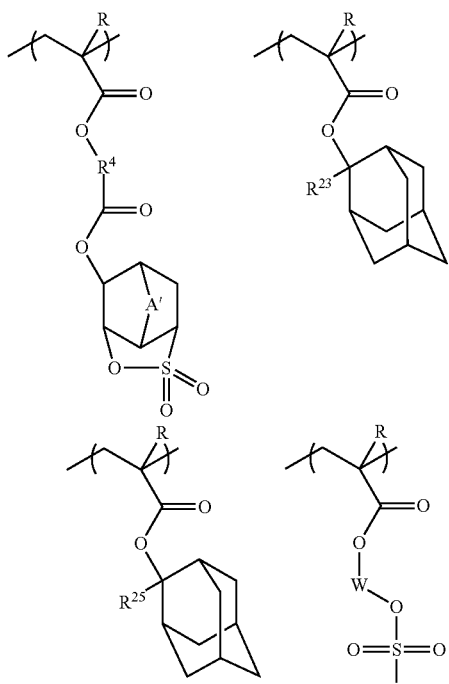

(A1-43)

In the formula, R, $R^4$, A', $R^{23}$, $R^{25}$ and W are the same as defined above, wherein the plurality of R may be the same or different from each other.

[Chemical Formula 59]

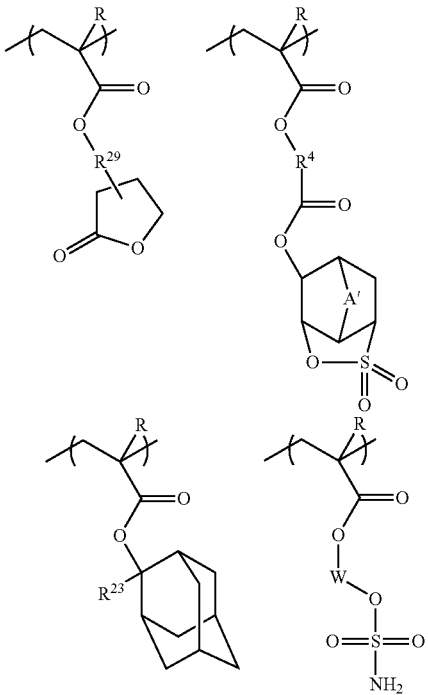

(A1-44)

In the formula, R, $R^{29}$, $R^4$, A', $R^{23}$ and W are the same as defined above, wherein the plurality of R may be the same or different from each other.

[Chemical Formula 60]

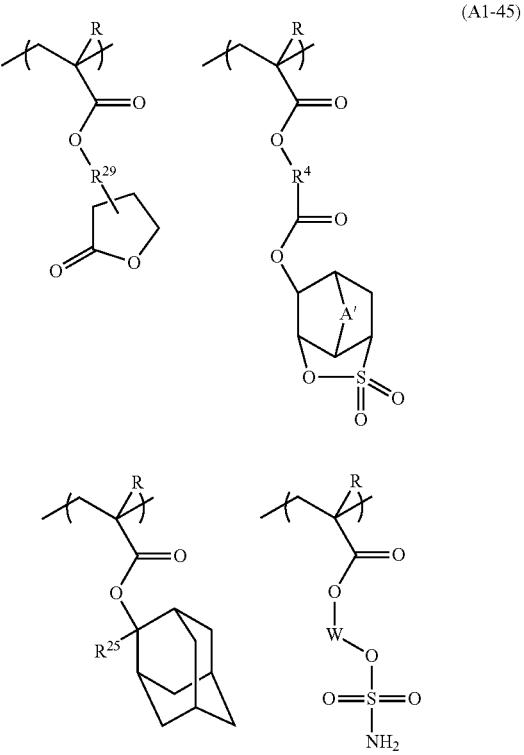

(A1-45)

In the formula, R, $R^{29}$, $R^4$, A', $R^{25}$ and W are the same as defined above, wherein the plurality of R may be the same or different from each other.

[Chemical Formula 61]

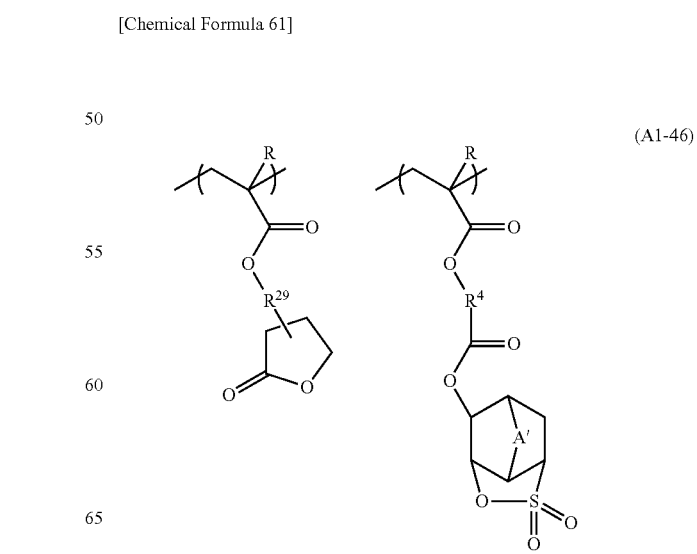

(A1-46)

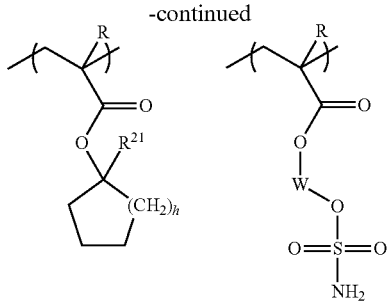

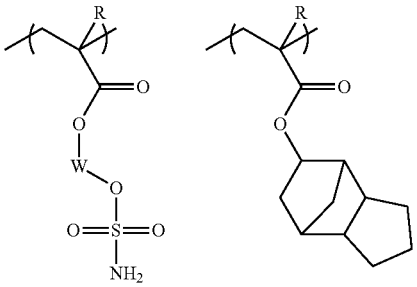

In the formula, R, $R^{29}$, $R^4$, A', $R^2$, h and W are the same as defined above, wherein the plurality of R may be the same or different from each other.

In the formula, R, $R^{29}$, $R^{25}$ and W are the same as defined above, wherein the plurality of R may be the same or different from each other.

[Chemical Formula 62]

(A1-47)

[Chemical Formula 64]

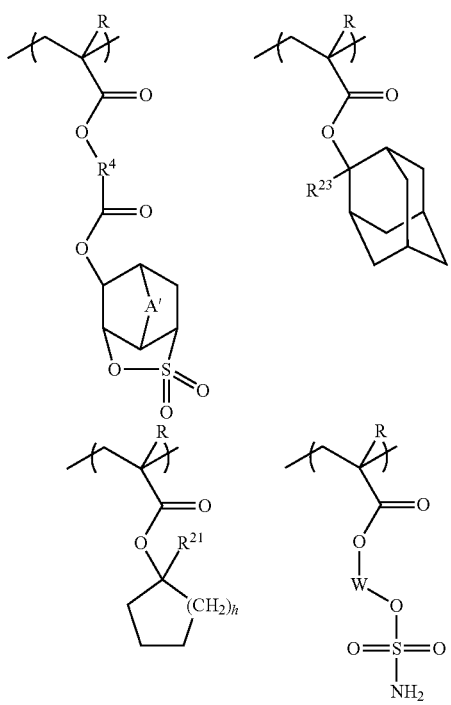

(A1-51)

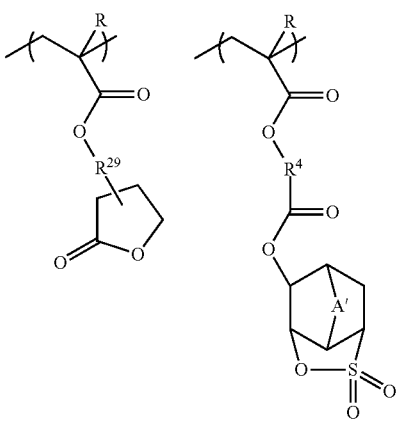

In the formula, R, $R^4$, A', $R^{23}$, $R^{21}$, h and W are the same as defined above, wherein the plurality of R may be the same or different from each other.

[Chemical Formula 63]

(A1-48)

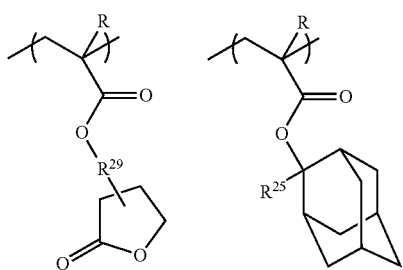

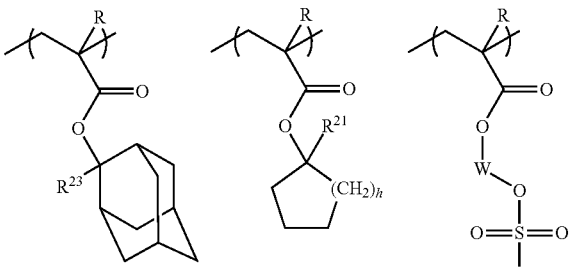

In the formula, R, $R^{29}$, $R^4$, A', $R^{23}$, $R^{21}$, h and W are the same as defined above, wherein the plurality of R may be the same or different from each other.

[Chemical Formula 65]

(A1-52)

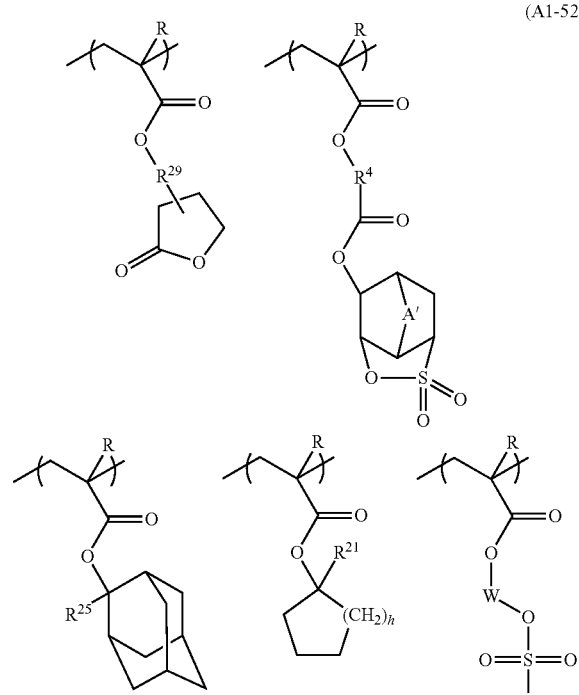

In the formula, R, $R^{29}$, $R^4$, A', $R^{25}$, $R^{21}$, h and W are the same as defined above, wherein the plurality of R may be the same or different from each other.

[Chemical Formula 66]

(A1-53)

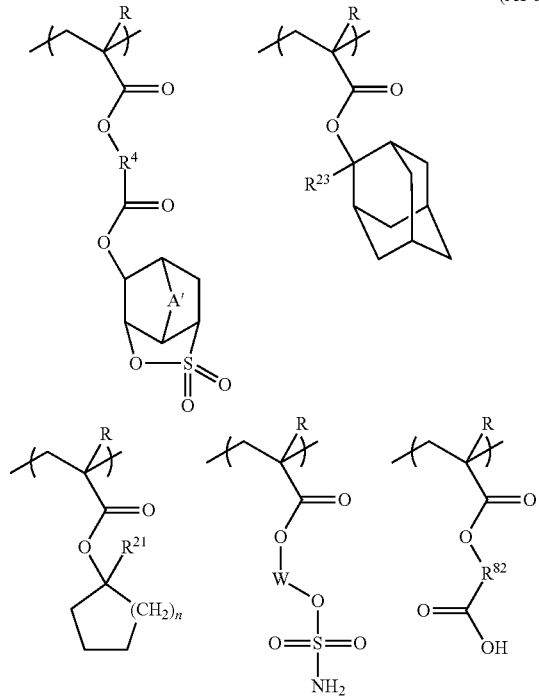

In the formula, R, $R^{29}$, $R^4$, A', $R^{23}$, $R^{21}$, h, W and $R^{82}$ are the same as defined above, wherein the plurality of R may be the same or different from each other.

[Chemical Formula 67]

(A1-54)

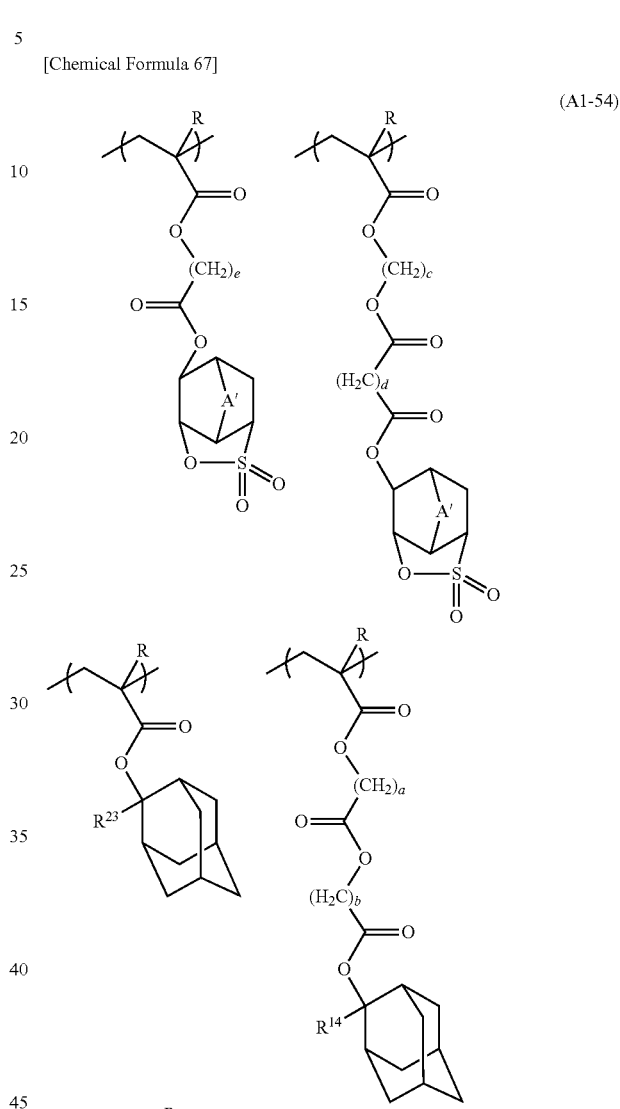

In the formula, R, e, A', c, d, $R^{23}$, a, b, $R^{14}$ and W are the same as defined above, wherein the plurality of R may be the same or different from each other.

The weight average molecular weight (Mw) (the polystyrene equivalent value determined by gel permeation chromatography (GPC)) of the component (A1) is not particularly limited, but is preferably 1,000 to 50,000, more preferably 1,500 to 30,000, and still more preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A1) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as dimethyl-2,2-azobis (2-methylpropionate) or azobisisobutyronitrile.

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing defects and LER (line edge roughness: unevenness of the side walls of a line pattern).

As the monomers which yield the corresponding structural units, commercially available monomers may be used, or the monomers may be synthesized by a conventional method.

For example, the monomer that yields the structural unit (a0) is a compound (hereafter referred to as "compound (I)") represented by general formula (1) shown below.

The production method of the compound (I) is not particularly limited. For example, a preferable method includes adding an alcohol derivative represented by general formula (I-2) shown below to a reaction system containing a compound represented by general formula (I-1) shown below, thereby obtaining the compound (I).

In a specific example of the method of producing the compound (I), 3-sulfamoyloxyadamantane-1-yl acrylate can be produced by reacting 3-hydroxyadamantane-1-yl acrylate with $ClSO_2NH_2$.

[Chemical Formula 68]

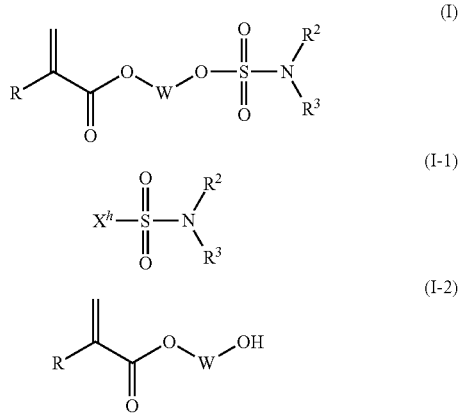

In the formulas, R, $R^2$, $R^3$ and W are respectively the same as defined for R, $R^2$, $R^3$ and W in the aforementioned general formula (a0-1); and $X^h$ represents a fluorine atom, a chlorine atom, a bromine atom or an iodine atom.

Further, an example of the monomer that yields a structural unit represented by the aforementioned general formula (a2-0-1) includes a compound represented by general formula (II) shown below (hereafter, referred to as "compound (II)").

The method for producing the compound (II) is not particularly limited, and the compound (II) can be produced by a conventional method. For example, in the presence of a base, a compound (II-2) represented by general formula (II-2) shown below is added to a solution obtained by dissolving a compound (II-1) represented by general formula (II-1) shown below in a reaction solvent, and a reaction is effected to thereby obtain a compound (II).

Examples of the base include inorganic bases such as sodium hydride, $K_2CO_3$ and $Cs_2CO_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

In the reaction, an acid may be used if desired. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

A compound in which $R^5$ represents a lactone-containing cyclic group can be produced by the same method.

[Chemical Formula 69]

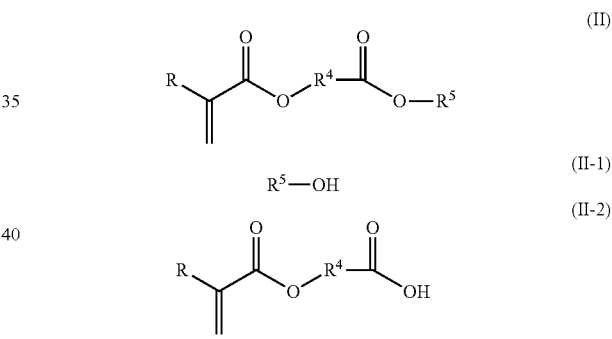

In the formulas, R, $R^4$ and $R^5$ are respectively the same as defined for R, $R^4$ and $R^5$ in the aforementioned general formula (a2-0-1).

The structure of the compound obtained in the mariner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

In the component (A), as the component (A1), one type may be used, or two or more types of compounds may be used in combination.

In the component (A), the amount of the component (A1) based on the total weight of the component (A) is preferably 50% by weight or more, more preferably 80% by weight or more, and may even be 100% by weight.

In the positive resist composition of the present invention, the component (A) may contain "a base component which exhibits increased solubility in an alkali developing solution under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a5) can be used. Further, the component (A2) may contain a non-polymer (low molecular weight compound) having a molecular weight of 500 to less than 4,000.

As the component (A2), one type of resin may be used, or two or more types of resins may be used in combination.

In the positive resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 70]

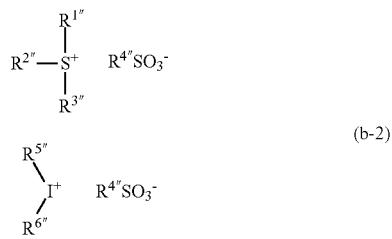

In the formulas above, $R^{1''}$ to $R^{3''}$, $R^{5''}$ and $R^{6''}$ each independently represent an aryl group or alkyl group which may have a substituent, wherein two of $R^{1''}$ to $R^{3''}$ may be bonded to each other to form a ring with the sulfur atom; and $R^{4''}$ represents an alkyl group, a halogenated alkyl group, an aryl group or an alkenyl group which may have a substituent, with the provision that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group which may have a substituent or an alkyl group which may have a substituent. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group of $R^{1''}$ to $R^{3''}$ is not particularly limited, and includes, for example, an aryl group of 6 to 20 carbon atoms. The aryl group is preferably an aryl group having 6 to 10 carbon atoms because it can be synthesized at a low cost. Specific examples thereof include a phenyl group and a naphthyl group.

The aryl group may have a substituent. The expression "has a substituent" means that part or all of the hydrogen atoms within the aryl group has been substituted with a substituent. Examples of the substituent include an alkyl group, an alkoxy group, a halogen atom, a hydroxyl group, an alkoxyalkyloxy group, —O—$R^{50}$—C(=O)—(O)$_n$—$R^{51}$ (in the formula, $R^{50}$ represents an alkylene group or a single bond, $R^{51}$ represents an acid dissociable group or an acid non-dissociable group, and n represents 0 or 1.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group which substitutes the hydrogen atoms within the aryl group include-O—C($R^{47}$)($R^{48}$)—O—$R^{49}$ (in the formula, each of $R^{47}$ and $R^{48}$ independently represents a hydrogen atom or a linear or branched alkyl group, and $R^{49}$ represents an alkyl group, wherein $R^{48}$ and $R^{49}$ may be mutually bonded to form a ring structure, provided that at least one of $R^{47}$ and $R^{48}$ represents a hydrogen atom.

The alkyl group for $R^{47}$ and $R^{48}$ preferably has 1 to 5 carbon atoms. As the alkyl group, an ethyl group or a methyl group is preferable, and a methyl group is most preferable.

Further, it is preferable that at least one of $R^{47}$ and $R^{48}$ represent a hydrogen atom, and the other represent a hydrogen atom or a methyl group. It is particularly desirable that both of $R^{47}$ and $R^{48}$ represent a hydrogen atom.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyolododecane. Among these, a group in which one or more hydrogen atoms have been removed from adamantane is preferable.

$R^{48}$ and $R^{49}$ may be mutually bonded to form a ring structure. In such a case, a cyclic group is formed by $R^{48}$, $R^{49}$, the oxygen atom having $R^{49}$ bonded thereto, and the carbon atom having the oxygen atom and $R^{48}$ bonded thereto. Such a cyclic group is preferably a 4- to 7-membered ring, and more preferably a 4- to 6-membered ring.

In the —O—$R^{50}$—C(=O)—(O)$_n$—$R^{51}$ group which may substitute the hydrogen atoms within the aryl group, the alkylene group for $R^{50}$ is preferably a linear or branched alkylene group of 1 to 5 carbon atoms. Examples of the alkylene group include a methylene group, an ethylene group, a trimethylene group, a tetramethylene group and a 1,1-dimethylethylene group.

The acid dissociable group for $R^{51}$ is not particularly limited as long as it is an organic group that is dissociable by the action of an acid (generated from the component (B) upon exposure), and examples thereof include the same acid dissociable, dissolution inhibiting groups as those described above in the explanation of the component (A). Among these, a tertiary alkyl ester-type acid dissociable group is preferable.

Preferable examples of the acid non-dissociable group for $R^{51}$ include a decyl group, a tricyclodecyl group, an adamantyl group, a 1-(1-adamantyl)methyl group, a tetracyclododecyl group, an isobornyl group and a norbornyl group.

The alkyl group for $R^{1\prime\prime\prime}$ to $R^{3\prime\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkyl group may have a substituent. The expression "has a substituent" means that part or all of the hydrogen atoms within the alkyl group has been substituted with a substituent. Examples of the substituent include the same groups as those described above for the substituent of the aforementioned aryl group.

In formula (b-1), two of $R^{1\prime\prime\prime}$ to $R^{3\prime\prime\prime}$ may be mutually bonded to form a ring with the sulfur atom. The ring may be saturated or unsaturated. Further, the ring may be monocyclic or polycyclic. For example, when either one or both of the two of $R^{1\prime\prime\prime}$ to $R^{3\prime\prime\prime}$ represent a cyclic group (a cyclic alkyl group or an aryl group), a polycyclic ring (condensed ring) is formed when the two groups are bonded.

When two of $R^{1\prime\prime\prime}$ to $R^{3\prime\prime\prime}$ are mutually bonded to form a ring, the ring containing the sulfur atom in the skeleton thereof is preferably a 3 to 10-membered ring, and most preferably a 5 to 7-membered ring.

Specific examples of the ring formed by two of $R^{1\prime\prime\prime}$ to $R^{3\prime\prime\prime}$ mutually bonded include benzothiophene, dibenzothiophene, 9H-thioxanthene, thioxanthene, thianthrene, phenoxathiine, tetrahydrothiophenium and tetrahydrothiopyranium.

When two of $R^{1\prime\prime\prime}$ to $R^{3\prime\prime\prime}$ are bonded to each other to form a ring with the sulfur atom, the remaining one of $R^{1\prime\prime\prime}$ to $R^{3\prime\prime\prime}$ is preferably an aryl group.

In the compound represented by formula (b-1), preferable examples of the cation moiety in which all of $R^{1\prime\prime\prime}$ to $R^{3\prime\prime\prime}$ represents a phenyl group which may have a substituent, i.e., the cation moiety having a triphenylsulfonium skeleton, include cation moieties represented by formulas (1-1-1) to (1-1-14) shown below.

[Chemical Formula 71]

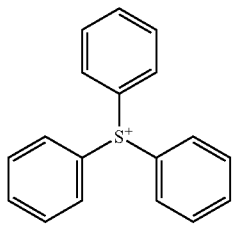
(I-1-1)

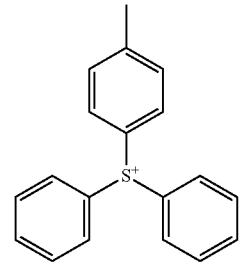
(I-1-2)

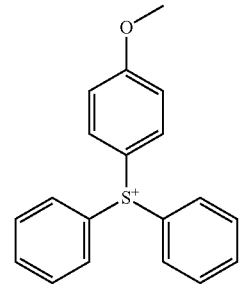
(I-1-3)

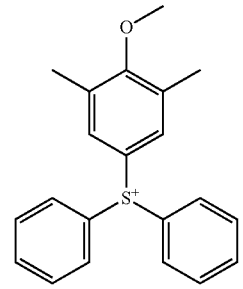
(I-1-4)

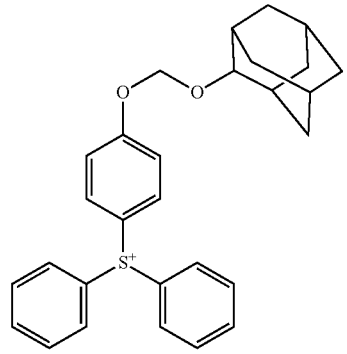
(I-1-5)

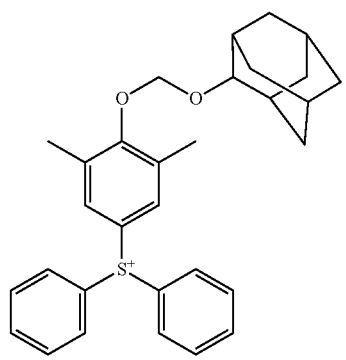 (I-1-6)
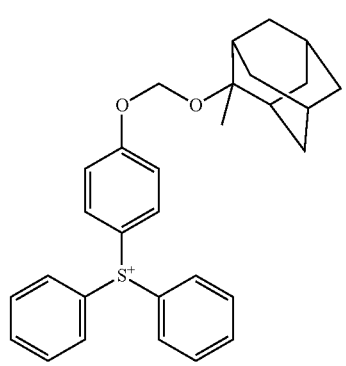 (I-1-7)
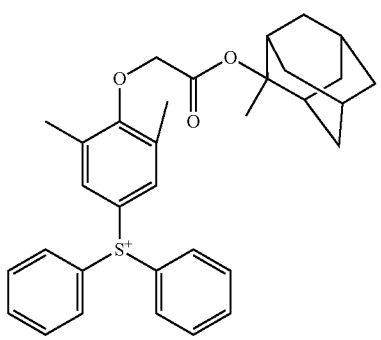 (I-1-8)
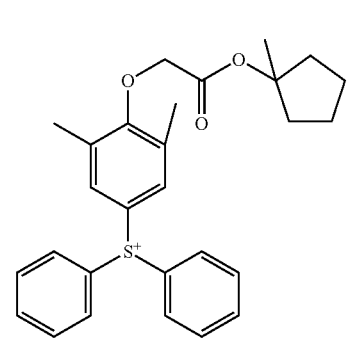 (I-1-9)
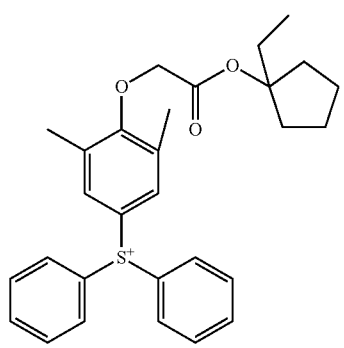 (I-1-10)
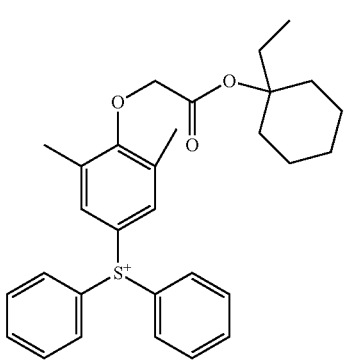 (I-1-11)
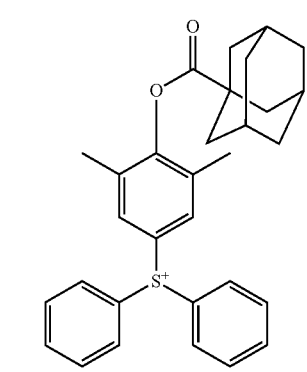 (I-1-12)
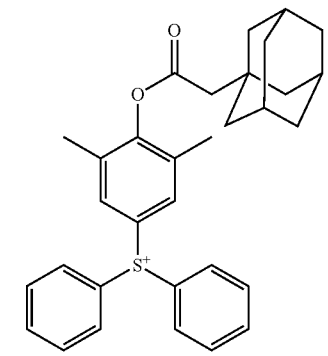 (I-1-13)

-continued (I-1-14)

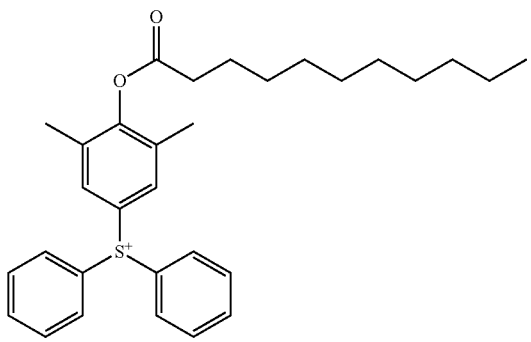

Further, a cation moiety in which part or all of the phenyl groups have been replaced with a naphthyl group which may have a substituent can also be given as a preferable example. It is preferable that 1 or 2 of the 3 phenyl groups are replaced with a naphthyl group.

Furthermore, in the compound represented by formula (b-1), preferable examples of the cation moiety in which two of $R^{1\prime\prime\prime}$ to $R^{3\prime\prime\prime}$ are mutually bonded to form a ring with the sulfur atom include cation moieties represented by formulas (I-11-10) to (I-11-13) shown below.

[Chemical Formula 72]

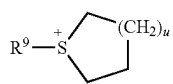
(I-11-10)

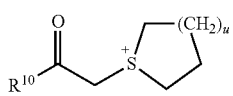
(I-11-11)

In the formulas, $R^9$ represents a phenyl group which may have a substituent, a naphthyl group which may have a substituent, or an alkyl group of 1 to 5 carbon atoms; $R^{10}$ represents a phenyl group which may have a substituent, a naphthyl group which may have a substituent, an alkyl group of 1 to 5 carbon atoms, an alkoxy group of 1 to 5 carbon atoms, or a hydroxy group; and u represents an integer of 1 to 3.

[Chemical Formula 73]

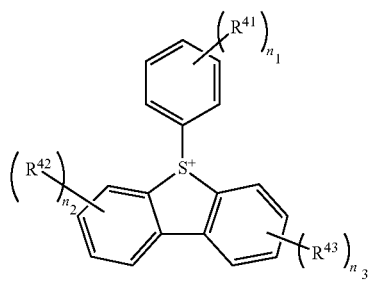
(I-11-12)

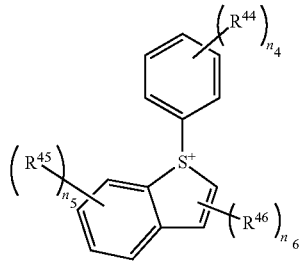
(I-11-13)

In the formulas, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

In formulas (I-11-10) and (I-11-11), examples of the substituent for the phenyl group or the naphthyl group represented by $R^9$ and $R^{10}$ include the same substituents as those described above for the aryl group represented by $R^{1\prime\prime\prime}$ to $R^{3\prime\prime\prime}$. Further, examples of the substituent for the alkyl group represented by $R^9$ and $R^{10}$ include the same substituents as those described above for the alkyl group represented by $R^{1\prime\prime\prime}$ to $R^{3\prime\prime\prime}$.

u is an integer of 1 to 3, and most preferably 1 or 2.

In general formulas (I-11-12) and (I-11-13), with respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

In formulas (b-1) and (b-2), $R^{4\prime\prime\prime}$ represents an alkyl group, a halogenated alkyl group, an aryl group or an alkenyl group which may have a substituent.

The alkyl group for $R^{4\prime\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4\prime\prime\prime}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula X-$Q^1$- (in the formula, $Q^1$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula X-$Q^1$-, $Q^1$ represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$— and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —CH$_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

$Q^1$ is preferably a divalent linking group containing an ester linkage or ether linkage, and more preferably a group of —$R^{91}$—O—, —$R^{92}$—O—C(=O)—, —C(=O)—O—, —C(=O)—O—$R^{93}$—, or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The "substituent group containing a hetero atom" (hereafter, referred to as "hetero atom-containing substituent") may consist of a hetero atom, or may be a group containing a group or atom other than a hetero atom.

Specific examples of the hetero atom-containing substituent for substituting part of the carbon atoms constituting the aliphatic hydrocarbon group include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$—, and —S(=O)$_2$—O—. When the hetero atom-containing substituent is —NH—, the substituent for substituting H (an alkyl group, an acyl group or the like) preferably has 1 to 10 carbon atoms, more preferably 1 to 8 carbon atoms, and most preferably 1 to 5 carbon atoms.

When the aliphatic hydrocarbon group is cyclic, the aliphatic hydrocarbon group may contain any of these substituent groups in the ring structure.

Examples of the hetero atom-containing substituent for substituting part or all of the hydrogen atoms constituting the aliphatic hydrocarbon group include a halogen atom, an alkoxy group, a hydroxy group, —C(=O)—R$^{80}$ [R$^{80}$ represents an alkyl group], —COOR$^{81}$ [R$^{81}$ represents a hydrogen atom or an alkyl group], a halogenated alkyl group, a halogenated alkoxy group, an amino group, an amino group, a nitro group, an oxygen atom (=O), a sulfur atom and a sulfonyl group (SO$_2$).

Examples of the halogen atom for the hetero atom-containing substituent include a fluorine atom, a chlorine atom, a bromine atom and an iodine atom, and a fluorine atom is preferable.

The alkyl group within the alkoxy group for the hetero atom-containing substituent may be linear, branched, cyclic, or a combination thereof. The number of carbon atoms thereof is preferably 1 to 30. When the alkyl group is linear or branched, the number of carbon atoms thereof is preferably 1 to 20, more preferably 1 to 17, still more preferably 1 to 15, and most preferably 1 to 10. Specific examples include the same alkyl groups as those described later as examples of linear or branched, saturated hydrocarbon group. When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be mono-cyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Specific examples of the polycycloalkane include adamantane, norbornane, isobornane, tricyclodecane and tetracyclododecane. These cycloalkyl groups may or may not have part or all of the hydrogen atoms bonded to the ring substituted with a substituent such as a fluorine atom or a fluorinated alkyl group.

In the —C(=O)—R$^{80}$ group and the —COOR$^{81}$ group for the hetero atom-containing substituent, examples of the alkyl group for R$^{80}$ and R$^{81}$ include the same alkyl groups as those described above for the alkyl group within the aforementioned alkoxy group.

Examples of the alkyl group within the halogenated alkyl group for the hetero atom-containing substituent include the same alkyl groups as those described above for the alkyl group within the aforementioned alkoxy group. As the halogenated alkyl group, a fluorinated alkyl group is particularly desirable.

Examples of the halogenated alkoxy group for the hetero atom-containing substituent include the aforementioned alkoxy groups in which part or all of the hydrogen atoms have been substituted with the aforementioned halogen atoms. As the halogenated alkoxy group, a fluorinated alkoxy group is preferable.

Examples of the hydroxyalkyl group for the hetero atom-containing substituent include the alkyl groups given as examples of the alkyl group within the aforementioned alkoxy group in which at least one hydrogen atom has been substituted with a hydroxy group. The number of hydroxy groups within the hydroxyalkyl group is preferably 1 to 3, and most preferably 1.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group. As the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 74]

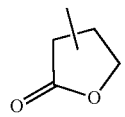
(L1)

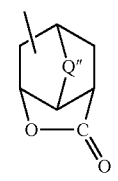
(L2)

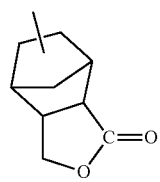
(L3)

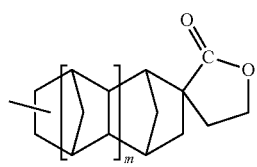
(L4)

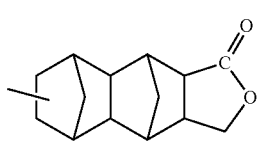
(L5)

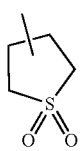
(S1)

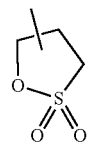
(S2)

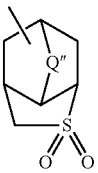
(S3)

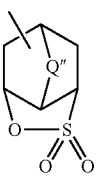
(S4)

In the formulas, Q" represents an oxygen atom, a sulfur atom or an alkylene group which may contain an oxygen atom or a sulfur atom; and m represents 0 or 1.

In the formulas, the alkylene group for Q" is preferably linear or branched, and preferably has 1 to 5 carbon atoms. Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3)_{(CH2}$ CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH (CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH (CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH (CH$_3$)CH$_2$CH$_2$—; and a pentamethylene group [—CH$_2$CH$_2$CH$_2$CH$_2$CH$_2$—]. Among these, a methylene group or an alkylmethylene group is preferable, and a methylene group, —CH(CH$_3$)— or —C(CH$_3$)$_2$— is particularly desirable.

The alkylene group may contain an oxygen atom (—O—) or a sulfur atom (—S—). As an example of such a group, the aforementioned alkylene group having —O— or —S— on the terminal or interposed between the carbon atoms can be mentioned. Specific examples thereof include —O—R$^{94}$—, —S—R$^{95}$—, —R$^{96}$—O—R$^{97}$— and —R$^{98}$—S—R$^{99}$—. Herein, each of R$^{94}$ to R$^{99}$ independently represents an alkylene group. Examples of the alkylene group include the same alkylene groups as those described above for Q". Among these, —O—CH$_2$—, —CH$_2$—O—CH$_2$—, —S—CH$_2$— and —CH$_2$—S—CH$_2$— are preferable.

These aliphatic cyclic groups may have part or all of the hydrogen atoms substituted with a substituent. Examples of the substituent include an alkyl group, a halogen atom, an alkoxy group, a hydroxy group, —C(=O)—R$^{80}$ [R$^{80}$ represents an alkyl group], —COOR$^{81}$ [R$^{81}$ represents a hydrogen atom or an alkyl group], a halogenated alkyl group, a halogenated alkoxy group, an amino group, an amido group, a nitro group, an oxygen atom (=O), a sulfur atom and a sulfonyl group (SO$_2$).

Examples of the alkyl group for the substituent include the same alkyl groups as those described above for the alkyl group within the alkoxy group for the aforementioned hetero atom-containing substituent.

As the alkyl group, an alkyl group of 1 to 6 carbon atoms is particularly desirable. The alkyl group is preferably linear or branched, and specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the halogen atom, the alkoxy group, the —C(=O)—$R^{80}$ group, the —COOR$^{81}$ group, the halogenated alkyl group and the halogenated alkoxy group for the substituent, the same groups as those described above as examples of the hetero atom-containing substituent for substituting part or all of the hydrogen atoms constituting the aforementioned aliphatic hydrocarbon group can be mentioned.

Among these examples, as the substituent for substituting the hydrogen atom of the aforementioned aliphatic cyclic group, an alkyl group, an oxygen atom (=O) or a hydroxy group is preferable.

The aliphatic cyclic group may have 1 substituent, or 2 or more substituents. When the aliphatic cyclic group has a plurality of substituents, the substituents may be the same or different from each other.

As X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

In the present invention, $R^{4\prime\prime\prime}$ preferably has X-Q$^1$- as a substituent. In such a case, $R^{4\prime\prime\prime}$ is preferably a group represented by the formula X-Q$^1$-Y$^1$— (in the formula, Q$^1$ and X are the same as defined above; and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5\prime\prime\prime}$ and $R^{6\prime\prime\prime}$ each independently represent an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be used.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be used.

It is particularly desirable that both of $R^{5\prime\prime\prime}$ and $R^{6\prime\prime\prime}$ represents a phenyl group.

As $R^{4\prime\prime\prime}$ in formula (b-2), the same groups as those mentioned above for $R^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-triethoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate;

1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate which may have a substituent, such as methanesulfonate, n-propanesulfonate, n-butanesulfonate, n-octanesulfonate, 1-adamantanesulfonate, 2-norbornanesulfonate or d-camphor-10-sulfonate; or replaced by an aromatic sulfonate, such as benzenesulfonate, perfluorobenzenesulfonate or p-toluenesulfonate.

Furthermore, onium salts in which the anion moiety of these onium salts are replaced by an anion moiety represented by any one of formulas (b1) to (b8) shown below can be used.

[Chemical Formula 75]

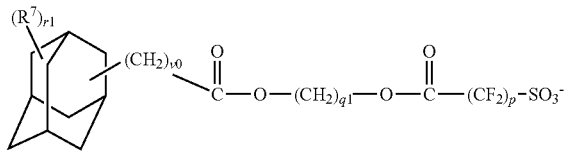

(b1)

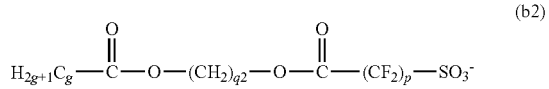

(b2)

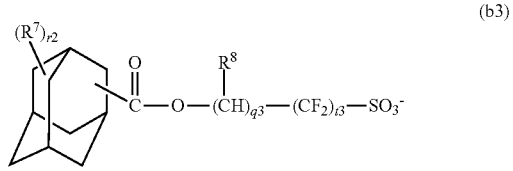

(b3)

In the formulas, p represents an integer of 1 to 3; v0 represents an integer of 0 to 3; each of q1 and q2 independently represents an integer of 1 to 5; q3 represents an integer of 1 to 12; each of r1 and r2 independently represents an integer of 0 to 3; g represents an integer of 1 to 20; t3 represents an integer of 1 to 3; $R^7$ represents a substituent; and $R^8$ represents a hydrogen atom, an alkyl group of 1 to 5 carbon atoms or a halogenated alkyl group of 1 to 5 carbon atoms.

[Chemical Formula 76]

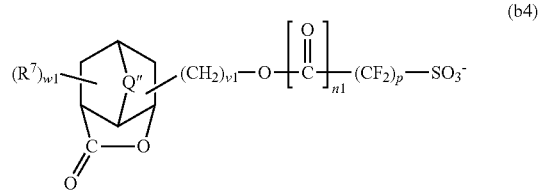

(b4)

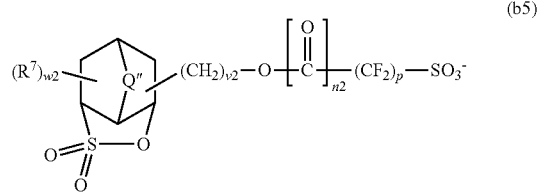

(b5)

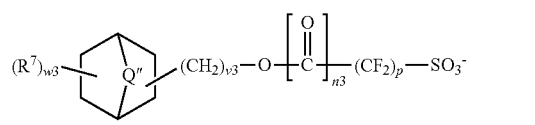

(b6)

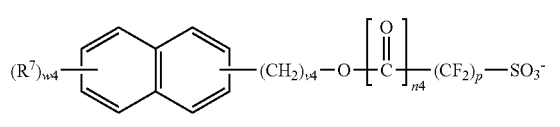

(b7)

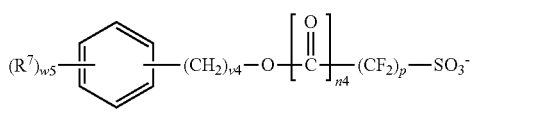

(b8)

In the formulas, p, $R^7$ and Q″ are the same as defined above; each of n1 to n5 independently represents 0 or 1; each of v1 to v5 independently represents an integer of 0 to 3; and each of w1 to w5 independently represents an integer of 0 to 3.

Examples of the substituent represented by $R^7$ include an alkyl group and a hetero atom-containing substituent. Examples of the alkyl group include the same alkyl groups as those described above as the substituent for the aromatic hydrocarbon group in the explanation of X. Examples of the hetero atom-containing substituent include the same hetero atom-containing substituents as those described above for substituting part or all of the hydrogen atoms constituting the aforementioned aliphatic hydrocarbon group.

If there are two or more of the $R^7$ group, as indicated by the values r1, r2, and w1 to w5, then the two or more of the $R^7$ groups may be the same or different from each other.

The alkyl group and the halogenated alkyl group for $R^8$ are respectively the same as defined for the alkyl group and the halogenated alkyl group for R.

Each of r1, r2, and w1 to w5 is preferably an integer of 0 to 2, and more preferably 0 or 1.

v0 to v5 is preferably 0 to 2, and most preferably 0 or 1.

t3 is preferably 1 or 2, and most preferably 1.

q3 is preferably 1 to 5, more preferably 1 to 3, and most preferably 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 77]

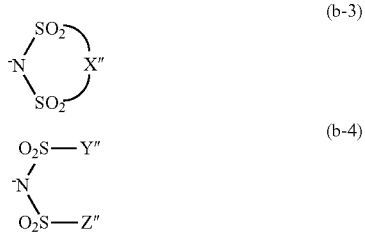

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, an onium salt-based acid generator in which the anion moiety ($R^{4"}SO_3^-$) in general formula (b-1) or (b-2) has been replaced with $R^{7"}$—$COO^-$ (in the formula, $R^{7"}$ represents an alkyl group or a fluorinated alkyl group) can also be used (the cation moiety is the same as that in general formula (b-1) or (b-2)).

As $R^{7"}$, the same groups as those described above for $R^{4"}$ can be used.

Specific examples of the group represented by the formula "$R^{7"}$—$COO^-$" include a trifluoroacetate ion, an acetate ion, and a 1-adamantanecarboxylic acid ion.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 78]

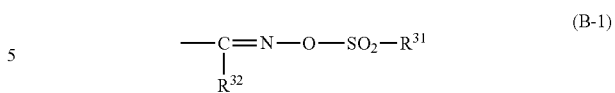

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with, halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sultanate acid generator include compounds represented by general formula (B-2) or (B-3) shown below.

[Chemical Formula 79]

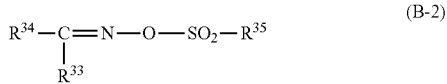

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 80]

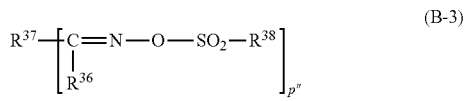

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenylacetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 81]

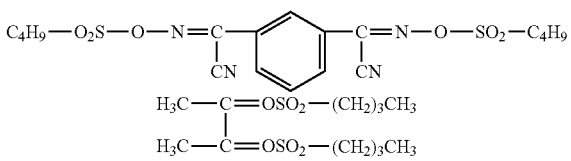

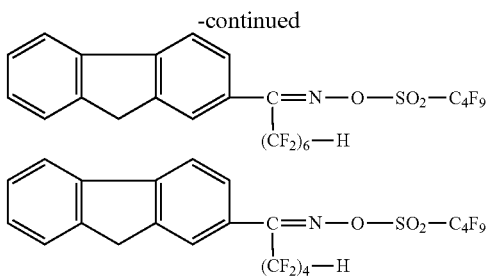

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the present invention, as the component (B), it is preferable to use an onium salt having a fluorinated alkylsulfonic acid ion as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

The positive resist composition of the present invention may contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used.

In general, a low molecular weight compound (non-polymer) is used as the component (D). Examples of the component (D) include an aliphatic amine and an aromatic amine. Among these, an aliphatic amine is preferable, and a secondary aliphatic amine or tertiary aliphatic amine is particularly desirable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and laurildiethanolamine. Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris[2-(1-ethoxypropoxy)ethyl]amine and tris[2-{2-(2-hydroxyethoxy)ethoxy}ethyl]amine.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline, 2,2'-dipyridyl and 4,4'-dipyridyl.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (5), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

<<Method of Forming a Resist Pattern>>

The method of forming a resist pattern according to the present invention includes: applying a positive resist composition of the present invention to a substrate to form a resist film on the substrate; conducting exposure of the resist film; and developing the resist film to form a resist pattern.

The method for forming a resist pattern according to the present invention can be performed, for example, as follows.

More specifically, the method for forming a resist pattern according to the present invention can be performed, for example, as follows. Firstly, the aforementioned resist composition is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an BUY exposure apparatus or the like through a mask having a predetermined pattern formed thereon (mask pattern) or directly irradiated with electron beam without a mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing.

In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.) and an example of a suitable perfluoroalkylamine compound is perfluorotributylamine (boiling point 174° C.).

As the immersion medium, water is preferable in terms of cost, safety, environment and versatility.

The positive resist composition of the present invention exhibits excellent lithography properties with respect to exposure latitude (EL), mask error factor (MEEF), in-plane uniformity of the pattern dimension (critical dimension uniformity (CDU)), and the like.

EL is the range of the exposure dose in which a resist pattern can be formed with a size within a predetermined range of variation from a target size, when exposure is conducted by changing the exposure dose, i.e., the range of the exposure dose in which a resist pattern faithful to the mask pattern can be formed. The larger the EL, the smaller the variation in the pattern size depending on the change in the exposure dose, thereby resulting in favorable improvement in the process margin.

The MEEF is a parameter that indicates how faithfully mask patterns of differing dimensions can be reproduced (mask reproducibility) by conducting exposure with the same exposure dose and fixed pitch, and changing the mask size (e.g., the hole diameter of a hole pattern or the line width of a line pattern). In the formation of a resist pattern using a conventional resist composition, when the pattern size of the mask is changed, the amount of light irradiated on exposed portions is changed. As a result, disadvantages are likely to be caused in that the actual size of the formed pattern is deviated from the target size, and pattern collapse occurs in the formation of an extremely fine pattern with a narrow pitch. For example, when a hole pattern having a hole diameter of about no more than 100 nm is formed, the circularity of the holes is likely to be deteriorated.

The reasons why the aforementioned effects can be achieved have not been elucidated yet, but are presumed as follows. Firstly, the component (A1) has a structural unit (a0) having the structure —W—$OSO_2N$ on the side chain thereof; together with the structural unit (a1). As a result, it is presumed that, during the formation of a resist pattern, the acid generated in the exposed portions of the resist film can be suppressed from diffusing to the unexposed portions, thereby suppressing the dissociation of the acid dissociable, dissolution inhibiting groups within the component (A1) at unexposed portions. Further, since the structural unit (a0) has a sulfamoyloxy group ($OSO_2N$ group) which is a polar group, the resist film exhibits a satisfactory affinity for an alkali developing solution. In addition, since both of the W group and the sulfamoyloxy group within the structural unit (a0) has a structure exhibiting a relatively high transparency, it is presumed that the component (A1) exhibits a high transparency, in particular to a light having a wavelength in the vicinity of 193 nm, thereby enhancing the transparency of the formed resist film.

In addition, the positive resist composition is capable of forming a resist pattern with the generation of defects suppressed.

The term "defects" refers to general abnormalities within a resist film that are detected when observed from directly above the developed resist pattern using, for example, a surface defect detection apparatus (product name: "KLA") manufactured by KLA-TENCOR Corporation. Examples of these abnormalities include post-developing scum, foam, dust, bridges formed between resist patterns, and color irregularities. The problem of defects becomes more important as the pattern becomes smaller.

One of the factors related to the generation of defects is considered to be the hydrophobicity of the resist film surface. For example, when rinsing is conducted using water after development, the base resin and the like dissolved in the alkali developing solution is deposited and adhered to the resist pattern surface which exhibits a high hydrophobicity. Therefore, it is presumed that generation of defects can be suppressed by enhancing the hydrophilicity of the resist pattern surface. For example, it is considered that by introducing a structural unit containing a hydrophilic group such as a hydroxy group into the base resin, such defects can be reduced. However, when the amount of the structural unit containing a hydrophilic group is increased within the base resin, in general, the amounts of the other structural units are decreased. As a result, satisfactory lithography properties cannot be achieved.

In contrast, since the positive resist composition of the present invention has a sulfamoyloxy group ($OSO_2N$ group) which is a polar group, the hydrophilicity of the surface of the formed resist pattern is enhanced. As a result, defects can be reduced. In addition, as described above, the lithography properties are excellent.

The hydrophobicity and the hydrophilicity of a resist film can be evaluated by measuring the contact angle thereof against water, for example, the static contact angle (the contact angle between the surface of a water droplet on the resist film in a horizontal state and the resist film surface), the dynamic contact angle (the contact angle at which a water droplet starts to slide when the resist film is inclined (sliding angle), the contact angle at the front-end point of the water droplet in the sliding direction (advancing angle) and the contact angle at the rear-end point of the water droplet in the sliding direction (receding angle)). For example, the higher the hydrophobicity of a resist film, the higher the static angle, advancing angle, and receding angle and the smaller the sliding angle.

The aforementioned angles (dynamic contact angles (advancing angle, receding angle, sliding angle and the like) and static contact angle) can be measured using commercially available measurement apparatuses such as DROP MASTER-700 (product name; manufactured by Kyowa Interface Science Co. Ltd.), AUTO SLIDING ANGLE: SA-30 DM (product name; manufactured by Kyowa Interface Science Co. Ltd.), and AUTO DISPENSER: AD-31 (product name; manufactured by Kyowa Interface Science Co. Ltd.).

<<Polymeric Compound>>

The polymeric compound of the present invention includes a structural unit (a0) represented by general formula (a0-1) shown below and a structural unit (a1) derived from an acrylate ester containing an acid dissociable, dissolution inhibiting group.

The explanation of the polymeric compound of the present invention is the same as the explanation of the component (A1) of the positive resist composition of the present invention described above.

[Chemical Formula 82]

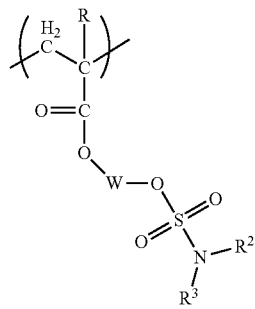

(a0-1)

In the formula, R represents a hydrogen atom, an alkyl group of 1 to 5 carbon atoms or a halogenated alkyl group of 1 to 5 carbon atoms; each of $R^2$ and $R^3$ independently represents a hydrogen atom or an alkyl group that may contain an oxygen atom at an arbitrary position, or $R^2$ and $R^3$ are bonded together to form an alkylene group; and W represents a cyclic alkylene group that may include an oxygen atom at an arbitrary position.

EXAMPLES

As follows is a description of examples of the present invention, although the scope of the present invention is by no way limited by these examples.

In the following examples, a unit represented by a chemical formula (m0-1) is referred to as "compound (m0-1)", and the same applies for compounds represented by other formulas.

The monomers used in the following polymer synthesis examples (compounds (m0-1), (m1-1) to (m1-7), (m2-1) to (m2-9), (m3-1), (m3-2) and (m4-1)) are shown below. Among these, compounds (m0-1), (m2-8) and (m2-9) were synthesized in accordance with the following Monomer Synthesis Examples 1 to 3, respectively. The compound (m1-7) was synthesized in accordance with Synthesis Examples 1 and 2 described in Japanese Unexamined Patent Application, First Publication No. 2009-223300.

In the NMR analysis, the internal standard for $^1$H-NMR and $^{13}$C-NMR was tetramethylsilane. The internal standard for $^{19}$F-NMR was hexafluorobenzene (provided that the peak of hexafluorobenzene was regarded as −160 ppm).

[Chemical Formula 83]

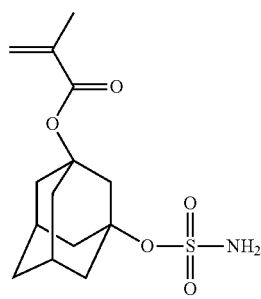

(m0-1)

[Chemical Formula 84]
(m1-1)
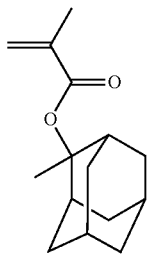
(m1-2)
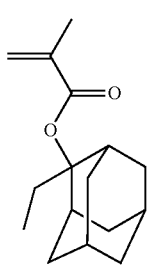
(m1-3)
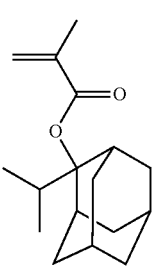
(m1-4)
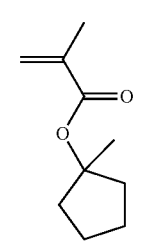
(m1-5)
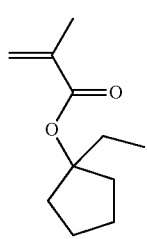
(m1-6)
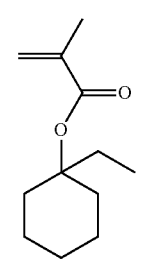
(m1-7)
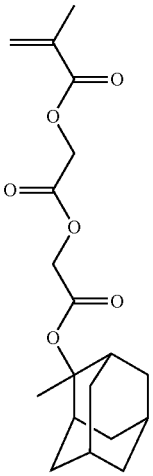
[Chemical Formula 85]
(m2-1)
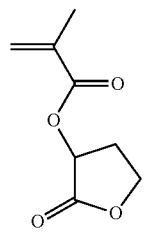
(m2-2)
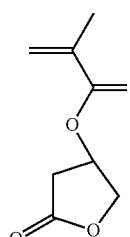
(m2-3)
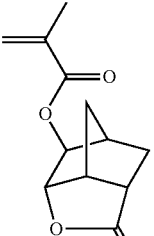
(m2-4)
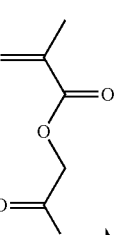

(m2-5)
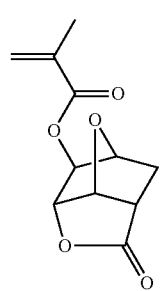
(m2-6)
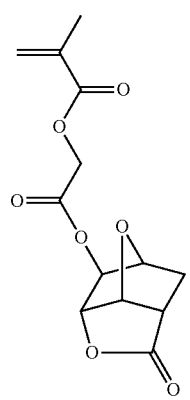
(m2-7)
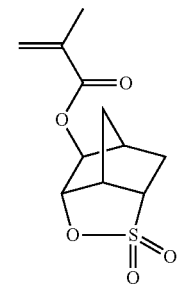
(m2-8)
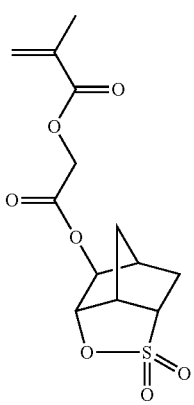
(m2-9)
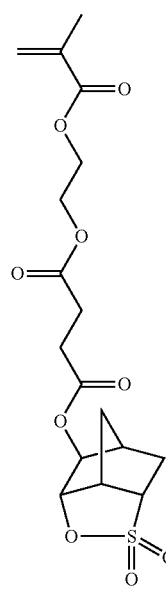
[Chemical Formula 86]
(m3-1)
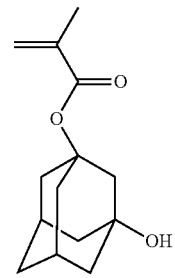
(m3-2)
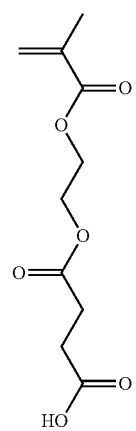

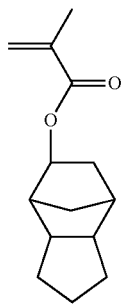

(m4-1)

Monomer Synthesis Example 1

Synthesis of Compound (m0-1)
(3-sulfamoyloxyadamantyl methacrylate)

A 5-liter four-necked flask equipped with a thermometer, a dropping funnel and a stirrer was purged with nitrogen, and 980 g of heptane and 334 g (2.4 mol) of chlorosulfonyl isocyanate were added thereto using the dropping funnel. The internal temperature was cooled to 5° C., and 110 g (2.4 mol) of formic acid was added dropwise from the dropping funnel at a rate that maintained the temperature inside the flask at 5 to 8° C. Following completion of the dropwise addition, the internal temperature was raised to 20° C., and the mixture was stirred for 10 hours. To the resulting mixed solution was added a solution containing 1863 g (0.79 mol) of 3-hydroxy-adamantyl methacrylate, 525 g of N-methylpyrrolidone, 2.1 g of 4-methoxyphenol and 2.1 g of phenothiazine, with the addition performed via the dropping funnel at a rate that maintained the temperature inside the flask at a temperature of not more than 20° C. Following stirring for 3 hours at an internal temperature of 20 to 25° C., the reaction mixture was transferred to a separating funnel, and the upper layer was discarded. To the thus obtained lower layer were added 890 g of ethyl acetate and 700 g of water, and the resulting mixture was stirred, left to settle, and then separated. A further 890 g of ethyl acetate was then added to the water layer, and a second extraction was performed. Following mixing of the two ethyl acetate layers, the resulting solution was washed 5 times with 900 g of water. The washed solution was then washed with 400 g of a 7% by weight aqueous solution of sodium bicarbonate, and then 400 g of water. The thus obtained washed organic layer was concentrated under reduced pressure to obtain a concentrated solution of 500 g, and 630 g of toluene was added. The resulting solution was then heated to an internal temperature of 55° C., and then cooled to 3° C. to effect a recrystallization. The obtained suspension was filtered, thereby obtaining 159.5 g (0.51 mol) (yield=64%) of the objective compound (m0-1) in the form of crystals.

The results of $^1$H-NMR analysis of the obtained 3-sulfamoyloxyadamantyl methacrylate are shown below.

$^1$H-NMR(300 MHz, solvent: deuterated dimethyl sulfoxide (DMSO-d$_6$)):δ(ppm)=7.43(2H,s), 5.96(1H,s), 5.62(1H,s), 2.48(2H,s), 2.35(3H,br), 2.23(1H,s), 2.04(6H,m), 1.84 (3H,s)1.52(2H,s)

Monomer Synthesis Example 2

Synthesis of Compound (m2-8)

300 ml of a THF solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1) was added thereto while cooling with ice (0° C.), followed by stirring at room temperature for 12 hours.

After conducting thin-layer chromatography (TLC) to confirm that the raw materials had dissipated, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N-HClaq in this order. Thereafter, the solvent was distilled off under reduced pressure, and the resulting product was dried, thereby obtaining the objective compound (m2-8).

The results of instrumental analysis of the obtained compound were as follows.

$^1$H-NMR(400 MHz,CDCl$_3$):δ(ppm)=6.22(s,1H,H$^a$), 5.70 (s,1H,H$^b$), 4.71-4.85(m,2H,H$^{c,d}$), 4.67(s,2H,H$^k$), 3.40-3.60 (m,2H,H$^{e,f}$), 2.58-2.70(m,1H,H$^g$), 2.11-2.21(m,2H,H$^h$), 2.00 (s,3H,H$^i$), 1.76-2.09(m,2H,H$^j$)

[Chemical Formula 87]

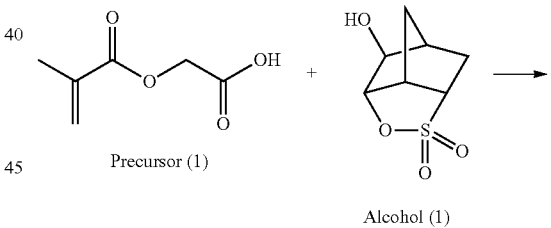

Precursor (1)   Alcohol (1)

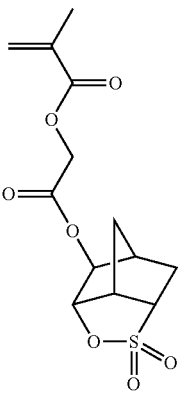

(m2-8)

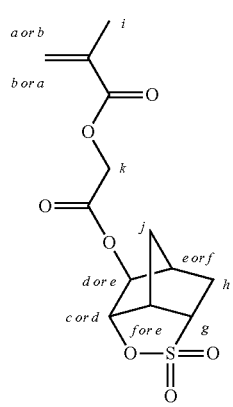

Monomer Synthesis Example 3

Synthesis of Compound (m2-9)

In a three-necked flask in a nitrogen atmosphere, 50 g of a precursor (2) and 37.18 g of an alcohol (1) were dissolved in 500 ml of tetrahydrofuran (THF). Then, 56.07 g of ethyldiisopropylaminocarbodiimide hydrochloride (EDCI.HCl) was added thereto, and cooled to 0° C. Then, dimethylaminopyridine (DMAP) was added thereto, and reacted for 10 minutes. Thereafter, a reaction was performed for at room temperature for 12 hours. After the completion of the reaction, 100 ml of water was added, and the resultant was concentrated under reduced pressure. Then, extraction was conducted using ethyl acetate, and the organic phase was washed with water. Subsequently, the organic phase obtained by extraction with ethyl acetate was washed with an aqueous sodium hydrogencarbonate solution three times. Next, the organic phase was washed with water. Then, the organic phase was washed with aqueous hydrochloric acid solution twice. Then, the organic phase was washed with water three times. Finally, the resultant was concentrated under reduced pressure, followed by washing with heptane twice and drying, thereby obtaining 58.10 g of a compound (m2-9) as an objective compound.

The results of instrumental analysis of the obtained compound were as follows.

$^1$H-NMR(400 MHz,CDCl$_3$):δ(ppm)=6.12(1H,s,H$^a$), 5.60 (1H,s,H$^b$), 4.73-4.71(2H,m,H$^c$), 4.34(4H,s,H$^d$), 3.55(1H,m, H$^e$), 3.48(1H,m,H$^f$), 2.68-2.57(4H,m,H$^g$), 2.16-1.76(5H,m, H$^h$), 1.93(3H,s,H$^i$)

[Chemical Formula 88]

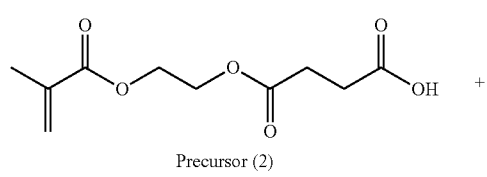

Precursor (2)

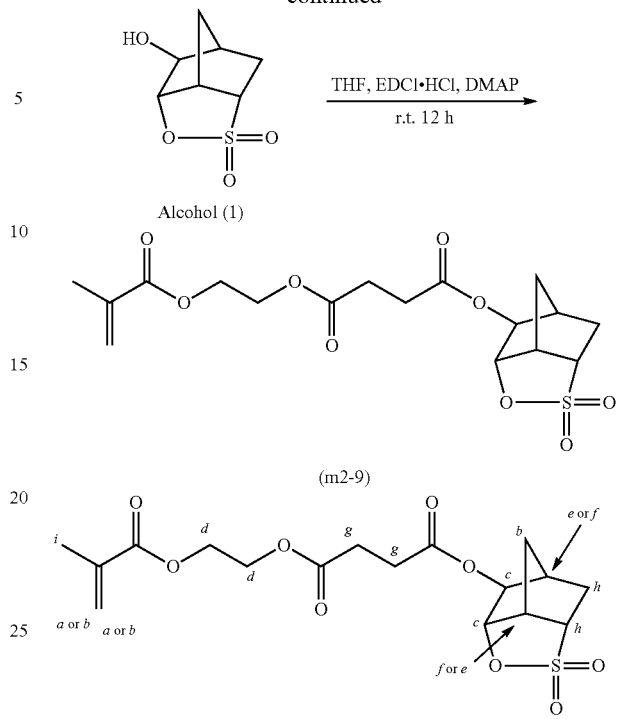

Polymer Synthesis Example 1

Synthesis of Polymeric Compound 1

In a separable flask equipped with a thermometer, a reflux tube and a nitrogen feeding pipe, 8.00 g (25.32 mmol) of the compound (m2-8) and 6.56 g (20.85 mmol) of the compound (m0-1) were dissolved in 34.68 g of methyl ethyl ketone (MEK) to obtain a solution. Then, 9.68 mmol of dimethyl 2,2'-azobis(isobutyrate) (V-601) as a polymerization initiator was added and dissolved in the obtained solution. Then, the resulting solution was added to 26.92 g of a MEK solution containing 26.92 g (102.76 mmol) of the compound (m1-3) heated to 80° C. in a dropwise manner over 3 hours in a nitrogen atmosphere. Thereafter, the reaction solution was heated for 2 hour while stirring, and then cooled to room temperature.

The obtained reaction polymer solution was dropwise added to an excess amount of an n-heptane/isopropyl alcohol mixed solvent to deposit a polymer. Thereafter, the precipitated white powder was separated by filtration, followed by washing with methanol and MEK, and then drying, thereby obtaining 17.5 g of a polymeric compound 1 as an objective compound.

The compositional ratio ((molar) ratio of the respective structural units within the structural formula) as determined by carbon 13 nuclear magnetic resonance spectroscopy (600 MHz $^{13}$C-NMR) was 1/m/n=26.0/53.2/20.8. Further, the weight average molecular weight (Mw) and the dispersity (Mw/Mn) were determined by the polystyrene equivalent value as measured by gel permeation chromatography (GPC). As a result, it was found that Mw was 8,500, and Mw/Mn was 1.65.

[Chemical Formula 89]

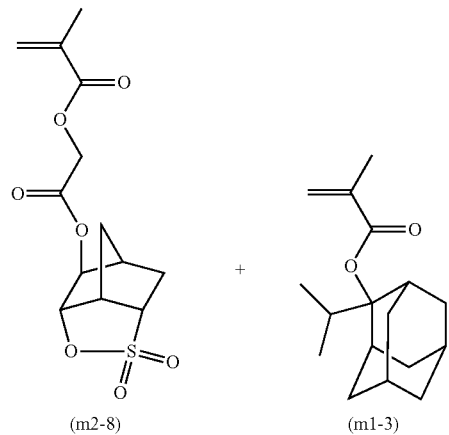

(m2-8)          (m1-3)

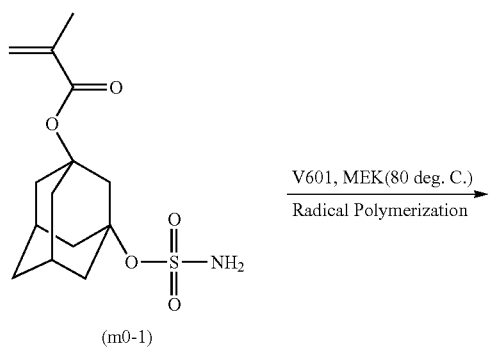

(m0-1)

V601, MEK(80 deg. C.)
Radical Polymerization

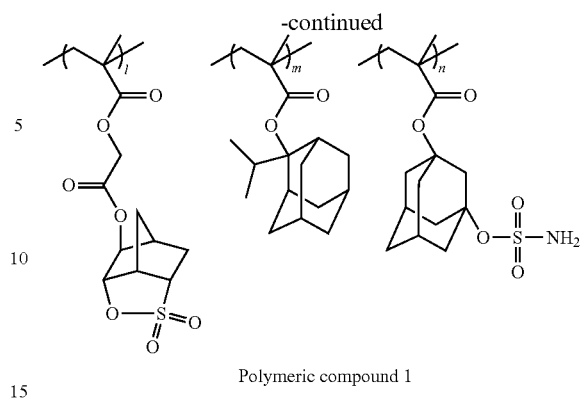

Polymeric compound 1

Polymer Synthesis Examples 2 to 29

Polymeric compounds 2 to 29 were synthesized in the same manner as in Polymer Synthesis Example 1, except that the monomer compounds were used with the molar ratio indicated in Tables 1 to 3.

With respect to the obtained polymeric compounds, the compositional ratio, Mw and Mw/Mn were determined in the same manner as described above. The results are shown in Tables 1 to 3.

Comparative Polymer Synthesis Examples 1 to 7

Polymeric compounds 1' to 7' were synthesized in the same manner as in Polymer Synthesis Example 1, except that the monomer compounds were used with the molar ratio indicated in Table 4.

With respect to the obtained polymeric compounds, the compositional ratio, Mw and Mw/Mn were determined in the same manner as described above. The results are shown in Table 4.

TABLE 1

| Polymeric Compound | Monomer | | | | | Compositional ratio of copolymer | | | | | Mw | Mw/Mn |
|---|---|---|---|---|---|---|---|---|---|---|---|---|
| 1 | (m2-8) | (m1-3) | (m0-1) | — | — | 26.0 | 53.2 | 20.8 | — | — | 8,500 | 1.65 |
| 2 | (m2-8) | (m1-3) | (m1-7) | (m0-1) | — | 29.8 | 47.6 | 10.8 | 11.8 | — | 8,500 | 1.65 |
| 3 | (m2-8) | (m1-6) | (m0-1) | — | — | 20.1 | 60.1 | 19.8 | — | — | 6,300 | 1.5 |
| 4 | (m2-1) | (m1-1) | (m4-1) | (m0-1) | — | 38.3 | 40.9 | 5.4 | 15.3 | — | 6,700 | 1.99 |
| 5 | (m2-8) | (m1-3) | (m1-6) | (m0-1) | — | 43.8 | 41.1 | 6.2 | 8.9 | — | 7,600 | 1.8 |
| 6 | (m2-1) | (m2-8) | (m1-3) | (m1-4) | (m0-1) | 34.4 | 20.3 | 17.5 | 14.6 | 13.2 | 8,200 | 1.87 |
| 7 | (m2-1) | (m1-6) | (m0-1) | — | — | 50.0 | 33.3 | 16.7 | — | — | 7,000 | 1.56 |

TABLE 2

| Polymeric compound | Monomer | | | Compositional ratio of copolymer | | | Mw | Mw/Mn |
|---|---|---|---|---|---|---|---|---|
| 8 | (m2-1) | (m1-1) | (m0-1) | 44.6 | 35.1 | 20.3 | 7,200 | 1.53 |
| 9 | (m2-2) | (m1-1) | (m0-1) | 45.2 | 33.9 | 20.9 | 7,400 | 1.52 |
| 10 | (m2-7) | (m1-1) | (m0-1) | 39.7 | 40.5 | 19.8 | 6,600 | 1.58 |
| 11 | (m2-8) | (m1-1) | (m0-1) | 40.5 | 40.2 | 19.3 | 6,900 | 1.60 |
| 12 | (m2-3) | (m1-1) | (m0-1) | 39.9 | 40.0 | 20.1 | 7,400 | 1.56 |
| 13 | (m2-4) | (m1-1) | (m0-1) | 40.4 | 39.4 | 20.2 | 7,100 | 1.51 |
| 14 | (m2-5) | (m1-1) | (m0-1) | 39.4 | 39.9 | 20.7 | 7,800 | 1.57 |
| 15 | (m2-6) | (m1-1) | (m0-1) | 40.1 | 40.0 | 19.9 | 7,000 | 1.52 |
| 16 | (m2-8) | (m1-2) | (m0-1) | 25.3 | 50.4 | 24.3 | 6,500 | 1.50 |
| 17 | (m2-8) | (m1-3) | (m0-1) | 40.4 | 39.4 | 20.2 | 6,700 | 1.58 |
| 18 | (m2-1) | (m1-4) | (m0-1) | 40.8 | 39.6 | 19.6 | 7,500 | 1.55 |
| 19 | (m2-1) | (m1-5) | (m0-1) | 39.5 | 40.1 | 20.4 | 6,800 | 1.53 |
| 20 | — | (m1-1) | (m0-1) | — | 60.2 | 39.8 | 7,200 | 1.56 |

TABLE 3

| Polymeric compound | Monomer | | | | | Compositional ratio of copolymer | | | | | Mw | Mw/Mn |
|---|---|---|---|---|---|---|---|---|---|---|---|---|
| 21 | (m2-8) | (m1-3) | (m1-6) | (m0-1) | (m3-2) | 37.8 | 37.2 | 11.4 | 8.3 | 5.3 | 7,300 | 1.59 |
| 22 | (m2-8) | (m1-3) | (m1-2) | (m0-1) | — | 45.3 | 39.9 | 4.9 | 9.9 | — | 7,500 | 1.65 |
| 23 | (m2-8) | (m1-7) | (m1-3) | (m0-1) | — | 34.9 | 10.1 | 45.3 | 9.7 | — | 8,900 | 1.58 |
| 24 | (m2-8) | (m2-9) | (m1-7) | (m1-3) | (m0-1) | 17.8 | 17.3 | 10.0 | 44.9 | 10.0 | 8,600 | 1.66 |
| 25 | (m2-1) | (m1-7) | (m1-2) | (m0-1) | — | 50.2 | 9.9 | 29.8 | 10.1 | — | 9,800 | 1.68 |
| 26 | (m2-1) | (m2-8) | (m1-2) | (m1-4) | (m0-1) | 31.5 | 25.4 | 20.1 | 15.6 | 7.4 | 8,200 | 1.62 |
| 27 | (m2-1) | (m2-8) | (m1-3) | (m0-1) | — | 23.2 | 20.6 | 40.5 | 15.7 | — | 10,100 | 1.70 |
| 28 | (m2-1) | (m2-8) | (m1-2) | (m0-1) | — | 22.9 | 20.4 | 40.8 | 15.9 | — | 9,800 | 1.67 |
| 29 | (m2-1) | (m2-8) | (m1-4) | (m0-1) | — | 23.7 | 20.2 | 40.3 | 15.8 | — | 9,300 | 1.65 |

TABLE 4

| Polymeric compound (Comparative) | Monomer | | | | | Compositional ratio of copolymer | | | | | Mw | Mw/Mn |
|---|---|---|---|---|---|---|---|---|---|---|---|---|
| 1' | (m2-8) | (m1-3) | (m3-1) | — | — | 27.3 | 51.8 | 20.9 | — | — | 6,100 | 1.44 |
| 2' | (m2-8) | (m1-3) | (m1-7) | (m3-1) | — | 33.6 | 43.4 | 10.7 | 12.3 | — | 8,300 | 1.65 |
| 3' | (m2-1) | (m1-1) | (m3-1) | — | — | 44.8 | 34.8 | 20.4 | — | — | 7,100 | 1.54 |
| 4' | (m2-8) | (m1-6) | (m3-1) | — | — | 17.4 | 61.1 | 21.5 | — | — | 10,100 | 1.69 |
| 5' | (m2-1) | (m1-1) | (m4-1) | (m3-1) | — | 35.5 | 33.5 | 14.8 | 16.2 | — | 12,000 | 2.48 |
| 6' | (m2-8) | (m1-3) | (m1-6) | (m3-1) | — | 46.6 | 34.1 | 6.8 | 12.5 | — | 6,800 | 1.84 |
| 7' | (m2-1) | (m2-8) | (m1-3) | (m1-4) | (m3-1) | 34.5 | 22.1 | 18.8 | 13.1 | 11.5 | 6,500 | 1.60 |

<Evaluation of Aqueous TMAH Solution Affinity of Polymeric Compound>

[Measurement of Static Contact Angle (CA)]

With respect to the polymeric compounds 1, 1', 3, 4', 4, 5', 5, 6', 6 and 7' obtained above, the affinity for a 2.38 weight % TMAH aqueous solution was evaluated in the following manner.

Firstly, each of the polymeric compounds was dissolved in a PGMEA/PGME mixed solvent having a weight ratio of PGMEA:PGME=6:4, thereby obtaining a evaluation resin solution having a concentration of 3.7% by weight. Subsequently, each of the obtained evaluation resin solutions was applied to an 8-inch silicon wafer using a spinner, and was then prebaked on a hotplate at 110° C. for 60 seconds and dried, thereby forming a resin film having a film thickness of 120 nm.

Thereafter, 2 μl of a 2.38 weight % aqueous TMAH solution was dropwise added to the surface of the resin film, and the static contact angle was measured using DROP MASTER-700 (manufactured by Kyowa Interface Science Co. Ltd.). The measured value was defined as "CA(°)". The results are shown in Table 5.

TABLE 5

| | Polymeric compound | | | | |
|---|---|---|---|---|---|
| | 1 | 1' | 3 | 4' | 4 |
| CA (°) | 65.8 | 72.9 | 76.6 | 79.9 | 64.3 |
| | Polymeric compound | | | | |
| | 5' | 5 | 6' | 6 | 7' |
| CA (°) | 69.9 | 68 | 73.1 | 60.8 | 68 |

As seen from the results shown in Table 5, from a comparison of the respective resins, it was found that the polymeric compounds 1 and 3 to 6 according to the present invention exhibited a low contact angle against an aqueous TMAH solution, meaning that the polymeric compounds exhibited a high affinity for an alkali developing solution. Thus, by using a positive resist composition containing the polymeric compound of the present invention in a lithography process, it can be expected that the effect of suppressing generation of defects in the developing process can be enhanced.

<Evaluation of Positive Resist Composition>

Example 1, Comparative Example 1

The components shown in Table 6 were mixed together and dissolved to obtain positive resist compositions.

TABLE 6

| | Component (A) | Component (B) | | Component (D) | Component (E) | Component (S) | |
|---|---|---|---|---|---|---|---|
| Ex. 1 | (A)-1 | (B)-1 | (B)-2 | (D)-1 | (E)-1 | (S)-1 | (S)-2 |
| | [100] | [6.7] | [2.6] | [0.6] | [0.8] | [10] | [2700] |
| Comp. Ex. 1 | (A)-1' | (B)-1 | (B)-2 | (D)-1 | (E)-1 | (S)-1 | (S)-2 |
| | [100] | [6.7] | [2.6] | [0.6] | [0.8] | [10] | [2700] |

In Table 6, the reference characters indicate the following. Further, the values in brackets [ ] indicate the amount (in terms of parts by weight) of the component added.

(A)-1: the aforementioned polymeric compound 1
(A)-1': the aforementioned polymeric compound 1'
(B)-1: a compound represented by chemical formula (B)-1 shown below, which was synthesized in the same manner as in Example 1 of Japanese Unexamined Patent Application, First Publication No. 2009-167156.
(B)-2: a compound represented by chemical formula (B)-2 shown below
(D)-1: tri-n-pentylamine
(S)-1: γ-butyrolactone
(S)-2: a mixed solvent of PGMEA/PGME=6/4 (weight ratio)

[Chemical Formula 90]

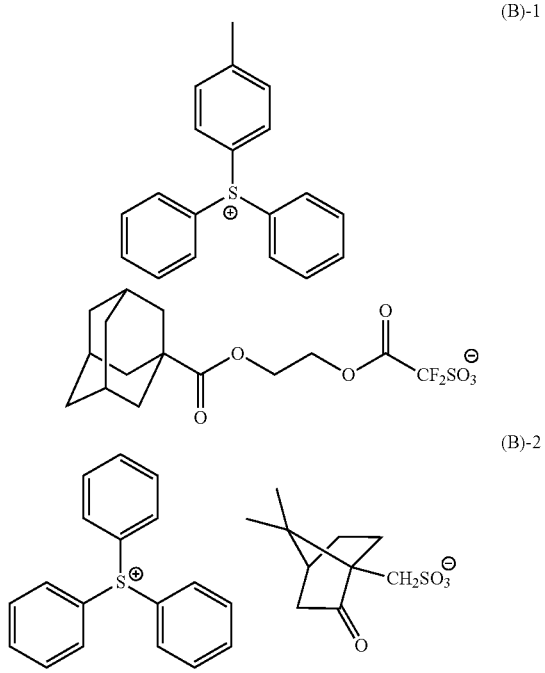

Using the obtained positive resist compositions, resist patterns were formed in the following manner, and the lithography properties were evaluated.

[Formation of Resist Pattern (1)]

An organic anti-reflection film composition (product name: ARC29A, manufactured by Brewer Science Ltd.) was applied to an 8-inch silicon wafer using a spinner, and the composition was then baked at 205° C. for 60 seconds, thereby forming an organic anti-reflection film having a film thickness of 77 nm. Then, the resist composition was applied onto the anti-reflection film using a spinner, and was then prebaked (FAB) on a hotplate at 100° C. for 60 seconds and dried, thereby forming a resist film having a film thickness of 120 nm.

Subsequently, the resist film was irradiated with an ArF excimer laser (193 nm) through a mask pattern, using an ArF exposure apparatus NSR-S302A (manufactured by Nikon Corporation; NA (numerical aperture)=0.6, 2/3 Annular).

Thereafter, a post exposure bake (PEB) treatment was conducted at 100° C. for 60 seconds, followed by alkali development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 25 seconds with pure water, followed by drying by shaking.

As a result, in each of the examples, a 1:1 line and space resist pattern (L/S pattern) having a line width of 130 nm and a pitch of 260 nm was formed on the resist film. The optimum exposure dose Eop (mJ/cm$^2$) with which the pattern was formed, i.e., sensitivity, was determined. The results are shown in Table 7.

[Evaluation of EL (1)]

The exposure dose with which the aforementioned L/S pattern could be formed with a dimension within the range of the target dimension (line width: 130 nm)±5% (i.e., 123.5 nm to 136.5 nm) was determined, and the EL (unit: %) was determined by the following formula. The results are shown in Table 7. The larger the value of the EL, the smaller the change in the pattern size by the variation of the exposure dose.

$$EL\ margin\ (\%) = (|E1-E2|/Eop) \times 100$$

In the formula, E1 represents the exposure dose (mJ/cm$^2$) for forming a L/S pattern having a line width of 123.5 nm, and E2 represents the exposure dose (mJ/cm$^2$) for forming a L/S pattern having a line width of 136.5 nm.

[Evaluation of MEEF (1)]

With the above Eop, L/S patterns were formed using a mask targeting a line width of 120 nm and a pitch of 260 nm, and a mask targeting a line width of 130 nm and a pitch of 260 nm, and the MEEF value was calculated by the following formula. The results are shown in Table 7. A MEEF value closer to 1 indicates that a resist pattern faithful to the mask was formed.

$$MEEF = |CD130-CD120|/|MD130-MD120|$$

In the formulas, CD130 and CD120 represent the respective line widths (nm) of the actual L/S patterns respectively formed using the mask targeting a line width of 130 nm and the mask targeting a line width of 120 nm. MD130 and MD120 represent the respective target line widths (nm), meaning MD130=130, and MD120=120.

TABLE 7

|  | Ex. 1 | Comp. Ex. 1 |
| --- | --- | --- |
| Polymeric compound | 1 | 1' |
| PAB/PEB (° C.) | 100/100 | 100/100 |
| Eop (mJ/cm$^2$) | 35.5 | 23.5 |
| EL (%) | 19.95 | 3.91 |
| MEEF | 3.49 | 4.23 |

Example 2, Comparative Example 2

The components shown in Table 8 were mixed together and dissolved to obtain positive resist compositions.

TABLE 8

|  | Component (A) | Component (B) | Component (D) | Component (E) | Component (S) | |
| --- | --- | --- | --- | --- | --- | --- |
| Ex. 2 | (A)-2 [100] | (B)-3 [10] | (D)-1 [0.76] | (E)-1 [1.38] | (S)-1 [10] | (S)-2 [2700] |
| Comp. Ex. 2 | (A)-2' [100] | (B)-3 [10] | (D)-1 [0.76] | (E)-1 [1.38] | (S)-1 [10] | (S)-2 [2700] |

In Table 8, (D)-1, (S)-1 and (S)-2 are the same as defined above, and the other reference characters indicate the following. Further, the values in brackets [ ] indicate the amount (in terms of parts by weight) of the component added.

(A)-2: the aforementioned polymeric compound 2
(A)-2': the aforementioned polymeric compound 2'
(B)-3: a compound represented by chemical formula (B)-3 shown below, which was synthesized in "Component (B) Synthesis Example 1" described later (the anion moiety was synthesized based on Japanese Unexamined Patent Application, First Publication No. 2009-91350)

[Chemical Formul 91]

(B)-3

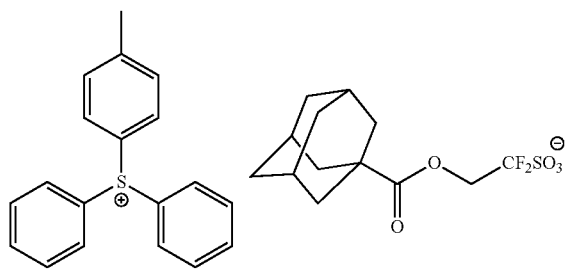

Using the obtained positive resist compositions, resist patterns were formed in the following manner, and the lithography properties were evaluated.

[Formation of Resist Pattern (2)]

An organic anti-reflection film composition (product name: ARC29, manufactured by Brewer Science Ltd.) was applied to a 12-inch silicon wafer using a spinner, and the composition was then baked at 205° C. for 60 seconds, thereby forming an organic anti-reflection film having a film thickness of 89 nm. Then, each of the positive resist compositions obtained above was applied onto the anti-reflection film using a spinner, and was then subjected to a PAB treatment on a hotplate at 90° C. for 60 seconds and dried, thereby forming a resist film having a film thickness of 100 nm.

Subsequently, a coating solution for forming a protection film (product name: TILC-035; manufactured by Tokyo Ohka Kogyo Co., Ltd.) was applied to the resist film using a spinner, and then heated at 90° C. for 60 seconds, thereby forming a top coat with a film thickness of 35 nm.

Thereafter, using an ArF immersion exposure apparatus (product name: NSR-S609B, manufactured by Nikon Corporation, NA (numerical aperture)=1.07, Annular), the resist film having a top coat formed thereon was selectively irradiated with an ArF excimer laser (193 nm) through a mask. Thereafter, a FEB treatment was conducted at 85° C. for 60 seconds, followed by alkali development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 25 seconds with pure water, followed by drying by shaking.

As a result, in each of the examples, a contact hole pattern in which holes having a diameter of 85 nm were equally spaced (pitch: 140 nm) was formed on the resist film (hereafter, this contact hole pattern is referred to as "CH pattern"). The optimum exposure dose Eop (mJ/cm$^2$) with which the pattern was formed, i.e., sensitivity, was determined. The results are shown in Table 9.

[Evaluation of EL (2)]

The exposure dose with which the aforementioned CH pattern can be formed with holes having a size of the target size (hole diameter: 85 nm)±5% (i.e., 80.75 nm or 89.25 nm) was determined, and the EL (unit: %) was determined by the following formula. The results are shown in Table 9.

$$EL\ margin\ (\%) = (|E1' - E2'|/Eop) \times 100$$

In the formula, E1' represents the exposure dose (mJ/cm$^2$) for forming a CH pattern with a hole diameter of 80.75 nm, and E2' represents the exposure dose (mJ/cm$^2$) for forming a CH pattern having a hole diameter of 89.25 nm.

[Evaluation of MEEF (2)]

With the above Eop, CH patterns were formed using a mask targeting a hole diameter of 85 nm and a pitch of 140 nm, and a mask targeting a hole diameter of 90 nm and a pitch of 140 nm, and the MEEF value was calculated by the following formula. The results are shown in Table 9.

$$MEEF = |CD90 - CD85|/|MD90 - MD85|$$

In the formulas, CD90 and CD85 represent the respective hole diameters (nm) of the actual CH patterns respectively formed using the mask targeting a hole diameter of 90 nm and the mask targeting a hole diameter of 85 nm. MD90 and MD85 represent the respective target hole diameters (nm), meaning MD90=90, and MD85=85.

[Evaluation of CDU]

With respect to each of the CH patterns having a hole diameter of 85 nm formed with the above Eop, the hole diameter (CD) of 100 holes were measured. From the results, the value of 3 times the standard deviation s (i.e., 3s) was calculated as a yardstick of CDU. The smaller the 3s value is, the better the CDU. The results are shown in Table 9.

TABLE 9

|  | Ex. 2 | Comp. Ex. 2 |
| --- | --- | --- |
| Polymeric compound | 2 | 2' |
| PAB/PEB (° C.) | 90/85 | 90/85 |
| Eop (mJ/cm$^2$) | 19.8 | 17 |
| EL (%) | 7.98 | 6.86 |

TABLE 9-continued

|  | Ex. 2 | Comp. Ex. 2 |
| --- | --- | --- |
| MEEF | 5.51 | 6.21 |
| CDU (3 s) | 5.71 | 6.92 |

Examples 3 to 15, Comparative Examples 3 and 4

Positive resist compositions were produced in the same manner as in Example 2, except that a polymeric compound indicated in Table 10 was used instead of (A)-2 (polymeric compound 2).

Using the obtained resist compositions, resist patterns (CU patterns) were formed in the same manner as in the "Formation of resist pattern (2)", except that the PAB temperature and the PEB temperature were changed to those indicated in Table 10. With respect to the formed resist patterns, the "Evaluation of EL (2)", "Evaluation of MEEF (2)" and "Evaluation of CDU" were conducted. The results are shown in Table 10.

TABLE 10

|  | Example 3 | Example 4 | Example 5 | Example 6 | Example 7 | Example 8 | Example 9 | Example 10 |
| --- | --- | --- | --- | --- | --- | --- | --- | --- |
| Polymeric compound | 8 | 9 | 10 | 11 | 12 | 13 | 14 | 15 |
| PAB/PEB (° C.) | 110/110 | 110/110 | 110/110 | 110/110 | 110/110 | 110/110 | 110/110 | 110/110 |
| Eop (mJ/cm$^2$) | 20.3 | 20.5 | 19.9 | 20.2 | 20.1 | 19.8 | 19.8 | 20.0 |
| EL (%) | 8.18 | 8.23 | 8.20 | 8.51 | 8.24 | 8.38 | 8.32 | 8.54 |
| MEEF | 5.87 | 5.78 | 5.84 | 5.65 | 5.74 | 5.69 | 5.81 | 5.76 |
| CDU (3 s) | 6.23 | 6.15 | 6.20 | 6.02 | 6.32 | 6.15 | 6.22 | 6.14 |

|  | Example 11 | Example 12 | Example 13 | Example 14 | Example 15 | Comp. Ex. 3 | Comp. Ex. 4 |
| --- | --- | --- | --- | --- | --- | --- | --- |
| Polymeric compound | 16 | 17 | 18 | 19 | 20 | 1' | 3' |
| PAB/PEB (° C.) | 100/100 | 90/85 | 110/110 | 100/100 | 110/110 | 90/85 | 110/110 |
| Eop (mJ/cm$^2$) | 19.4 | 20.0 | 20.4 | 20.3 | 18.2 | 19.5 | 20.1 |
| EL (%) | 8.17 | 8.09 | 8.22 | 8.14 | 8.11 | 7.56 | 7.76 |
| MEEF | 5.88 | 5.91 | 5.72 | 5.77 | 5.80 | 6.41 | 6.29 |
| CDU (3 s) | 6.12 | 6.04 | 6.13 | 6.18 | 6.26 | 7.15 | 7.39 |

Examples 16 to 24

Positive resist compositions were produced in the same manner as in Example 2, except that a polymeric compound indicated in Table 11 was used instead of (A)-2 (polymeric compound 2).

Using the obtained resist compositions, resist patterns (CH patterns) were formed in the same manner as in the "Formation of resist pattern (2)", except that the PAB temperature and the PEB temperature were changed to those indicated in Table 11. With respect to the formed resist patterns, the "Evaluation of EL (2)", "Evaluation of MEEF (2)" and "Evaluation of CDU" were conducted. The results are shown in Table 11.

TABLE 11

|  | Example 16 | Example 17 | Example 18 | Example 19 | Example 20 |
| --- | --- | --- | --- | --- | --- |
| Polymeric compound | 21 | 22 | 23 | 24 | 25 |
| PAB/PEB (° C.) | 90/85 | 90/85 | 90/85 | 90/85 | 100/100 |
| Eop (mJ/cm$^2$) | 18.8 | 19.0 | 19.5 | 19.8 | 21.0 |
| EL (%) | 8.51 | 8.53 | 8.43 | 8.44 | 8.59 |
| MEEF | 5.57 | 5.67 | 5.62 | 5.56 | 5.69 |
| CDU (3 s) | 5.91 | 5.99 | 5.87 | 5.78 | 5.87 |

|  | Example 21 | Example 22 | Example 23 | Example 24 | Comp. Ex. 2 |
| --- | --- | --- | --- | --- | --- |
| Polymeric compound | 26 | 27 | 28 | 29 | 2' |
| PAB/PEB (° C.) | 100/100 | 90/85 | 100/100 | 110/110 | 90/85 |
| Eop (mJ/cm$^2$) | 19.9 | 20.4 | 20.1 | 21.1 | 17.0 |
| EL (%) | 8.35 | 8.65 | 8.45 | 8.48 | 6.86 |
| MEEF | 5.58 | 5.64 | 5.57 | 5.53 | 6.21 |
| CDU (3 s) | 5.79 | 5.73 | 5.87 | 5.92 | 6.92 |

As seen from the results shown above, the positive resist composition of the present invention exhibited excellent lithography properties with respect to EL, MEEF, CDU and the like. In addition, it was confirmed that by including a polymeric compound having two or more types of structural units for at least one of the structural units (a1) and (a2), the CDU could be improved (Examples 3 to 15 vs Examples 2 and 16 to 24).

Component (B) Synthesis Example 1

Synthesis of (B)-3

35.6 g of a compound (VII) (TDPS—Br) was dissolved in 360 g of pure water, and 360 g of dichloromethane and 38.0 g of a compound (VIII) were added, followed by stirring at room temperature for 14 hours. Then, the dichloromethane phase was separated, and washed with a diluted hydrochloric acid and water in this order. Thereafter, the resultant was concentrated and dried, thereby obtaining 58 g of an objective compound in the form of a white solid.

The compound was analyzed by NMR to confirm its structure.

$^1$H-NMR(400 MHz,DMSO-$d_6$):δ(ppm)=1.64(m,6H,Ad), 1.82(m,6H,Ad), 1.94(m,3H,Ad), 3.35(s,3H,$CH_3$), 4.55(t,2H,$CF_2CH_2$), 7.56(d,2H,Ar), 7.72-7.84(m,12H,Ar)

$^{19}$F-NMR(376 MHz,DMSO-$d_6$):δ(ppm)=−111.2

[Chemical Formula 92]

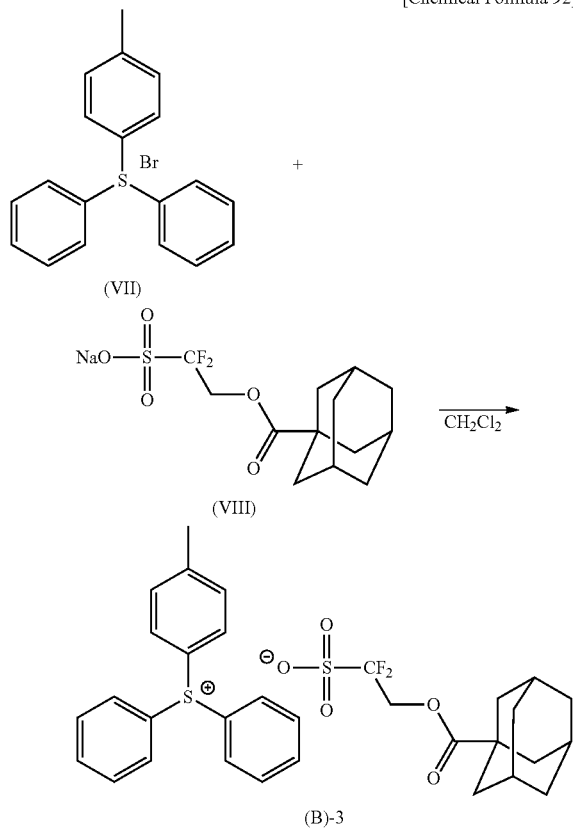

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a base component (A) which exhibits increased solubility in an alkali developing solution under action of acid and an acid-generator component (B) which generates acid upon exposure,
the base component (A) comprising a polymeric compound (A1) comprised of a structural unit (a0) represented by general formula (a0-1) shown below, a structural unit (a1) derived from an acrylate ester containing an acid dissociable, dissolution inhibiting group and a structural unit (a2$^s$) derived from an acrylate ester containing a —$SO_2$— containing cyclic group:

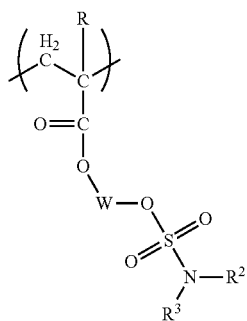

wherein R represents a hydrogen atom, an alkyl group of 1 to 5 carbon atoms or a halogenated alkyl group of 1 to 5 carbon atoms; each of $R^2$ and $R^3$ represents a hydrogen atom; and W represents a cyclic alkylene group that may include an oxygen atom at an arbitrary position.

2. The positive resist composition according to claim 1, wherein the polymeric compound (A1) further comprises a structural unit (a2$^L$) derived from an acrylate ester containing a lactone-containing cyclic group.

3. The positive resist composition according to claim 1, wherein the polymeric compound (A1) further comprises a structural unit (a3) derived from an acrylate ester containing a polar group-containing aliphatic hydrocarbon group.

4. The positive resist composition according to claim 1, wherein the polymeric compound (A1) further comprises a structural unit (a4) derived from an acrylate ester containing an acid non-dissociable, aliphatic cyclic group.

5. The positive resist composition according to claim 1, which further comprises a nitrogen-containing organic compound (D) excluding the polymeric compound (A1).

6. A method of forming a resist pattern, comprising: forming a resist film using a positive resist composition of claim 1; conducting exposure of the resist film; and alkali-developing the resist film to form a resist pattern.

7. A polymeric compound comprising a structural unit (a0) represented by general formula (a0-1) shown below, a structural unit (A1) derived from an acrylate ester containing an acid dissociable, dissolution inhibiting group and a structural unit (a2$^s$) derived from an acrylate ester containing a —$SO_2$— containing cyclic group:

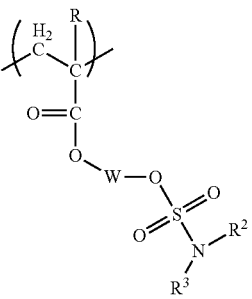

wherein R represents a hydrogen atom, an alkyl group of 1 to 5 carbon atoms or a halogenated alkyl group of 1 to 5 carbon atoms; each of $R^2$ and $R^3$ represents a hydrogen atom; and W represents a cyclic alkylene group that may include an oxygen atom at an arbitrary position.

8. The polymeric compound according to claim 7, which further comprises a structural unit ($a2^L$) derived from an acrylate ester containing a lactone-containing cyclic group.

9. The polymeric compound according to claim 7, which further comprises a structural unit (a3) derived from an acrylate ester containing a polar group-containing aliphatic hydrocarbon group.

10. The polymeric compound according to claim 7, which further comprises a structural unit (a4) derived from a non-acid-dissociable cyclic alkyl acrylate ester.

* * * * *

UNITED STATES PATENT AND TRADEMARK OFFICE
CERTIFICATE OF CORRECTION

PATENT NO. : 8,735,045 B2
APPLICATION NO. : 12/911411
DATED : May 27, 2014
INVENTOR(S) : Tomoyuki Hirano, Daiju Shiono and Daichi Takaki It is certified that error appears in the above-identified patent and that said Letters Patent is hereby corrected as shown below:

In the Specification

At Column 2, lines 45-46, "mask error factor (MEEF)," should be --mask error enhancement factor (MEEF),--.

At Column 4, line 21, "an a" should be --and a--.

At Column 10, line 22, "(a0-1-29)" should be --(a0-1-30)--.

At Column 21, line 37, "the for the" should be --for the--.

At Column 23, line 59, "alkyltetratnethylene" should be --alkyltetramethylene--.

At Column 55, line 49, "monocycle" should be --monocyclic--.

At Column 57, line 18, "et" should be --$R^{24}$--.

At Column 65, lines 37-45:

Change " 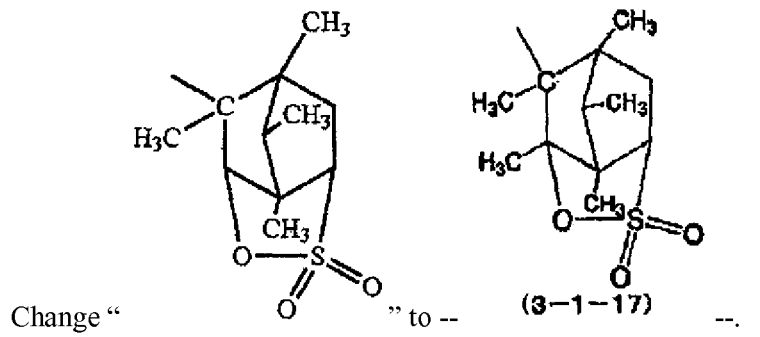 " to -- --.

At Column 67, Line 20 (Approx.), After "  " insert --(3-1-32)--.

Signed and Sealed this
Twentieth Day of January, 2015

Michelle K. Lee
*Deputy Director of the United States Patent and Trademark Office*

At Column 69, line 36, "—(CH2)O—" should be -- —(CH2)c— --.

At Column 71, line 53, "propionolactone," should be --propiolactone,--.

At Column 82, lines 36-44:

Change " 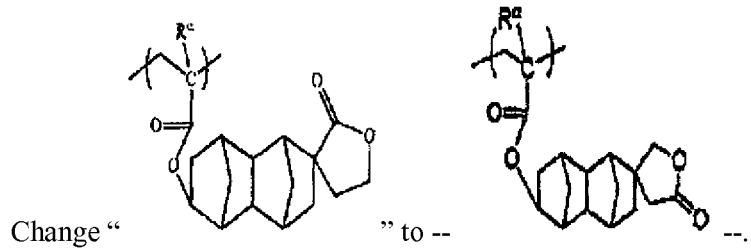 " to -- --.

At Column 88, Lines 16-26 (Approx.),

Change " 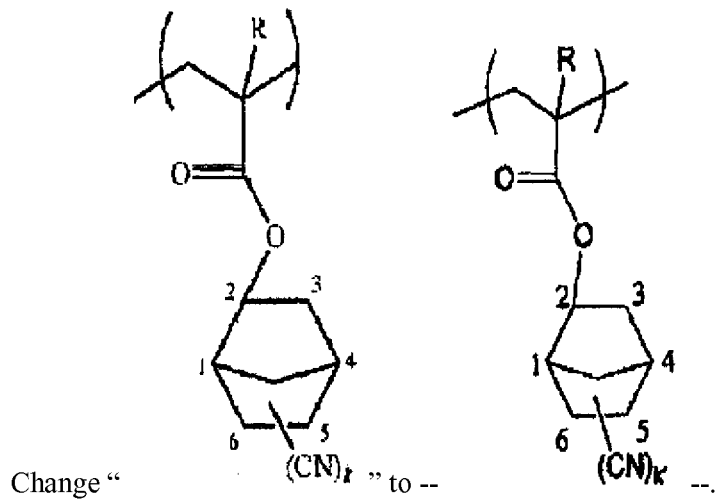 " to -- --.

At Column 92, Lines 35-49 (Approx.),

Change " 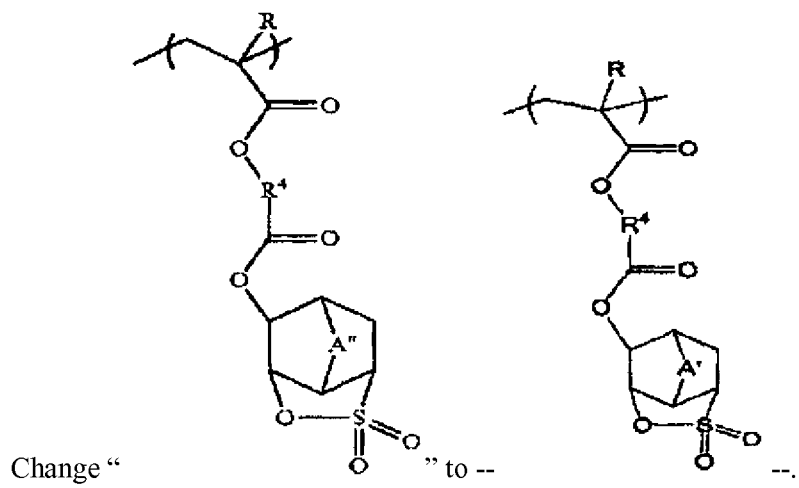 " to -- --.

At Column 99, line 14, "R$^2$," should be --R$^{21}$,--.

At Column 104, line 15, "dicyclohexylcarboxylmide" should be --dicyclohexylcarboxyimide--.

At Column 106, line 57, "tetracyolododecane." should be --tetracyclododecane.--.

At Column 107, line 45, "R3"represent" should be --R3" represent--.

At Column 109, lines 22-35:

Change " 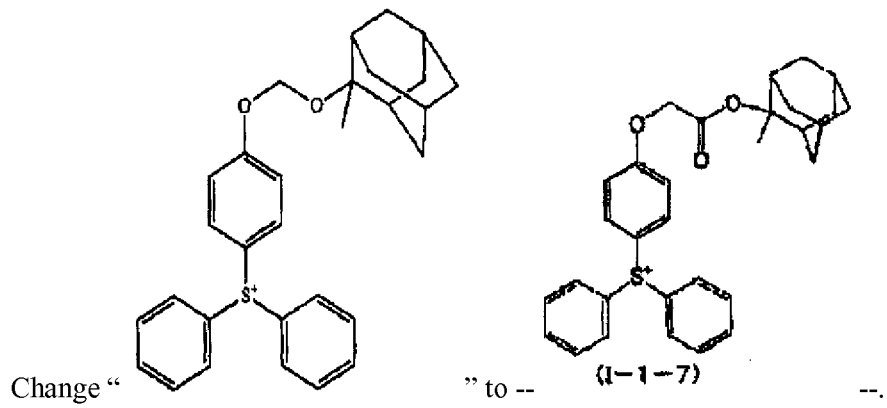 " to -- --.

At Column 115, line 58, "mono-cyclic" should be --monocyclic--.

At Column 122, 31-35 (Approx.),

Change " 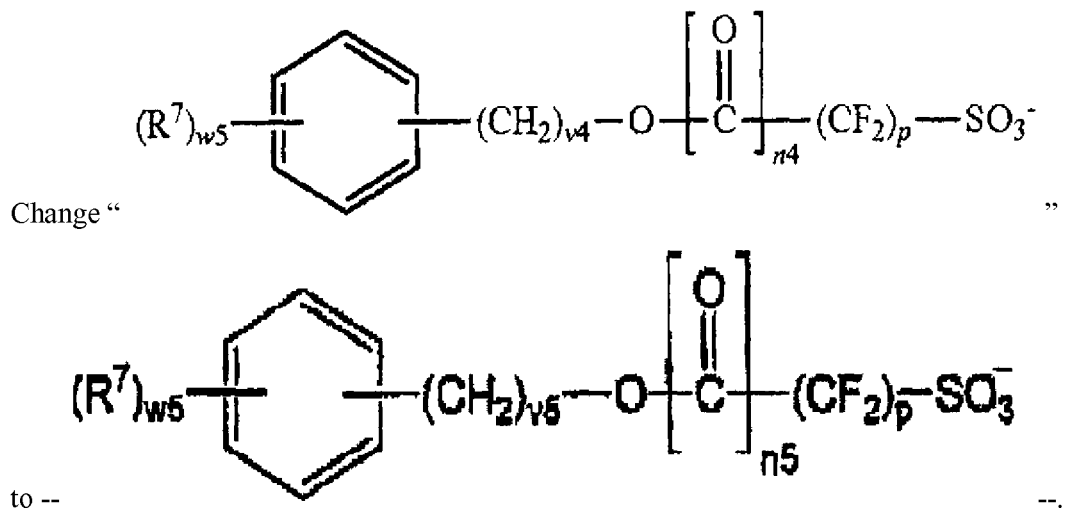 " to -- --.

At Column 126, Lines 64-66 (Approx.),

Change " 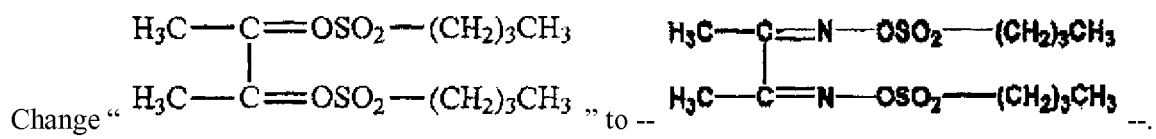 " to -- --.

At Column 128, Line 25, Change "laurildiethanolamine." to --lauryldiethanolamine.--.

At Column 131, Line 49, Change "as long at" to --as long as--.

At Column 132, Line 13, Change "mask error factor (MEEF)," to --mask error enhancement factor (MEEF),--.

At Column 139, Line 66, Change "(3H,s)1.52(2H,s)" to --(3H,s), 1.52(2H,s)--.

CERTIFICATE OF CORRECTION (continued)
U.S. Pat. No. 8,735,045 B2

At Column 142, Lines 20-29 (Approx.),

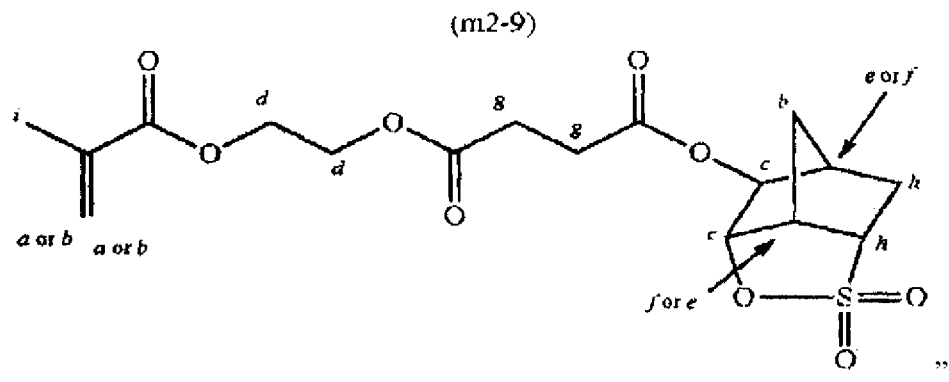

Change "

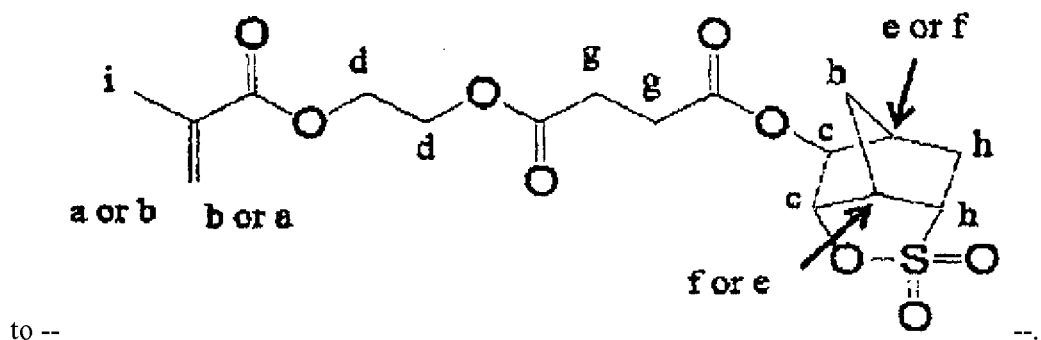

to --.

UNITED STATES PATENT AND TRADEMARK OFFICE
CERTIFICATE OF CORRECTION

PATENT NO.       : 8,735,045 B2                                          Page 1 of 1
APPLICATION NO.  : 12/911411
DATED            : May 27, 2014
INVENTOR(S)      : Tomoyuki Hirano, Daiju Shiono and Daichi Takaki It is certified that error appears in the above-identified patent and that said Letters Patent is hereby corrected as shown below:

In the Specification

At Column 30, lines 57-65:

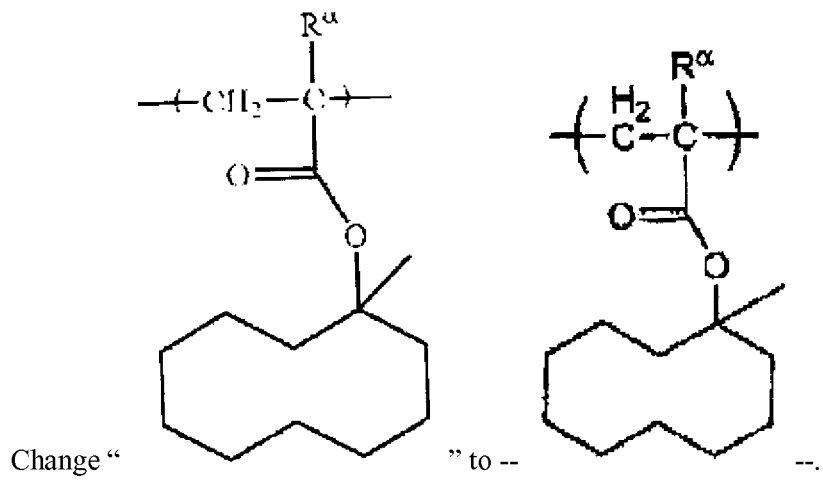

Signed and Sealed this
Fourteenth Day of July, 2015

Michelle K. Lee
*Director of the United States Patent and Trademark Office*